US 10,978,482 B2

(12) United States Patent
Alsmeier et al.

(10) Patent No.: US 10,978,482 B2
(45) Date of Patent: Apr. 13, 2021

(54) FERROELECTRIC MEMORY DEVICE WITH SELECT GATE TRANSISTOR AND METHOD OF FORMING THE SAME

(71) Applicant: SANDISK TECHNOLOGIES LLC, Addison, TX (US)

(72) Inventors: Johann Alsmeier, San Jose, CA (US); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 13 days.

(21) Appl. No.: 16/456,736

(22) Filed: Jun. 28, 2019

(65) Prior Publication Data

US 2020/0411533 A1    Dec. 31, 2020

(51) Int. Cl.

| | |
|---|---|
| *H01L 27/1159* | (2017.01) |
| *H01L 27/11597* | (2017.01) |
| *H01L 29/423* | (2006.01) |
| *H01L 29/78* | (2006.01) |
| *G11C 11/22* | (2006.01) |
| *H01L 29/66* | (2006.01) |
| *H01L 21/28* | (2006.01) |

(52) U.S. Cl.
CPC ........ *H01L 27/1159* (2013.01); *G11C 11/223* (2013.01); *G11C 11/2255* (2013.01); *G11C 11/2257* (2013.01); *G11C 11/2273* (2013.01); *H01L 27/11597* (2013.01); *H01L 29/40111* (2019.08); *H01L 29/42368* (2013.01); *H01L 29/42376* (2013.01); *H01L 29/6684* (2013.01); *H01L 29/78391* (2014.09)

(58) Field of Classification Search
CPC ............. H01L 27/1159; H01L 29/6684; G11C 11/223
See application file for complete search history.

(56) References Cited

U.S. PATENT DOCUMENTS

| | | | |
|---|---|---|---|
| 8,385,099 B2 * | 2/2013 | Kaneko | ............ H01L 29/40111 365/145 |
| 9,355,727 B1 | 5/2016 | Zhang et al. | |
| 9,576,971 B2 | 2/2017 | Zhang et al. | |
| 9,941,299 B1 | 4/2018 | Chen et al. | |
| 10,283,190 B1 | 5/2019 | Li | |
| 2001/0017386 A1 | 8/2001 | Bachhofer et al. | |
| 2012/0195095 A1 | 8/2012 | Scalia et al. | |
| 2016/0163389 A1 | 6/2016 | Zhang et al. | |

(Continued)

FOREIGN PATENT DOCUMENTS

WO    WO2018111215 A1    6/2018

OTHER PUBLICATIONS

U.S. Appl. No. 16/227,889, filed Dec. 20, 2018, SanDisk Technologies LLC.

(Continued)

*Primary Examiner* — Allison Bernstein
(74) *Attorney, Agent, or Firm* — The Marbury Law Group PLLC

(57) ABSTRACT

A memory cell includes a ferroelectric memory transistor, and a select gate transistor which shares a common semiconductor channel, a common source region and a common drain region with the ferroelectric memory transistor. The select gate transistor controls access between the common source region and the common semiconductor channel.

19 Claims, 41 Drawing Sheets

(56) References Cited

U.S. PATENT DOCUMENTS

2016/0163729 A1    6/2016  Zhang et al.
2017/0098655 A1    4/2017  Costa et al.

OTHER PUBLICATIONS

U.S. Appl. No. 16/249,300, filed Jan. 16, 2019, SanDisk Technologies LLC.
U.S. Appl. No. 16/291,673, filed Mar. 4, 2019, SanDisk Technologies LLC.
U.S. Appl. No. 16/374,330, filed Apr. 3, 2019, SanDisk Technologies LLC.
U.S. Appl. No. 16/412,764, filed May 5, 2019, SanDisk Technologies LLC.
U.S. Appl. No. 16/454,458, filed Jun. 27, 2019, SanDisk Technologies LLC.
U.S. Appl. No. 16/454,475, filed Jun. 27, 2019, SanDisk Technologies LLC.
Notification of Transmittal of the International Search Report and Written Opinion of the International Search Authority for International Patent Application No. PCT/US2019/068869, dated May 6, 2020, 9 pages.

* cited by examiner

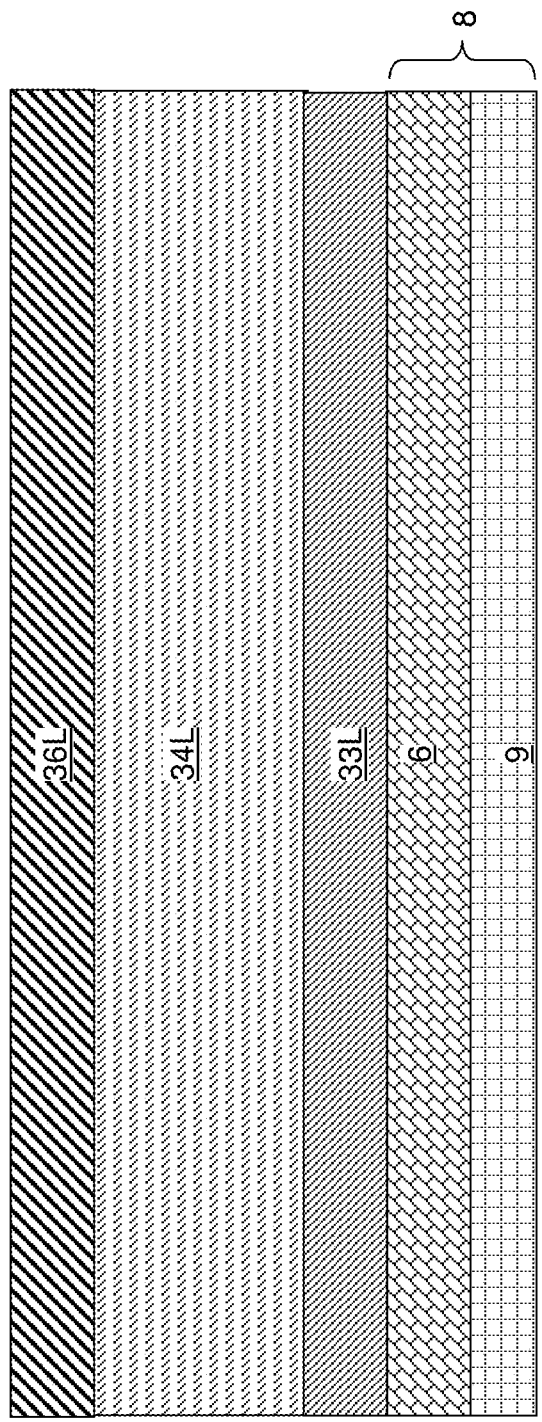

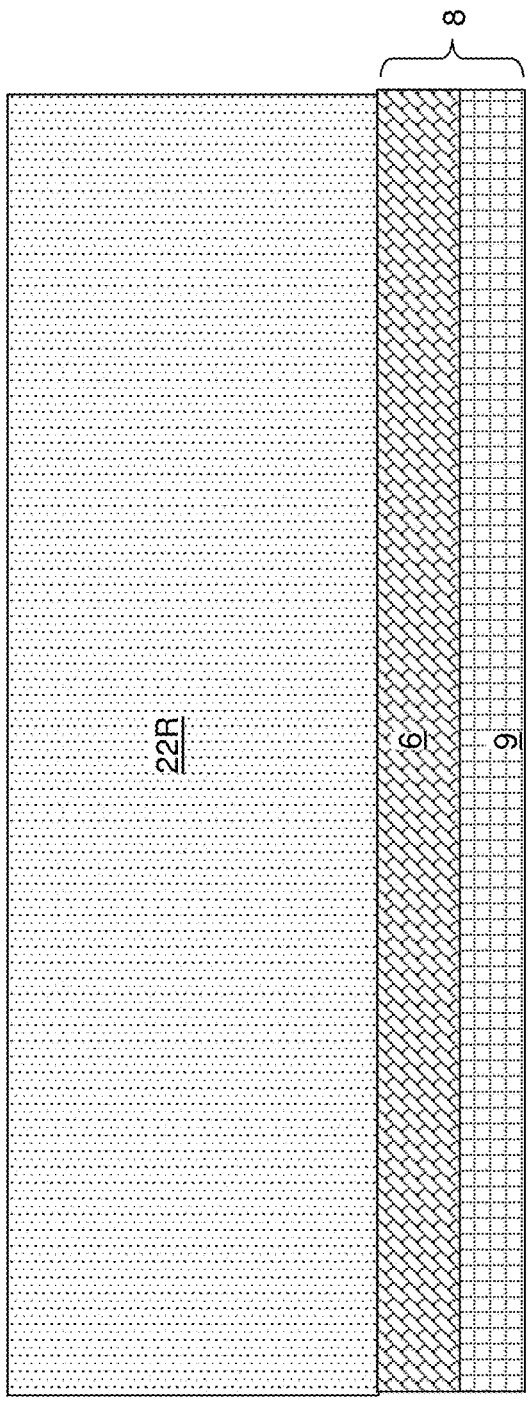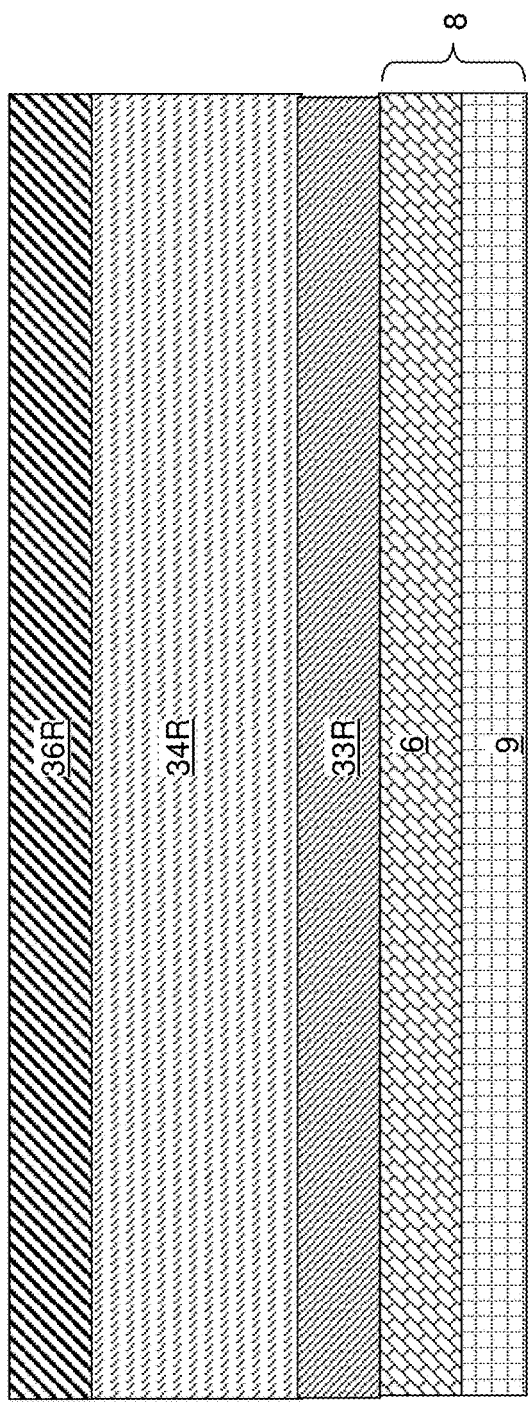

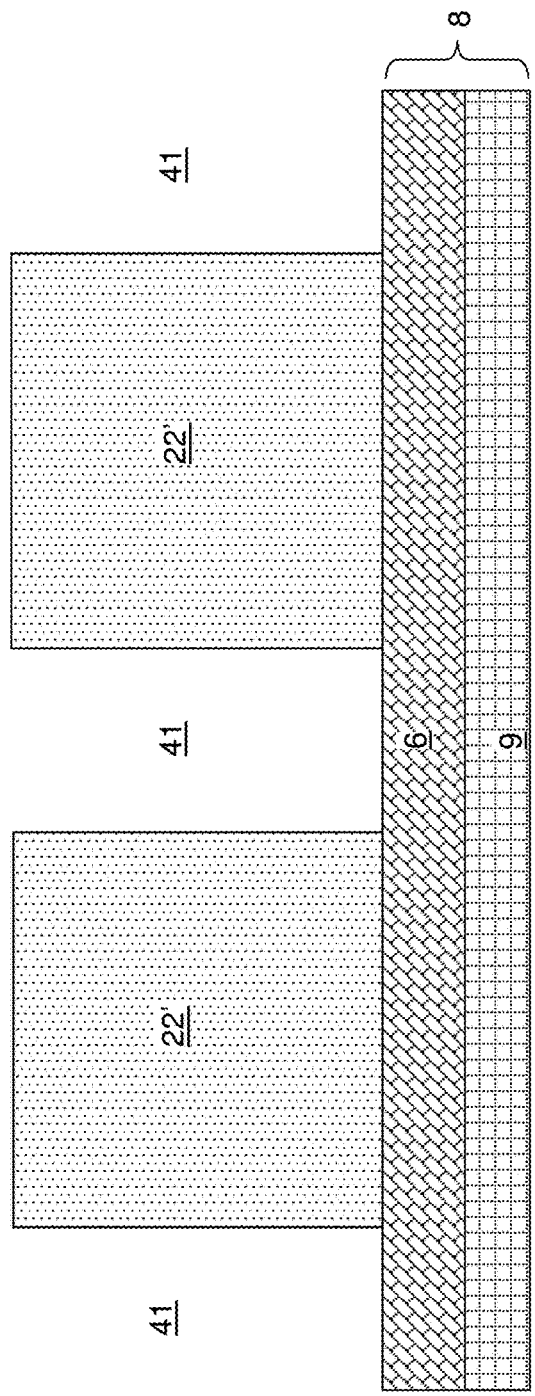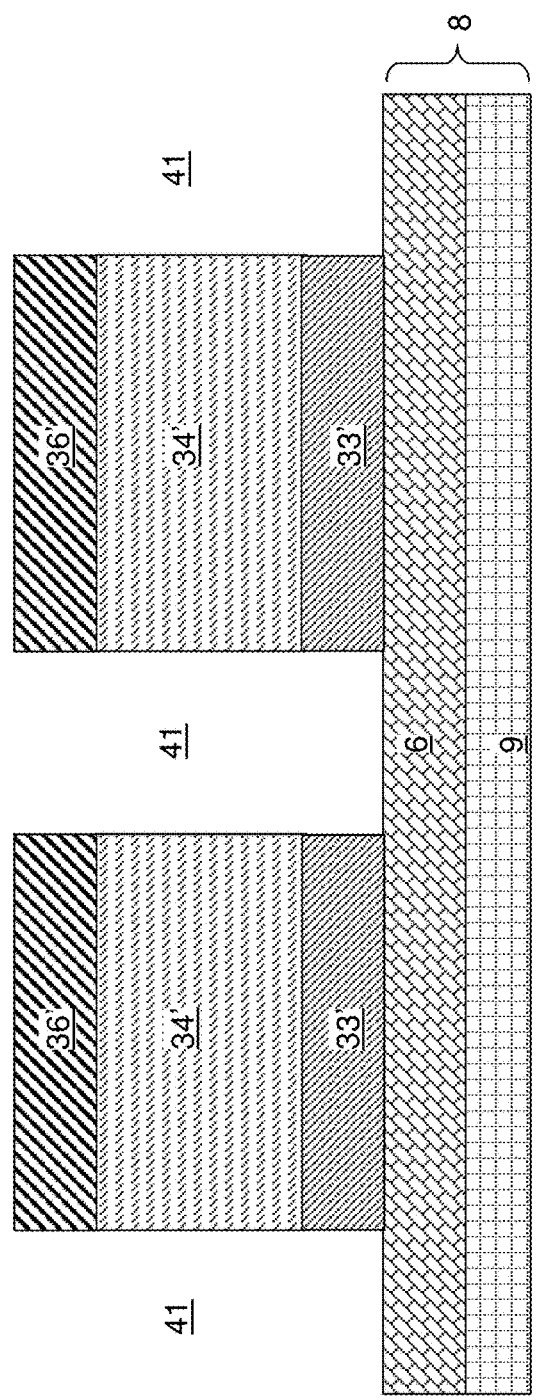

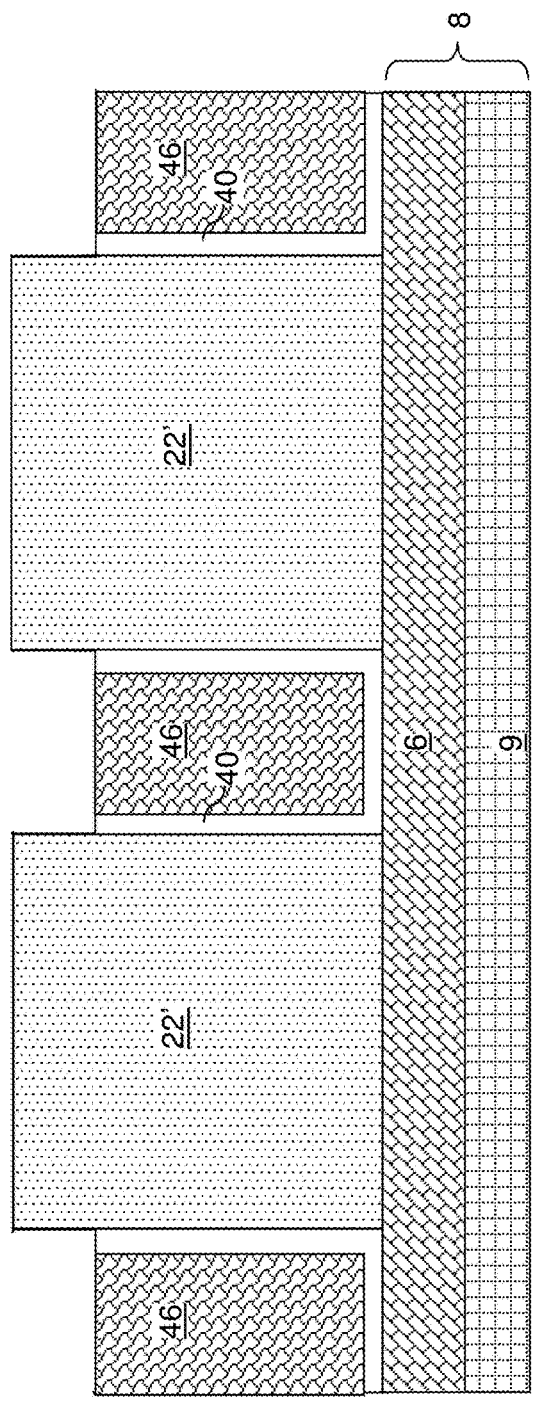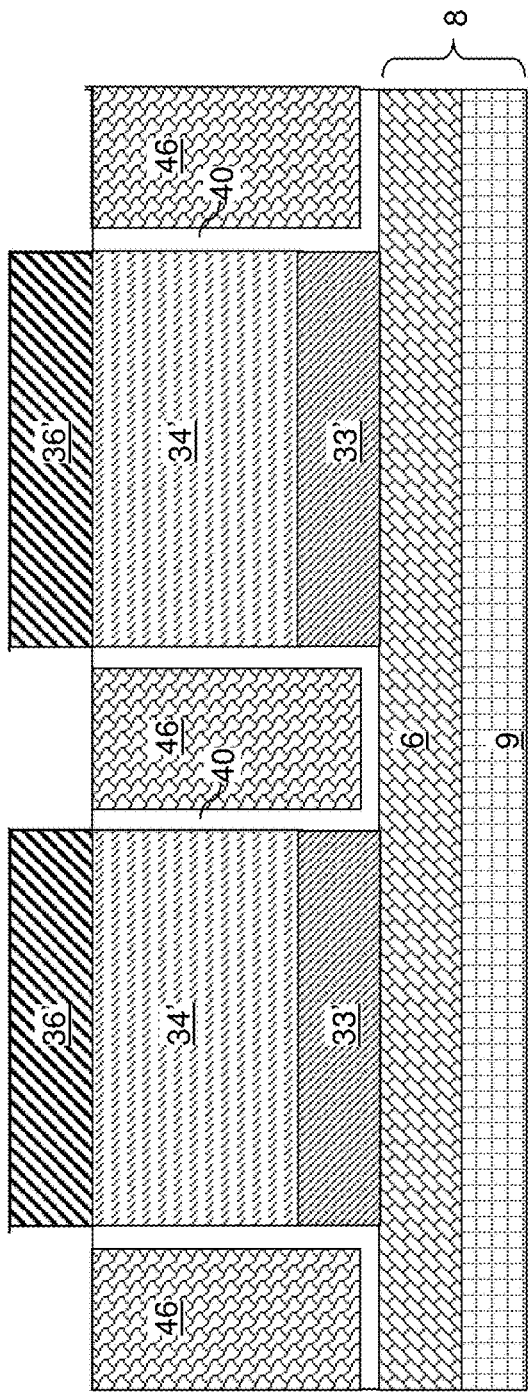

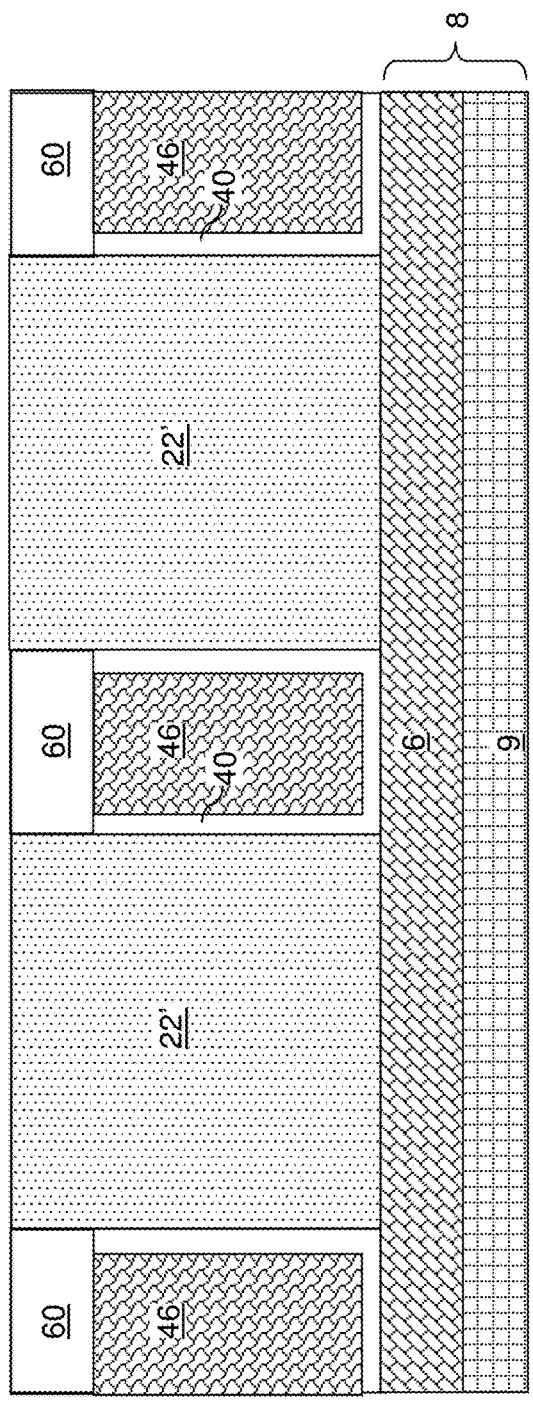
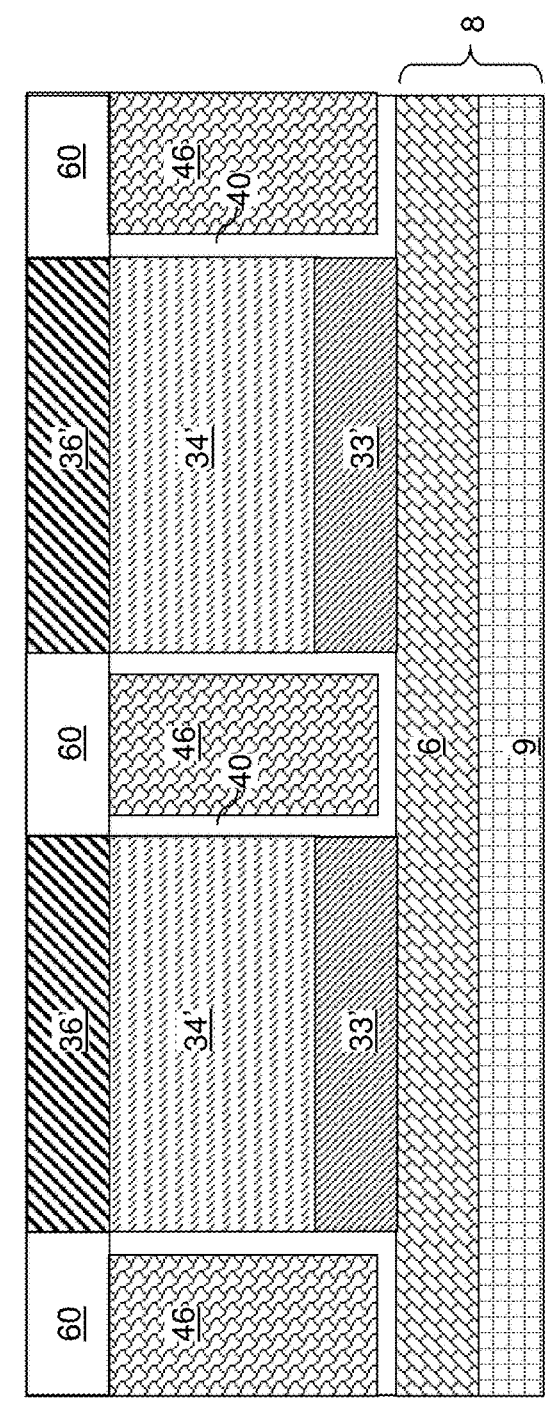

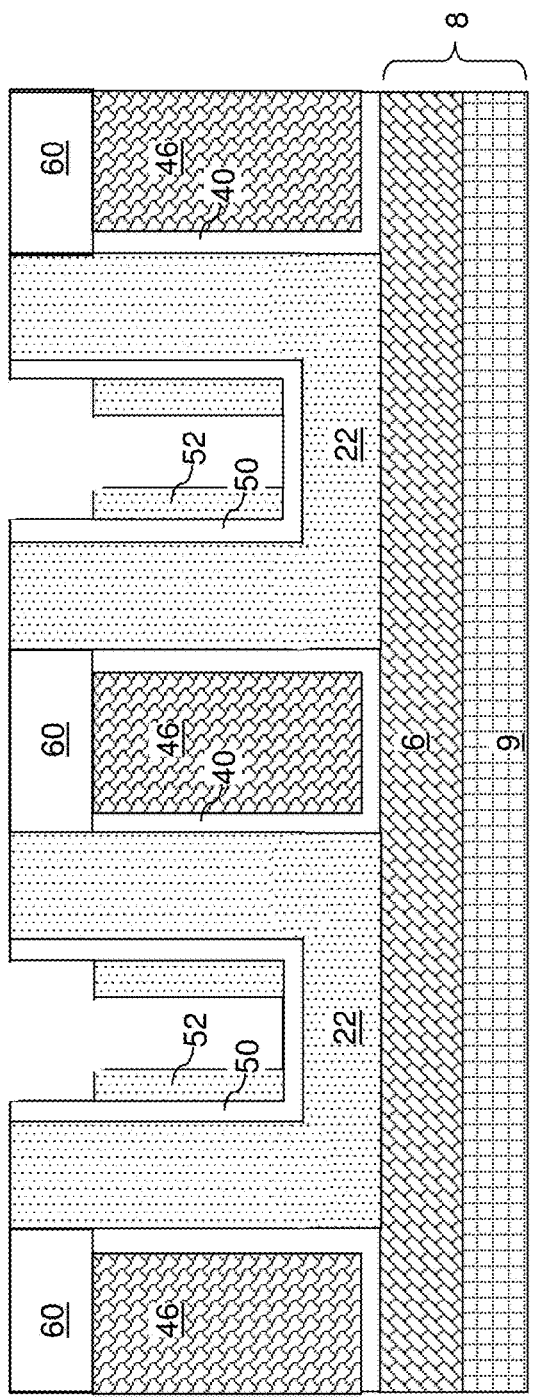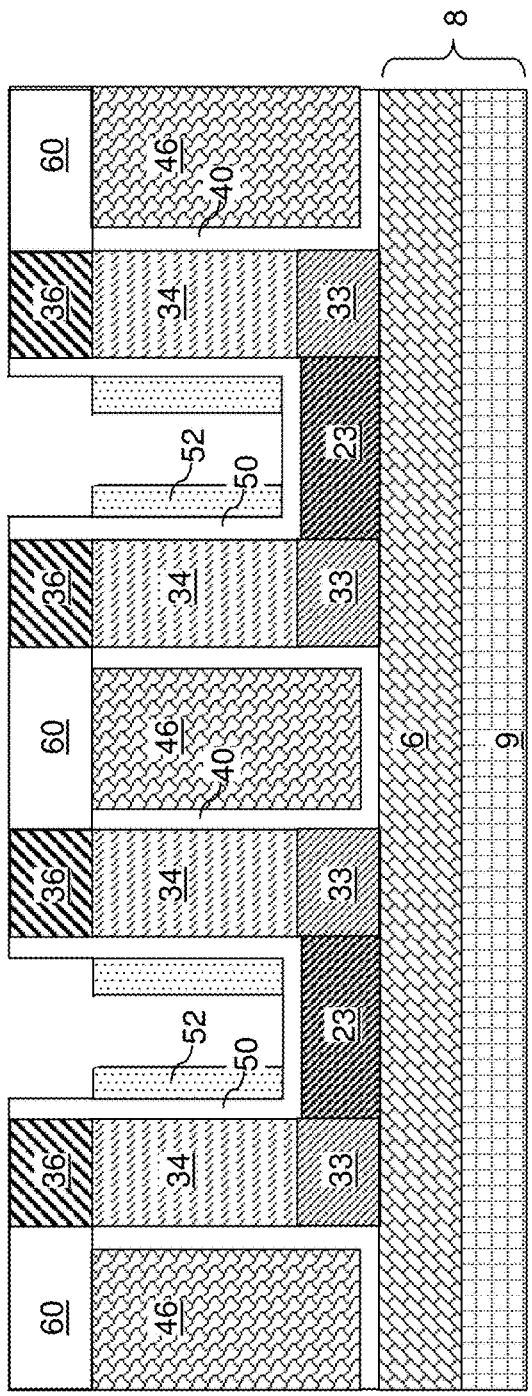

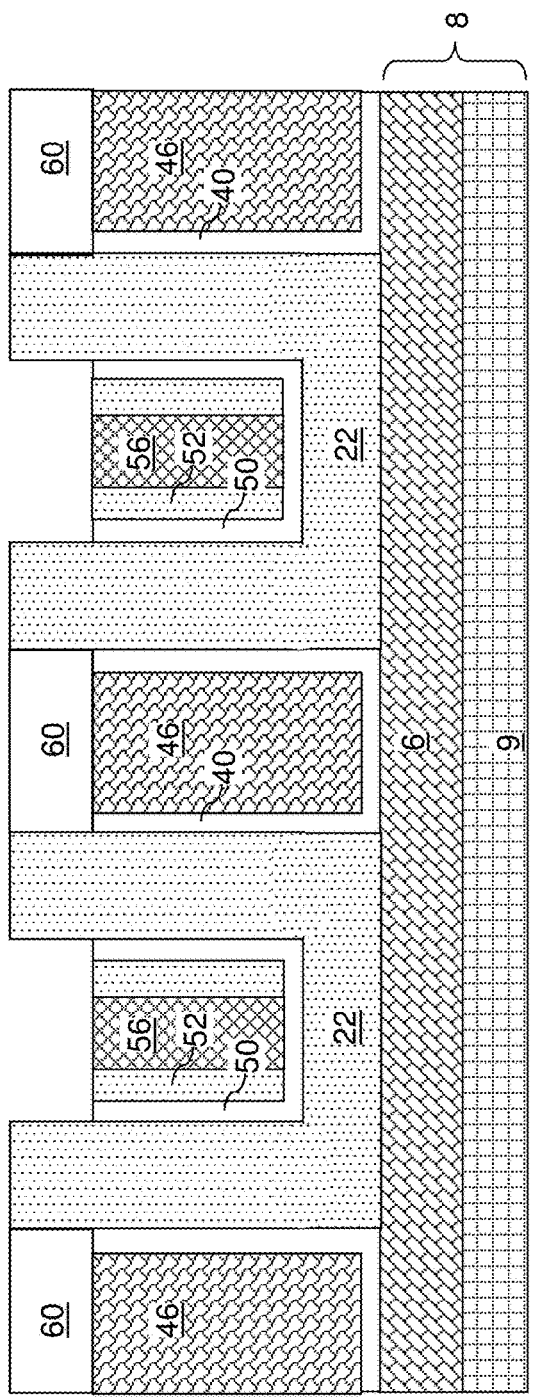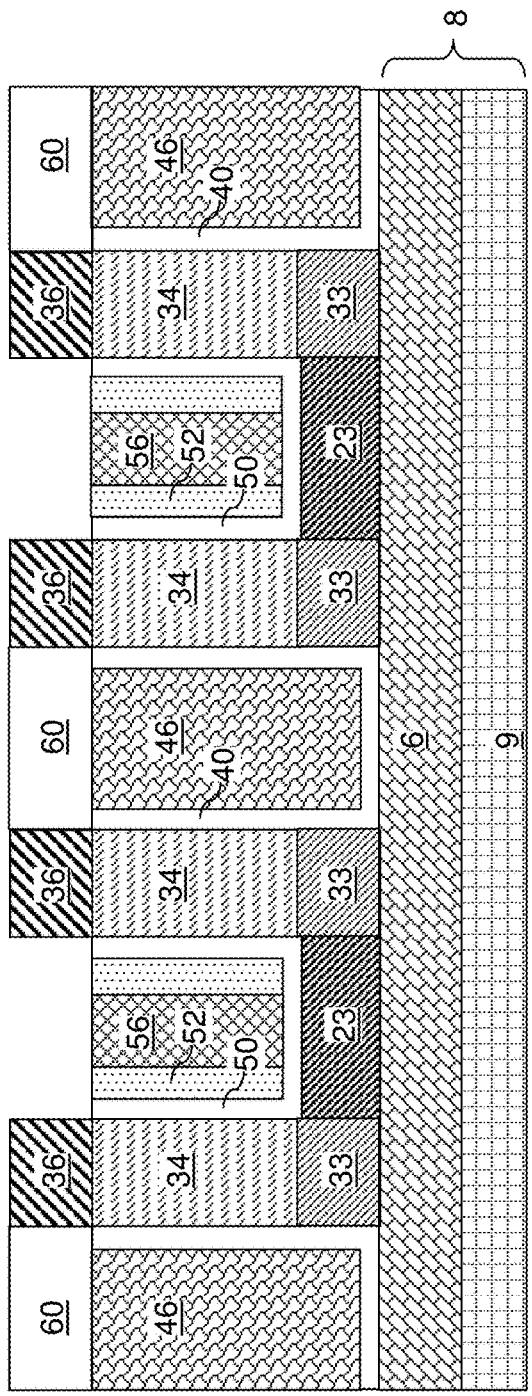
FIG. 9B
FIG. 9A

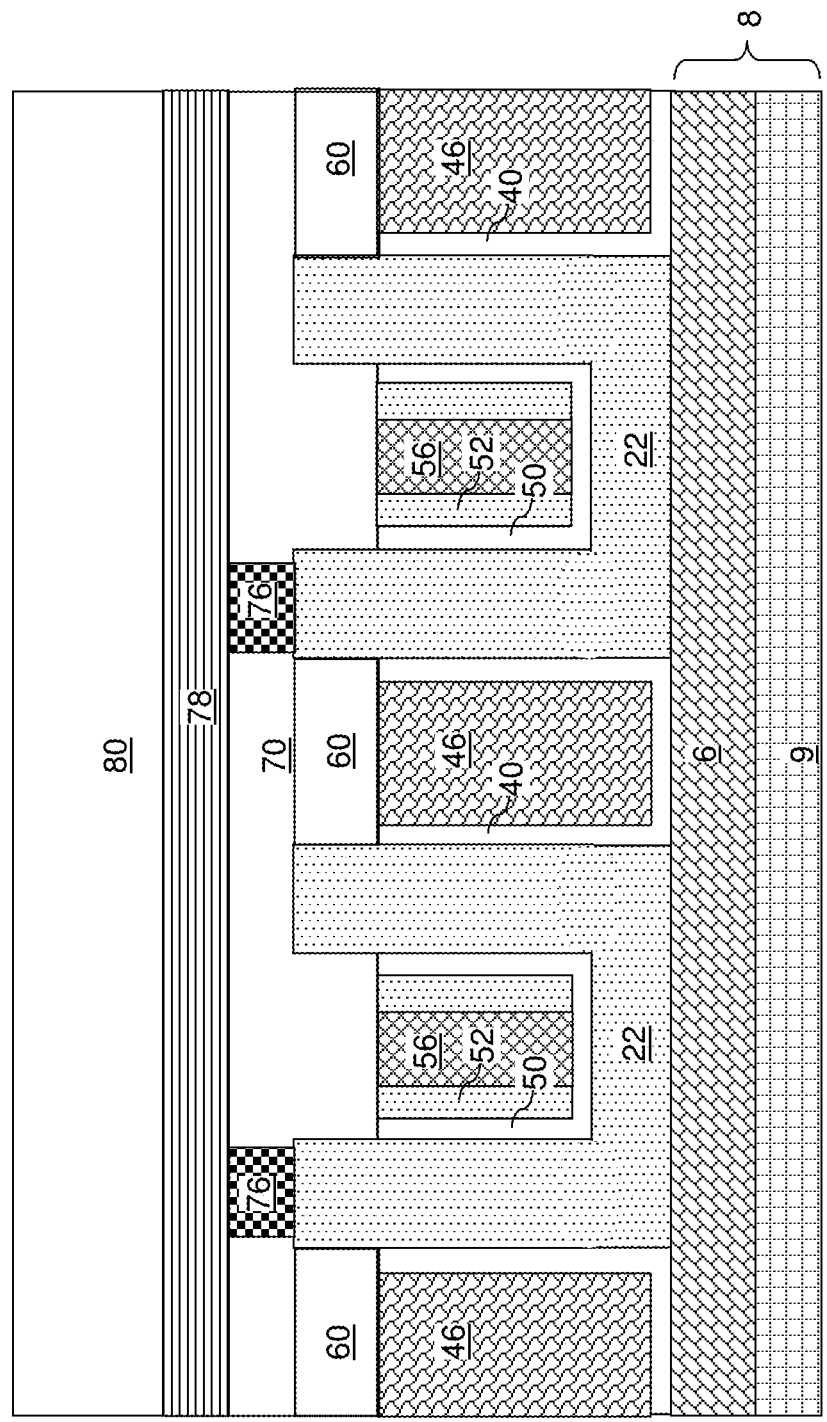

FIG. 14A

| | Write/Inhibit | Erase/Inhibit | Read/Inhibit | Write/Inhibit | Erase/Inhibit | Read/Inhibit |
|---|---|---|---|---|---|---|
| Sel. WL | -6V | 5V | 0V | 5V | 0V | 0V |
| Unsel. WL | -3.5V | 2.5V | 0V | 2.5V | 2.5V | 0V |
| BL | 0V/-2.5V | 0V/2.5V | Vdd | 0V/2.5V | 5V/0V | Vdd |
| SL | 0V | 0V | 0V | 0V/2.5V | 5V/0V | 0V |
| RL | 0V | 0V | Vdd/0V | 0V | 0V | Vdd/0V |
| SG device | Bot portion off | Bot portion off | On/Off | Bot portion off | Bot portion off | On/Off |
| Oper. unit | Per page | Per page | Per page | Per page | Per page | Per page |

FIG. 14B

| | Write/Inhibit | Erase/Inhibit | Read/Inhibit | Write/Inhibit | Erase/Inhibit | Read/Inhibit |
|---|---|---|---|---|---|---|
| Sel. WL | -6.5V | 5.4V | -0.25,0,0.25V | 4.5V | 0V | -0.25,0,0.25V |
| Unsel. WL | -3.5,-2.5V | 2.5,1.5V | 0V | 1.5,2.5V | 1.5,2.5V | 0V |
| BL | 0V/-2.5,-1.5V | 0V/2.5,1.5V | Vdd | 0V/1.5,2.5V | 4.5V/0V | Vdd |
| SL | 0V | 0V | 0V | 0V | 0V | 0V |
| RL | 0V | 0V | Vdd/0V | 0V | 0V | Vdd/0V |
| SG device | Bot portion off | Bot portion off | On/Off | Bot portion off | Bot portion off | On/Off |
| Oper. unit | Per page | Per page | Per page | Per page | Per page | Per page |

FERROELECTRIC MEMORY DEVICE WITH SELECT GATE TRANSISTOR AND METHOD OF FORMING THE SAME

FIELD

The present disclosure relates generally to the field of semiconductor memory devices, and in particular to ferroelectric memory devices and a method of forming the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a field effect transistor ferroelectric memory device.

SUMMARY

According to an embodiment of the present disclosure, a memory cell includes a ferroelectric memory transistor, and a select gate transistor which shares a common semiconductor channel, a common source region and a common drain region with the ferroelectric memory transistor. The select gate transistor controls access between the common source region and the common semiconductor channel.

According to another embodiment of the present disclosure, a method of forming at least one ferroelectric memory element comprising forming a source region in a substrate; forming a stepped semiconductor material structure comprising a fin portion having a first height and a base portion having a second height over a first region of a top surface of the source region; forming a vertical semiconductor channel comprising a vertical stack of a first semiconductor channel portion and a second semiconductor channel portion that overlies the first semiconductor channel portion in the fin portion of the stepped semiconductor material structure; forming a select gate dielectric on one side of the vertical semiconductor channel and on a second region of the top surface of the source region; forming a control gate dielectric comprising a ferroelectric material layer on another side of the vertical semiconductor channel on a top surface of the base portion of the stepped semiconductor material structure; and forming a drain region on a top end of the vertical semiconductor channel.

BRIEF DESCRIPTION OF THE DRAWINGS

FIG. 1 is a vertical cross-sectional view of a first exemplary structure after formation of a source region, a first semiconductor channel material layer, a second semiconductor channel material layer, and a drain material layer according to an embodiment of the present disclosure.

FIG. 2A is a first vertical cross-sectional view of the first exemplary structure after formation of dielectric isolation rails according to an embodiment of the present disclosure.

FIG. 2B is a second vertical cross-sectional view of the first exemplary structure at the processing steps of FIG. 2A.

FIG. 3A is a first vertical cross-sectional view of the first exemplary structure after formation of first line trenches and patterning the dielectric isolation rails into discrete dielectric isolation structures according to an embodiment of the present disclosure.

FIG. 3B is a second vertical cross-sectional view of the first exemplary structure at the processing steps of FIG. 3A.

FIG. 4A is a first vertical cross-sectional view of the first exemplary structure after formation of select gate dielectrics and select gate electrodes according to an embodiment of the present disclosure.

FIG. 4B is a second vertical cross-sectional view of the first exemplary structure at the processing steps of FIG. 4A.

FIG. 5A is a first vertical cross-sectional view of the first exemplary structure after formation of select gate cap dielectric rails according to an embodiment of the present disclosure.

FIG. 5B is a second vertical cross-sectional view of the first exemplary structure at the processing steps of FIG. 5A.

FIG. 8A is a first vertical cross-sectional view of the first exemplary structure after formation of control gate dielectrics according to an embodiment of the present disclosure.

FIG. 8B is a second vertical cross-sectional view of the first exemplary structure at the processing steps of FIG. 8A.

FIG. 9A is a first vertical cross-sectional view of the first exemplary structure after formation of control gate electrodes according to an embodiment of the present disclosure.

FIG. 9B is a second vertical cross-sectional view of the first exemplary structure at the processing steps of FIG. 9A.

FIG. 11B is a second vertical cross-sectional view of the first exemplary structure at the processing steps of FIG. 11A.

FIGS. 14A and 14B are tables illustrating exemplary voltages that may be used to operate the circuit of FIG. 13A.

DETAILED DESCRIPTION

Figure 2C:
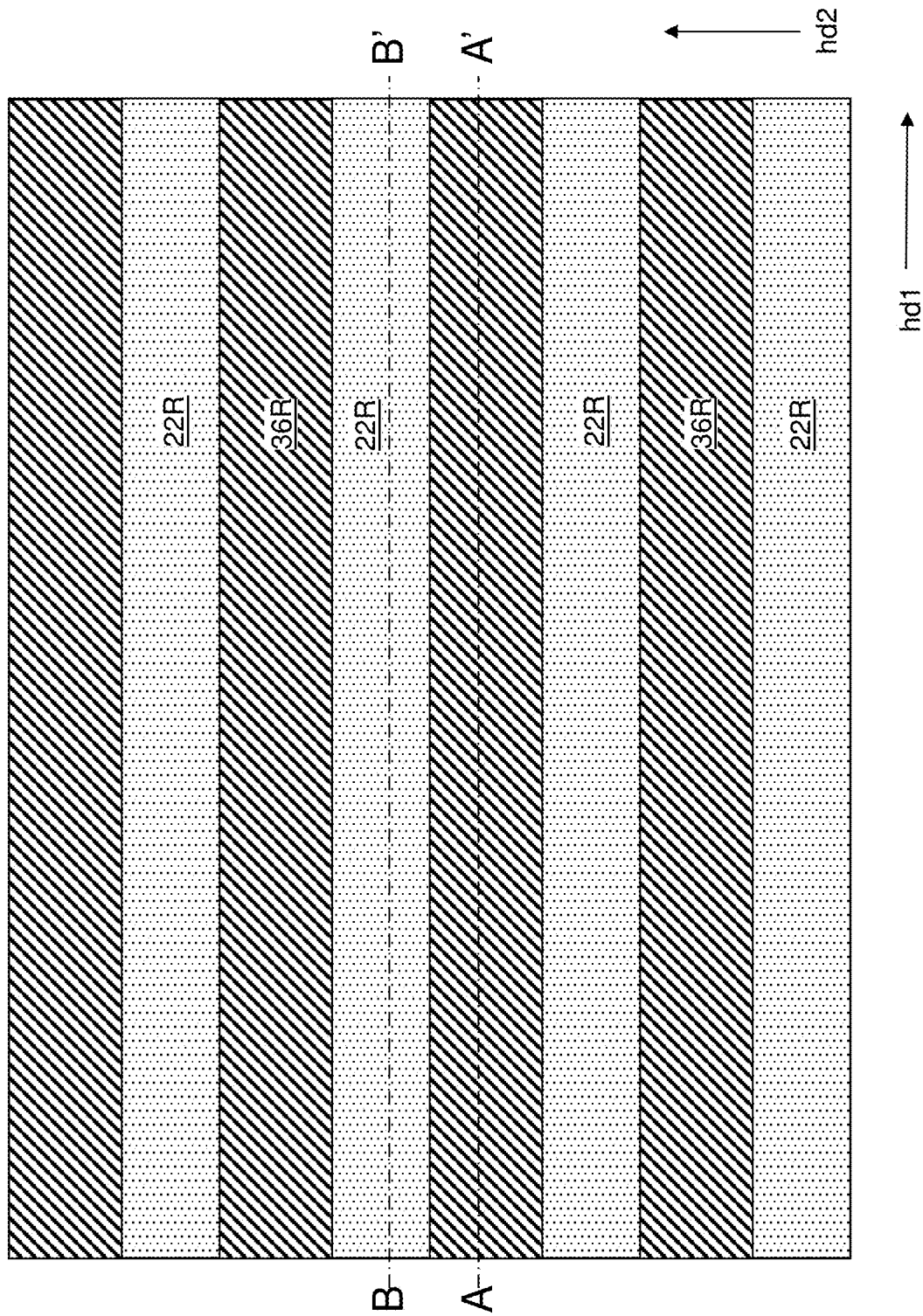
FIG. 2C is a top-down view of a first configuration of the first exemplary structure at the processing steps of FIGS. 2A and 2B. The plane A-A' corresponds to the plane of the vertical cross-section for FIG. 2A. The plane B-B' corresponds to the plane of the vertical cross-section for FIG. 2B.

As discussed above, the present disclosure is directed to ferroelectric memory devices containing a ferroelectric memory transistor and a select gate transistor in each memory cell, and a method of forming the same, the various aspect of which are described herein in detail. The select gate transistor contains a select gate electrode which is longer than the control gate electrode of the ferroelectric memory transistor. The transistors share a common channel, and the longer select gate electrode controls a portion of the channel adjacent to the common source region to reduce the disturb of the ferroelectric memory transistor during operation of the device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to an embodiment of the present disclosure is illustrated. The first exemplary structure includes a substrate 8, which can be a semiconductor substrate that includes a semiconductor material at least at an upper portion thereof. The semiconductor material of the substrate 8 may include a single crystalline semiconductor material or a polycrystalline semiconductor material. In one embodiment, the substrate 8 may include a commercially available single crystalline semiconductor substrate such as a silicon wafer.

The semiconductor material of the substrate 9 is referred to herein as a substrate semiconductor layer 9, which may comprise a semiconductor (e.g., silicon) wafer, a doped well in the wafer, or a silicon layer over another substrate material (e.g., silicon on insulator type structure). The substrate semiconductor layer 9 may have a doping of a first conductivity type, and may include dopants of the first conductivity type at an atomic concentration in a range from $1.0 \times 10^{13}/\text{cm}^3$ to $3.0 \times 10^{17}/\text{cm}^3$. Dopants of a second conductivity type can be provided (e.g., diffused or implanted) into an upper portion of the substrate semiconductor layer 9 or a doped semiconductor layer may be grown epitaxially on the substrate semiconductor layer 9. The doped upper portion of the substrate semiconductor layer 9 is converted into a source region 6. The source region 6 can have a net doping of the second conductivity type such that the atomic concentration of dopants of the second conductivity type is in a range from $1 \times 10^{18}/\text{cm}^3$ to $2 \times 10^{21}/\text{cm}^3$. The source region 6 functions as a common source region (e.g., source line or plate) for vertical field effect transistors to be subsequently formed. The thickness of the source region 6 can be in a range from 30 nm to 300 nm, although lesser and greater thicknesses can also be employed. Alternatively, a metal or metal alloy source line or plate may be formed under the source region 6.

In one embodiment, the substrate semiconductor layer 9 comprises a single crystalline semiconductor material, and the source region 6 can be formed by introducing dopants of a second conductivity type that is the opposite of the first conductivity type into a portion of the substrate semiconductor layer 9. In this case, the source region 6 comprises a first single crystalline semiconductor material portion. The source region 6 can be located in a substrate 8, and can comprise a single crystalline doped semiconductor layer that continuously extends in a memory array region in which a two-dimensional array of ferroelectric memory elements is subsequently formed.

A first epitaxial semiconductor material (e.g., single crystalline silicon) including dopants of a first conductivity type at a first dopant concentration can be grown on the top surface of the source region 6 to form a first semiconductor channel material layer 33L. The first dopant concentration may be in a range from $1 \times 10^{16}/cm^3$ to $1 \times 10^{18}/cm^3$, although lesser and greater dopant concentrations can also be employed. The thickness of the first semiconductor channel material layer 33L can be in a range from 10 nm to 100 nm, although lesser and greater thicknesses can also be employed.

A second epitaxial semiconductor material (e.g., single crystalline silicon) including dopants of the first conductivity type at a second dopant concentration can be grown on the top surface of the first semiconductor channel material layer 33L to form a second semiconductor channel material layer 34L. The second dopant concentration can be less than the first dopant concentration, and may be in a range from $1.0 \times 10^{13}/cm^3$ to $1.0 \times 10^{17}/cm^3$, such as from $1.0 \times 10^{14}/cm^3$ to $1.0 \times 10^{16}/cm^3$, although lesser and greater dopant concentrations can also be employed.

Dopants of the second conductivity type can be provided (e.g., diffused or implanted) into an upper region of the second semiconductor channel material layer 34L to provide a doped semiconductor material layer having a doping of the second conductivity type. The doped semiconductor material layer is herein referred to as a drain material layer 36L. Alternatively, the doped drain material layer 36L may be formed by epitaxial growth on the second semiconductor channel material layer 34L. The atomic concentration of dopants of the second conductivity in the drain material layer 36L can be in a range from in a range from $1 \times 10^{18}/cm^3$ to $2 \times 10^{21}/cm^3$. The thickness of the second semiconductor channel material layer 34L can be in a range from 30 nm to 600 nm, such as from 60 nm to 300 nm, although lesser and greater thicknesses can also be employed. The thickness of the drain material layer 36L can be in a range from 30 nm to 300 nm, although lesser and greater thicknesses can also be employed.

Figure 2D:
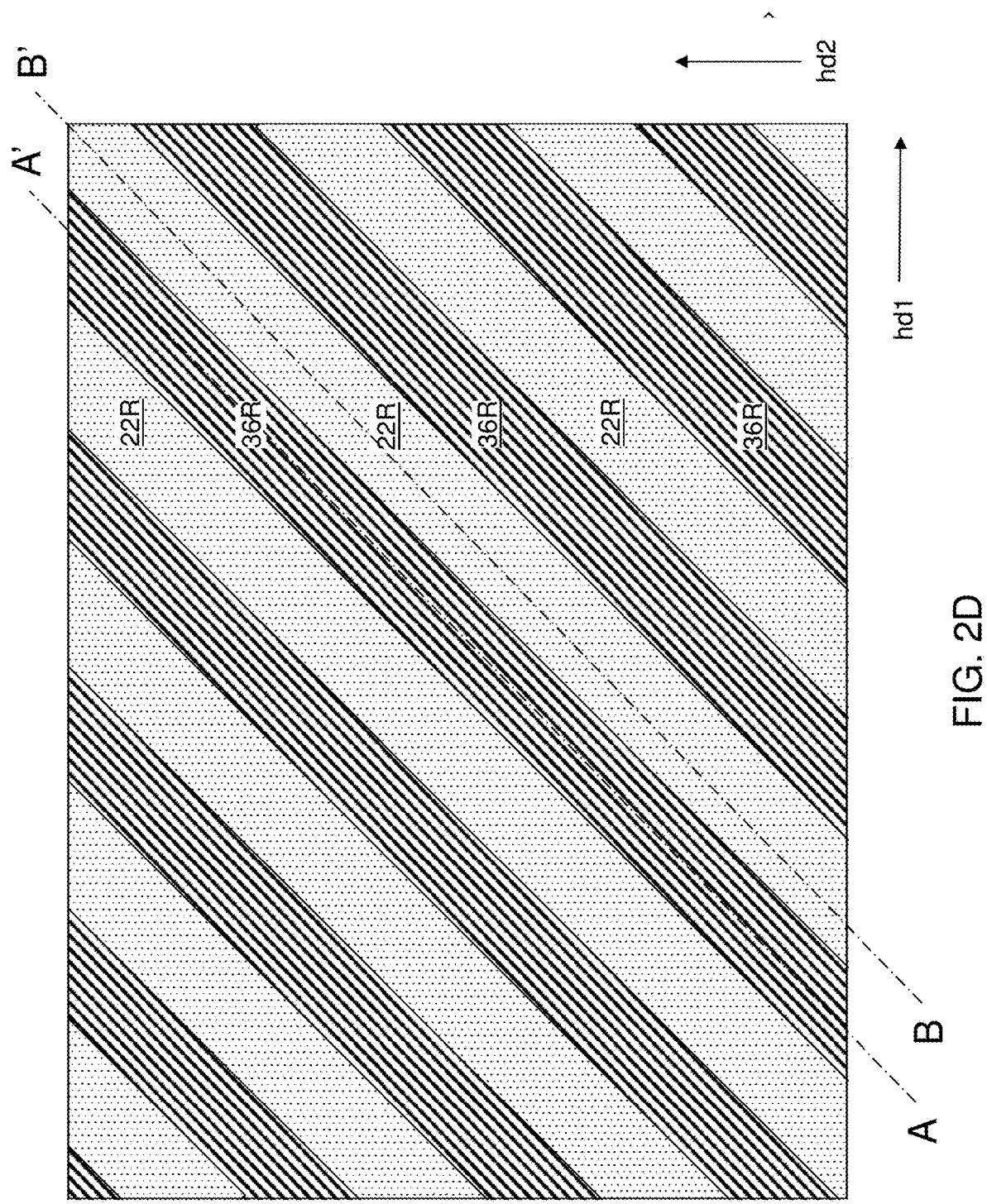
FIG. 2D is a top-down view of a second configuration of the first exemplary structure at the processing steps of FIGS. 2A and 2B. The plane A-A' corresponds to the plane of the vertical cross-section for FIG. 2A. The plane B-B' corresponds to the plane of the vertical cross-section for FIG. 2B.

Referring to FIGS. 2A-2D, dielectric isolation rails 22R can be formed thorough the layer stack of the drain material layer 36L, the second semiconductor channel material layer 34L, and the first semiconductor channel material layer 33L. FIGS. 2A, 2B, and 2C illustrate a first configuration of the first exemplary structure, and FIGS. 2A, 2B, and 2D illustrate a second configuration of the first exemplary structure.

For example, a photoresist layer (not shown) can be applied over the drain material layer 36L, and can be lithographically patterned to form a line and space pattern that laterally extend along a horizontal direction. In one embodiment, each patterned portion of the photoresist layer can have a same width, which is herein referred to as a line width, and each neighboring pair of patterned portions of the photoresist layer can be laterally spaced apart by a same spacing. In other words, the patterned portions of the photoresist layer can constitute a periodic one-dimensional array.

In the first configuration shown in FIG. 2C, the horizontal direction along which patterned portions of the photoresist layer laterally extend is parallel to the horizontal direction along which bit lines are to be subsequently formed, and perpendicular to the horizontal direction along which word lines are to be subsequently formed. In the second configuration shown in FIG. 2D, the horizontal direction along which patterned portions of the photoresist layer laterally extend is not perpendicular to the horizontal direction along which the bit lines and word lines are to be subsequently formed. The direction along which the bit lines extend is herein referred to as a first horizontal direction (e.g., bit line direction) hd1, and the horizontal direction that is perpendicular to the first horizontal direction hd1 is herein referred to as a second horizontal direction (e.g., word line direction) hd2. Thus, linear openings in the photoresist layer laterally extend along the second horizontal direction hd2 in the first configuration of the first exemplary structure, and linear openings in the photoresist layer laterally extends at an angle in a range between 0 degree and 90 degrees, such as from 30 degrees to 60 degrees, with respect to the first horizontal direction hd2 in the second configuration of the first exemplary structure.

Initial line trenches can be formed through the layer stack of the drain material layer 36L, the second semiconductor channel material layer 34L, and the first semiconductor channel material layer 33L by performing an anisotropic etch process employing the patterned photoresist layer as an etch mask. Each drain material layer 36L is divided into drain material rails 36R, each second semiconductor channel material layer 34L is divided into second semiconductor channel material rails 34R, and each first semiconductor channel material layer 33L is divided into first semiconductor channel material rails 33R. Each vertical stack of a first semiconductor channel material rail 33R, a second semiconductor channel material rail 34R, and a drain material rail 36R is formed between a respective pair of line trenches. A top surface of the source region 6 may be exposed in the initial line trenches, in which case the source region 6 functions as an etch stop region.

A diffusion barrier dielectric liner (such as silicon nitride) can be optionally deposited in the line trenches. A dielectric fill material such as undoped silicate glass (e.g., silicon oxide), a doped silicate glass, or organosilicate glass can be deposited in remaining volumes of the line trenches. Excess portions of the dielectric fill material and the optional dielectric diffusion barrier material can be removed from above the horizontal plane including the top surfaces of the drain material rails 36R by a planarization process, which can employ chemical mechanical polishing and/or a recess etch process. Each remaining portion of the dielectric fill material and the optional dielectric diffusion barrier material constitutes a dielectric isolation rail 22R.

Figure 3C:
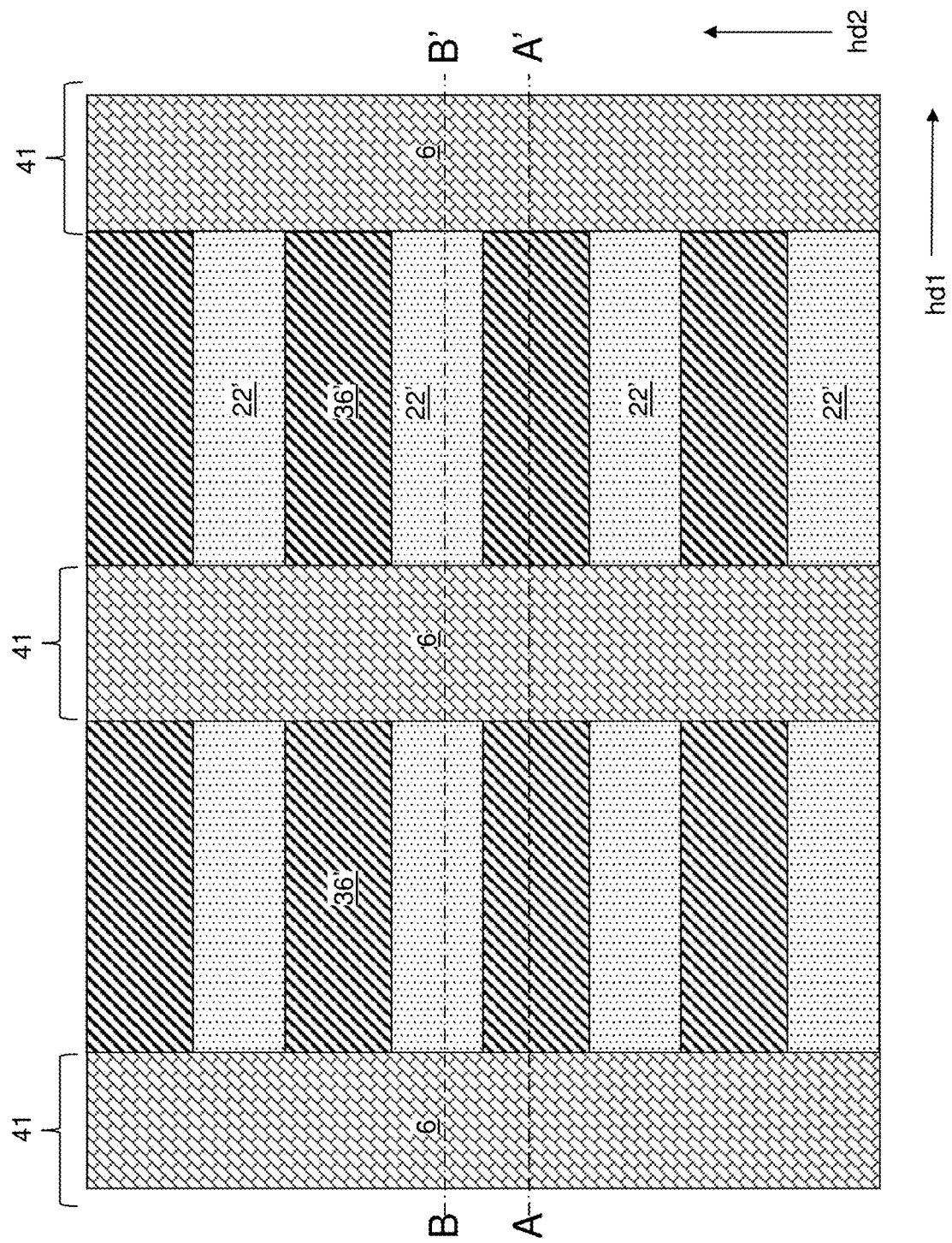
FIG. 3C is a top-down view of a first configuration of the first exemplary structure at the processing steps of FIGS. 3A and 3B. The plane A-A' corresponds to the plane of the vertical cross-section for FIG. 3A. The plane B-B' corresponds to the plane of the vertical cross-section for FIG. 3B.
Figure 3D:
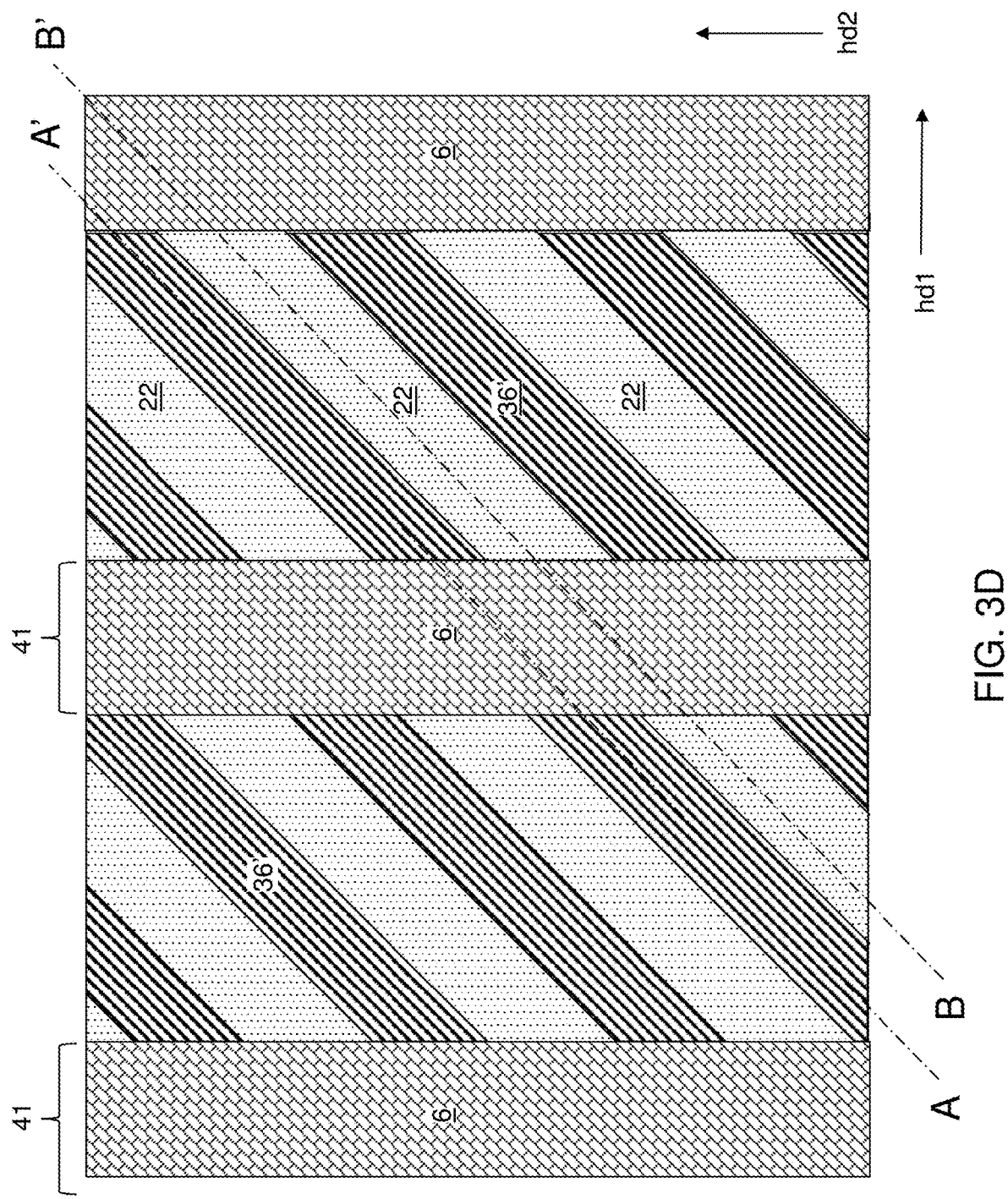
FIG. 3D is a top-down view of a second configuration of the first exemplary structure at the processing steps of FIGS. 3A and 3B. The plane A-A' corresponds to the plane of the vertical cross-section for FIG. 3A. The plane B-B' corresponds to the plane of the vertical cross-section for FIG. 3B.

Referring to FIGS. 3A-3D, first line trenches 41 laterally extending along the second horizontal direction hd2 are formed through the vertical stacks of a first semiconductor channel material rail 33R, a second semiconductor channel material rail 34R, and a drain material rail 36R and through the dielectric isolation rails 22R. FIG. 3C illustrates the first configuration of the first exemplary structure, and FIG. 3D illustrates the second configuration of the first exemplary structure.

For example, a photoresist layer can be applied over the vertical stacks of a first semiconductor channel material rail 33R, a second semiconductor channel material rail 34R, and a drain material rail 36R and over the dielectric isolation rails 22R, and can be lithographically patterned into a line and space pattern. The line and space pattern may be a periodic pattern with a same line width for each patterned portion of the photoresist layer and a same spacing for each laterally neighboring pair of patterned photoresist portions. In one embodiment, the spacing between laterally neighboring pair of patterned photoresist strips may be a lithographic critical dimension, i.e., a minimum dimension that can be printed employing a single lithographic exposure process and a single lithographic development process. The width of each patterned photoresist strip may be in a range from twice the lithographic critical dimension to six times the lithographic critical dimension. In one embodiment, the width of each patterned photoresist strip may be about four times the lithographic critical dimension.

An anisotropic etch process is performed to etch through the drain material rails 36R, the second semiconductor material rails 34R, the first semiconductor channel material rails 33R, and the dielectric isolation rails 22R. The anisotropic etch process can stop on the top surface of the source region 6. The anisotropic etch process can have a chemistry that etches the materials of the drain material rails 36R, the second semiconductor material rails 34R, the first semiconductor channel material rails 33R, and the dielectric isolation rails 22R, or can include multiple etch steps such that the semiconductor materials of the drain material rails 36R, the second semiconductor material rails 34R, and the first semiconductor channel material rails 33R are etched in one of the etch steps of the anisotropic etch process, and the dielectric isolation rails 22R are etched in another of the etch steps of the anisotropic etch process. The patterned photoresist layer protects underlying portions of the drain material rails 36R, the second semiconductor material rails 34R, the first semiconductor channel material rails 33R, and the dielectric isolation rails 22R during the anisotropic etch process. The first line trenches 41 are formed within areas that are not covered by the patterned photoresist strips. The depth of the first line trenches 41 is herein referred to as a first depth.

Each of the drain material rails 36R are divided into drain material portions 36'. The second semiconductor material rails 34R are divided into second semiconductor channel material portions 34'. The first semiconductor channel material rails 33R are divided into first semiconductor channel material portions 33'. The dielectric isolation rails 22R are divided into discrete dielectric isolation structures 22'. The first line trenches 41 divide each of the dielectric isolation rails 22R into a two-dimensional array of discrete dielectric isolation structures (e.g., dielectric pillars) 22'. Each vertical stack of a first semiconductor channel material portion 33', a second semiconductor channel material portion 34', and a drain material portion 36' constitutes a semiconductor pillar (33', 34', 36'). Each semiconductor pillar (33', 34', 36') can have a rectangular horizontal cross-sectional shape that is invariant with translation along the vertical direction. A two-dimensional array of semiconductor pillars (33', 34', 36') can be interlaced (i.e., alternated) with the two-dimensional array of discrete dielectric isolation structures 22' along the second horizontal direction hd2. The patterned photoresist strips can be subsequently removed, for example, by ashing.

Figure 4C:
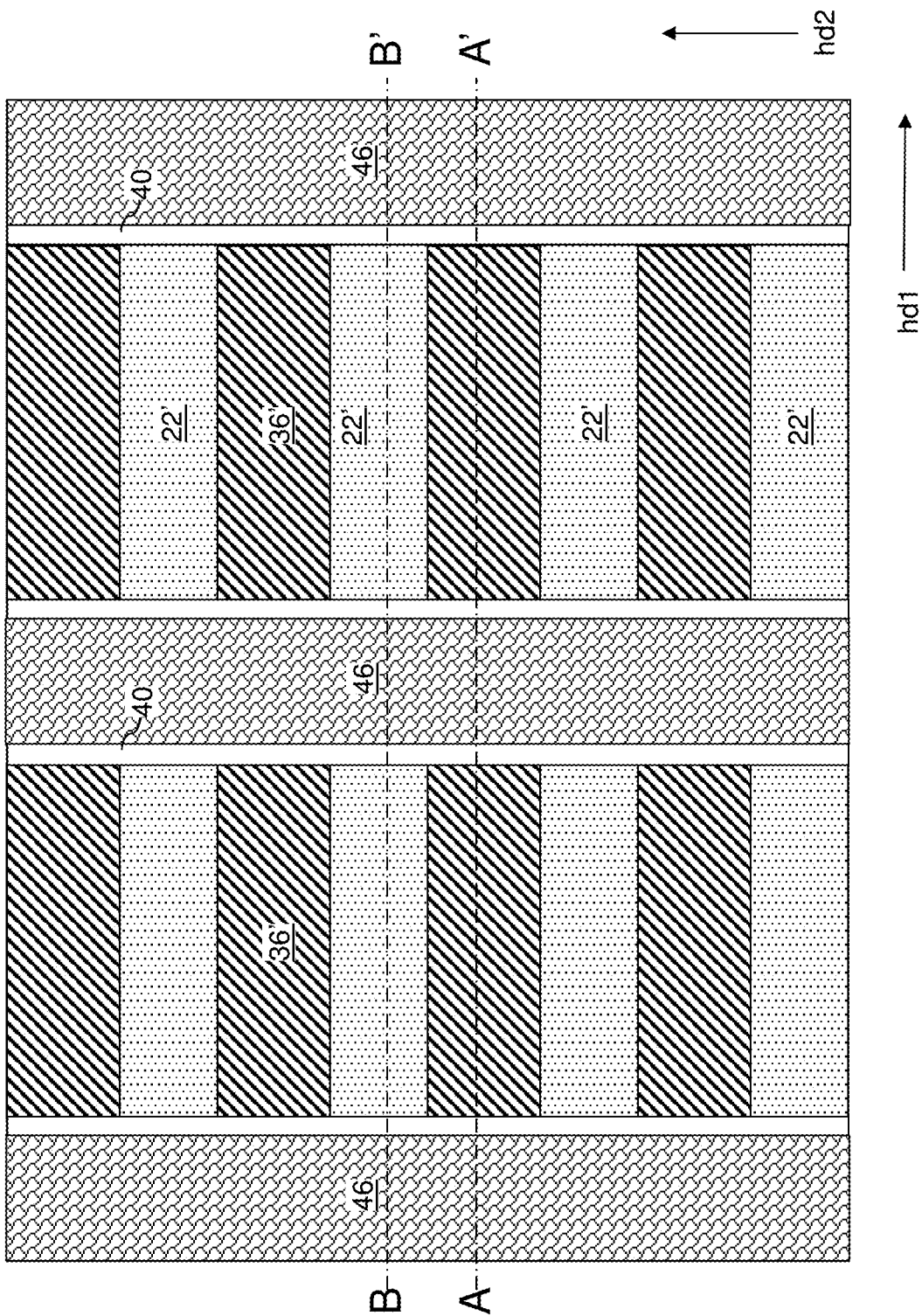
FIG. 4C is a top-down view of a first configuration of the first exemplary structure at the processing steps of FIGS. 4A and 4B. The plane A-A' corresponds to the plane of the vertical cross-section for FIG. 4A. The plane B-B' corresponds to the plane of the vertical cross-section for FIG. 4B.
Figure 4D:
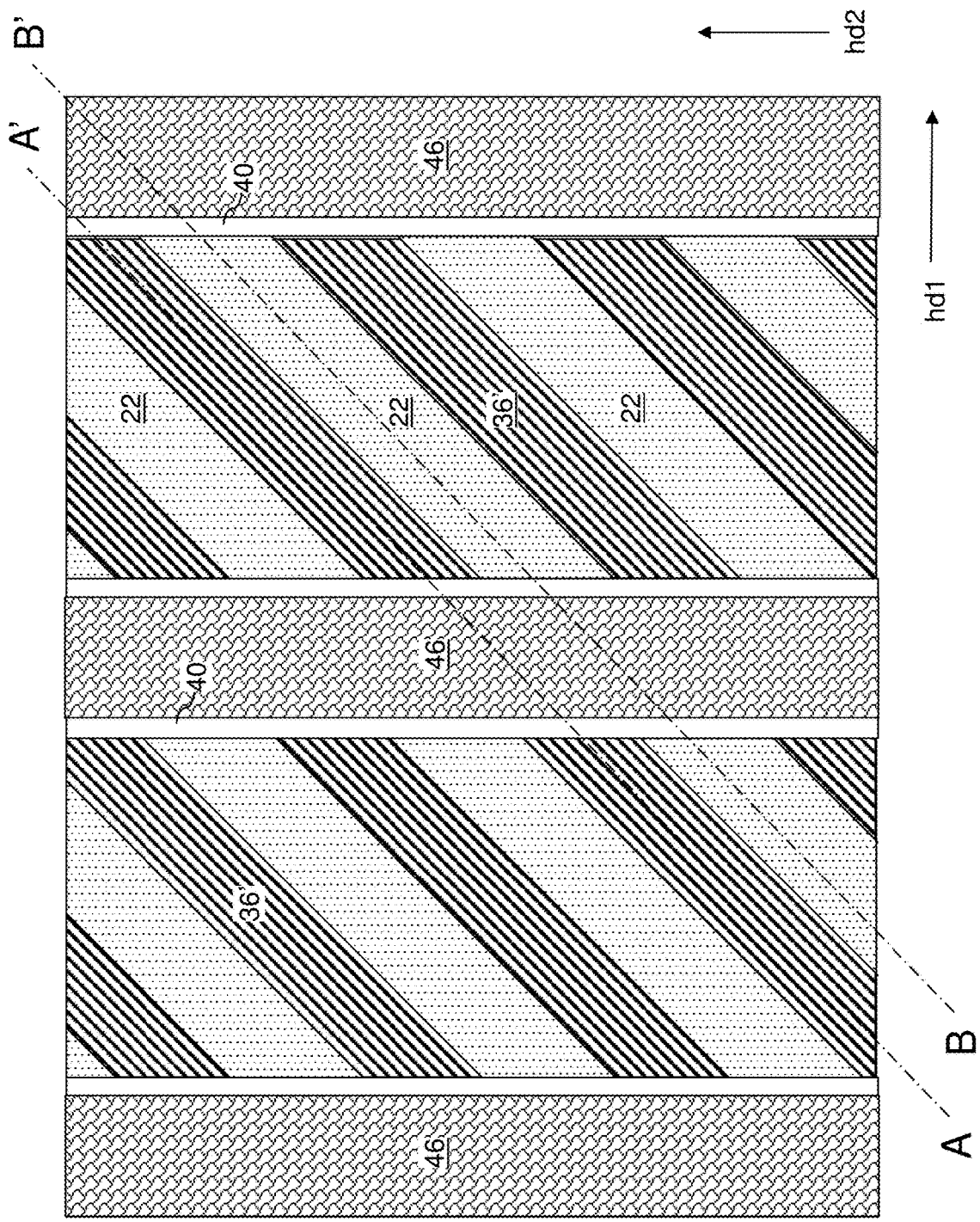
FIG. 4D is a top-down view of a second configuration of the first exemplary structure at the processing steps of FIGS. 4A and 4B. The plane A-A' corresponds to the plane of the vertical cross-section for FIG. 4A. The plane B-B' corresponds to the plane of the vertical cross-section for FIG. 4B.

Referring to FIGS. 4A-4D, a first gate dielectric and a first gate electrode line is formed within each first line trench 41. Each first gate dielectric is herein referred to as a select gate dielectric 40, and each first gate electrode line is herein referred to as a select gate electrode line 46. The select gate electrode line 46 may also be referred to as a pass gate electrode line, access gate electrode line, a back gate electrode line or a read line (since this line is activated during the read operation, as will be discussed with respect to FIGS. 14A and 14B below). FIG. 4C illustrates the first configuration of the first exemplary structure, and FIG. 4D illustrates the second configuration of the first exemplary structure.

In one embodiment, a select gate dielectric material layer can be deposited in the first line trenches 41 by a conformal deposition process. The select gate dielectric material layer can include a gate dielectric material such as silicon oxide and/or a dielectric metal oxide. The select gate dielectric material layer can be formed by a chemical vapor deposition process and/or a dielectric conversion process (such as a thermal oxidation process and/or a thermal nitridation process) of the underlying semiconductor (e.g., silicon) material. The thickness of the select gate dielectric material layer can be in a range from 1 nm to 12 nm, such as from 2 nm to 6 nm, although lesser and greater thicknesses can also be employed.

A select gate electrode material can be deposited over the select gate dielectric material layer. The select gate electrode material can include a heavily doped semiconductor material, an elemental metal, an intermetallic alloy, a metal silicide, and/or a conductive metallic compound including at least one metal and at least one non-metallic element (e.g., a metal nitride, such as TiN). Portions of the select gate electrode material and the select gate dielectric material layer that overlie the top surfaces of the drain material portions 36' and the discrete dielectric isolation structures 22' by a planarization process. The planarization process can employ a recess etch process and/or a chemical mechanical polishing process. Further, top surfaces of remaining portions of the select gate electrode material can be vertically recessed below the horizontal plane including the top surfaces of the drain material portions 36' and the discrete dielectric isolation structures 22' by a selective etch.

Each remaining portion of the select gate dielectric material layer constitutes a select gate dielectric 40. Each select gate dielectric 40 extends up to, or above, the horizontal plane including the interfaces between the second semiconductor channel material portions 34' and the drain material portions 36'. Each remaining portion of the select gate electrode material constitutes a select gate electrode line 46. Each select gate electrode line 46 can have a top surface located at, or above, the horizontal plane including the interfaces between the second semiconductor channel material portions 34' and the drain material portions 36'. Generally, a select gate dielectric 40 can be formed on a sidewall of a first semiconductor channel material portion 33', on a sidewall of a second semiconductor channel material portion 34' that overlies the first semiconductor channel material portion 33', and on a portion of the top surface of the source region 6.

Each select gate dielectric 40 can have a first U-shaped vertical cross-sectional profile, and can include a horizontal select gate dielectric portion contacting a portion of the top surface of the source region 6, a first vertical select gate dielectric portion adjoined to a first edge of the horizontal select gate dielectric portion, and a second vertical select gate dielectric portion adjoined to a second edge of the horizontal select gate dielectric portion.

Figure 5C:
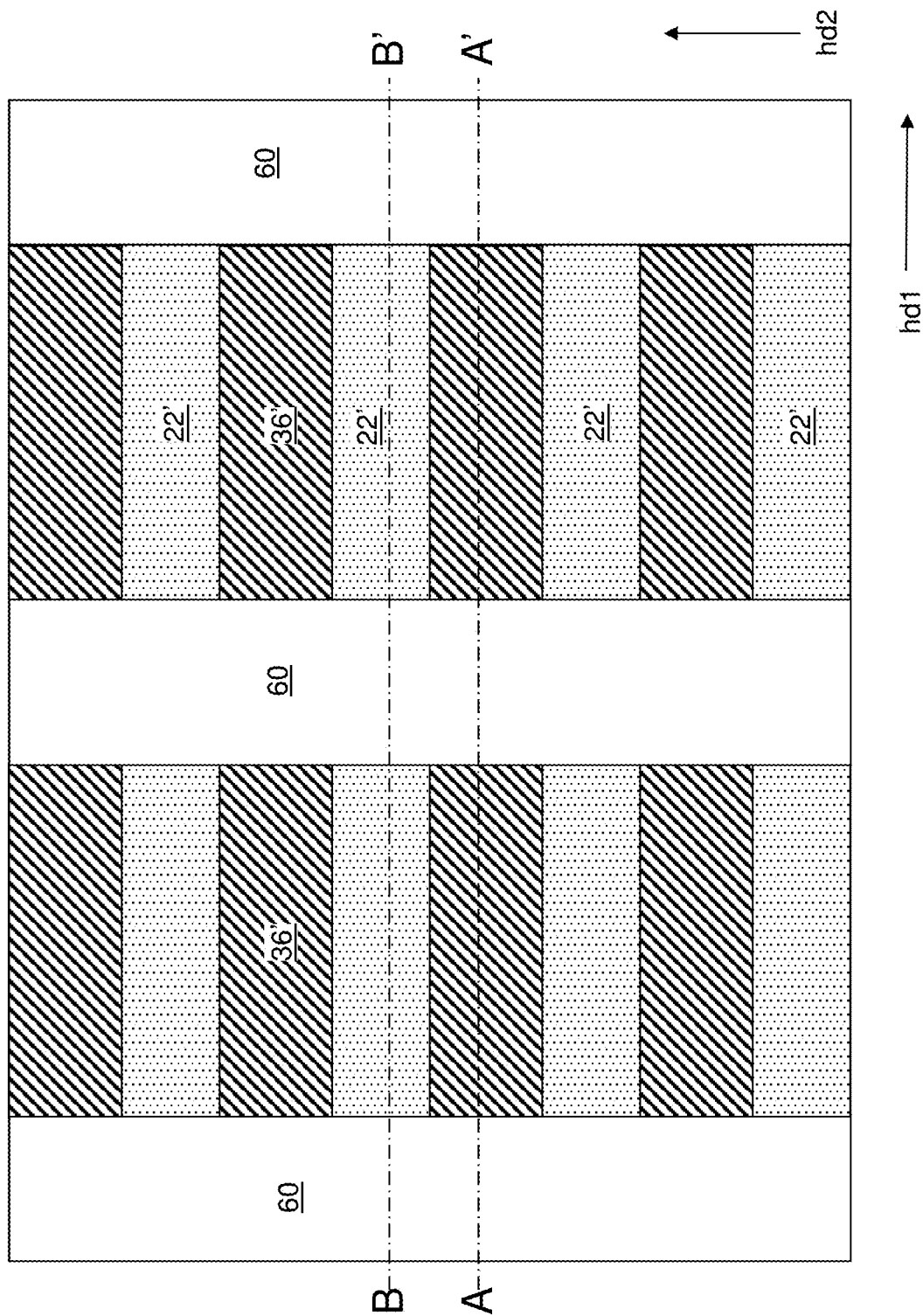
FIG. 5C is a top-down view of a first configuration of the first exemplary structure at the processing steps of FIGS. 5A and 5B. The plane A-A' corresponds to the plane of the vertical cross-section for FIG. 5A. The plane B-B' corresponds to the plane of the vertical cross-section for FIG. 5B.
Figure 5D:
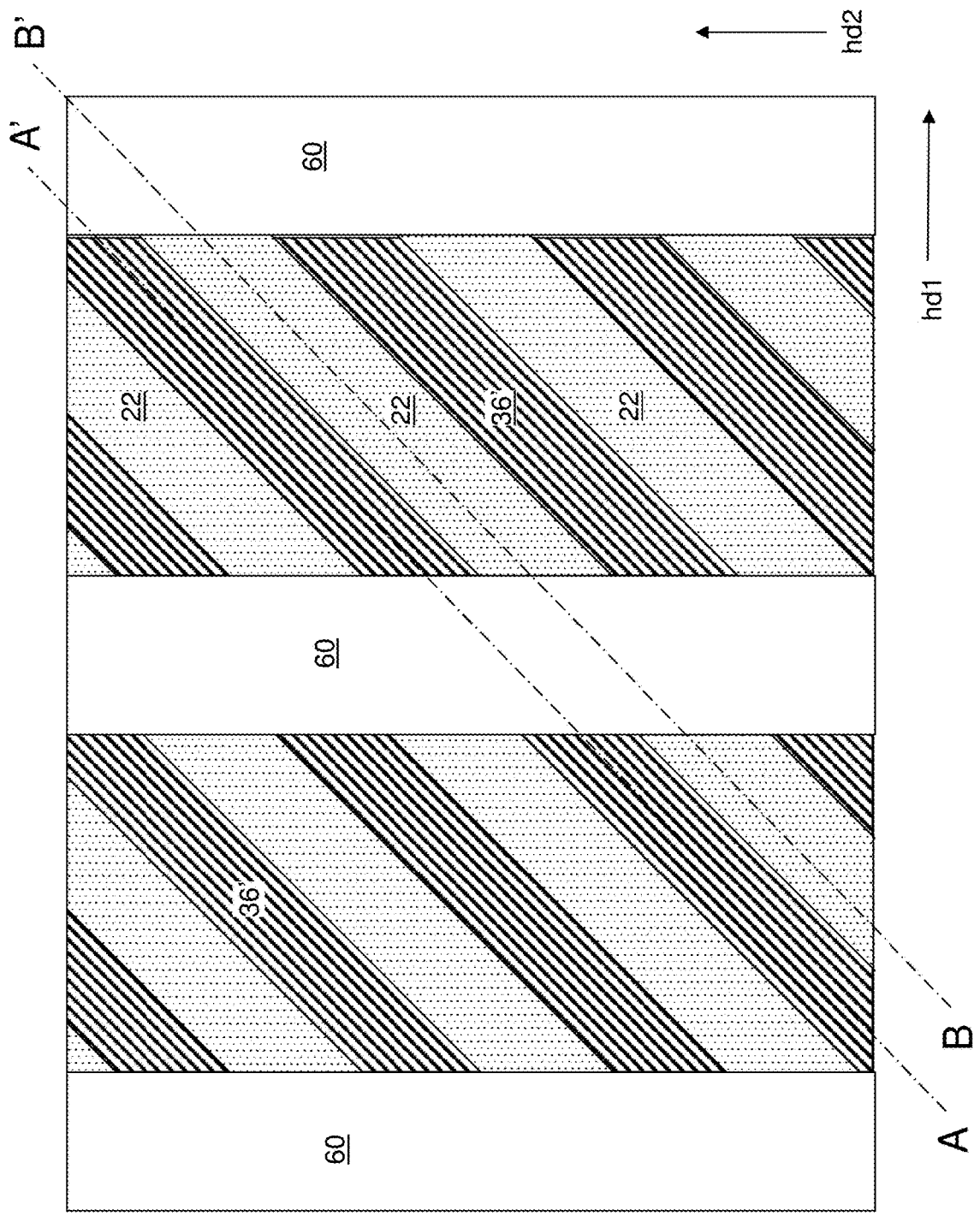
FIG. 5D is a top-down view of a second configuration of the first exemplary structure at the processing steps of FIGS. 5A and 5B. The plane A-A' corresponds to the plane of the vertical cross-section for FIG. 5A. The plane B-B' corresponds to the plane of the vertical cross-section for FIG. 5B.

Referring to FIGS. 5A-5D, a dielectric material can be deposited and planarized to fill cavities overlying the select gate electrode lines 46. The remaining portions of the dielectric material that overlie the select gate electrode lines 46 constitute select gate cap dielectric rails 60. The select gate cap dielectric rails 60 includes a dielectric material such as undoped silicate glass, and laterally extends along a horizontal direction, which may, or may not, be the second horizontal direction hd2. FIG. 5C illustrates the first configuration of the first exemplary structure, and FIG. 5D illustrates the second configuration of the first exemplary structure.

Figure 6A:
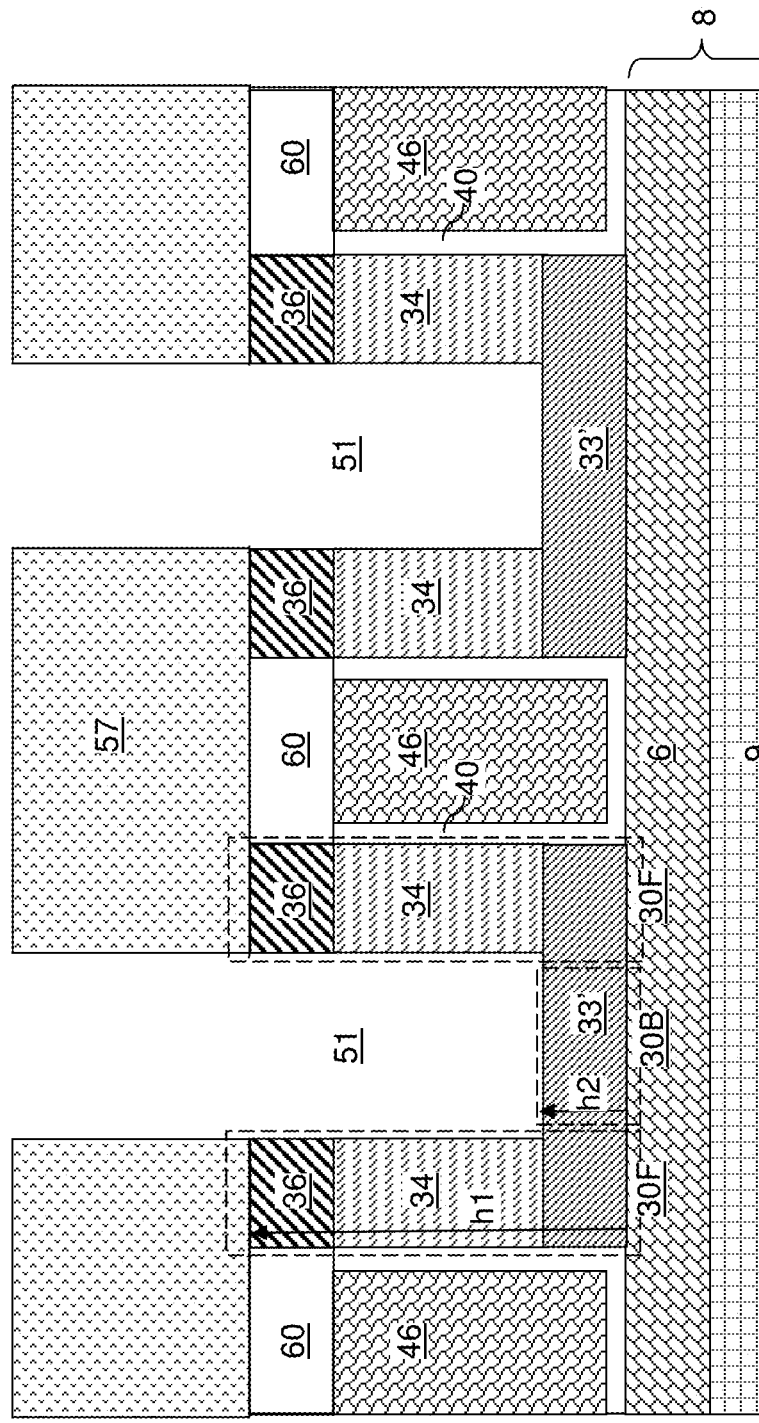
FIG. 6A is a first vertical cross-sectional view of the first exemplary structure after formation of second line trenches that pattern semiconductor pillars into U-shaped stepped semiconductor material structures and pattern the dielectric isolation structures according to an embodiment of the present disclosure.
Figure 6B:
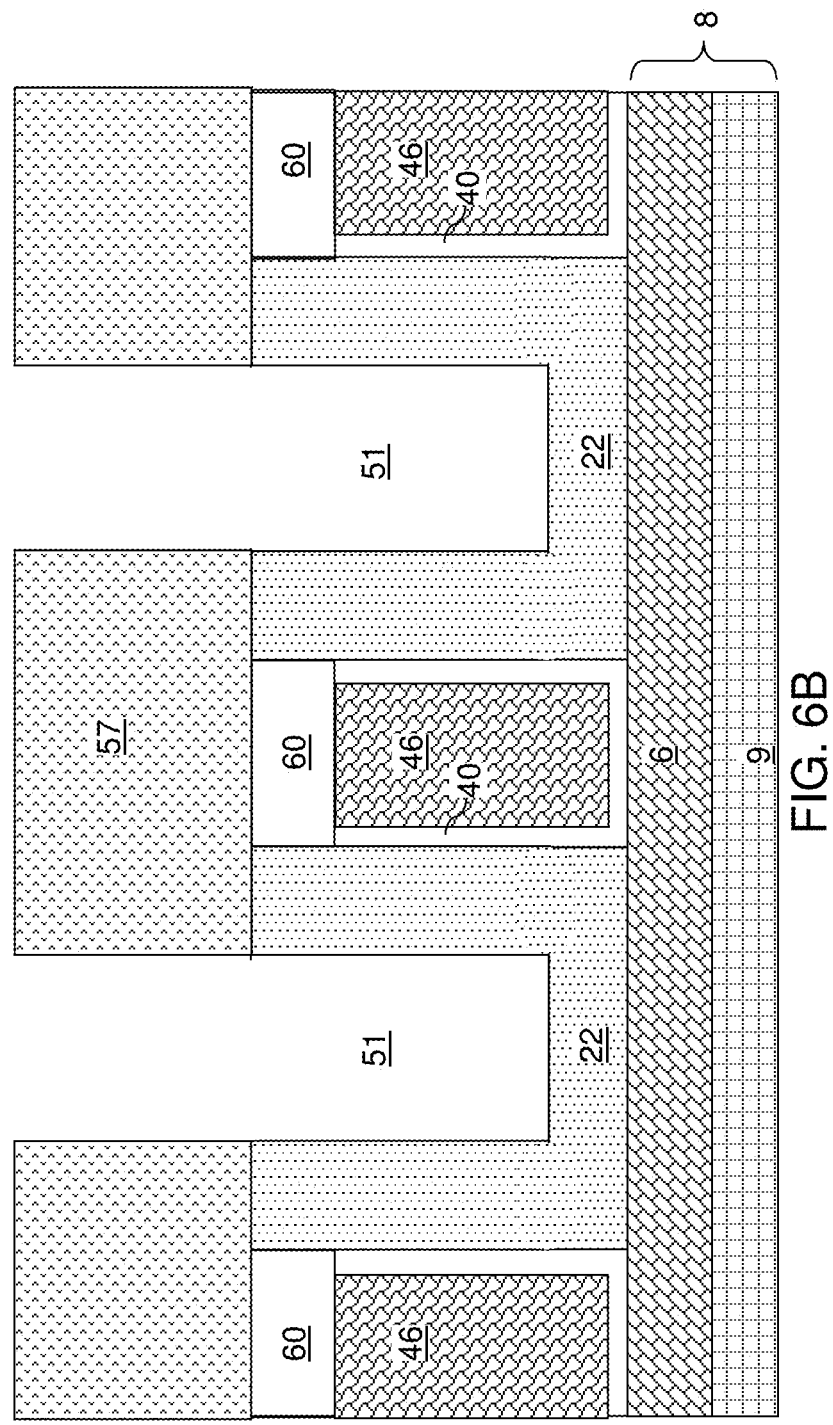
FIG. 6B is a second vertical cross-sectional view of the first exemplary structure at the processing steps of FIG. 6A.
Figure 6C:
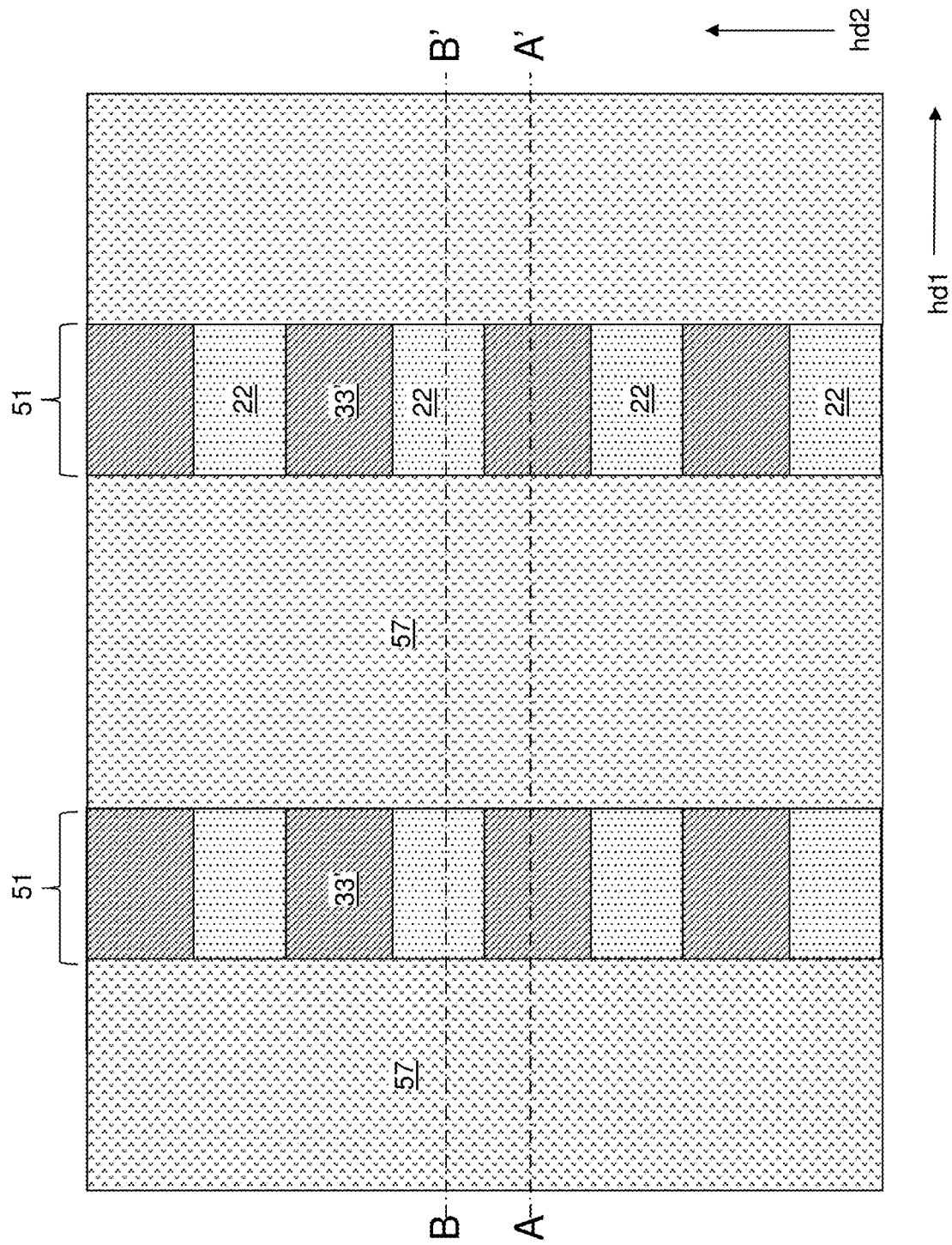
FIG. 6C is a top-down view of a first configuration of the first exemplary structure at the processing steps of FIGS. 6A and 6B. The plane A-A' corresponds to the plane of the vertical cross-section for FIG. 6A. The plane B-B' corresponds to the plane of the vertical cross-section for FIG. 6B.
Figure 6D:
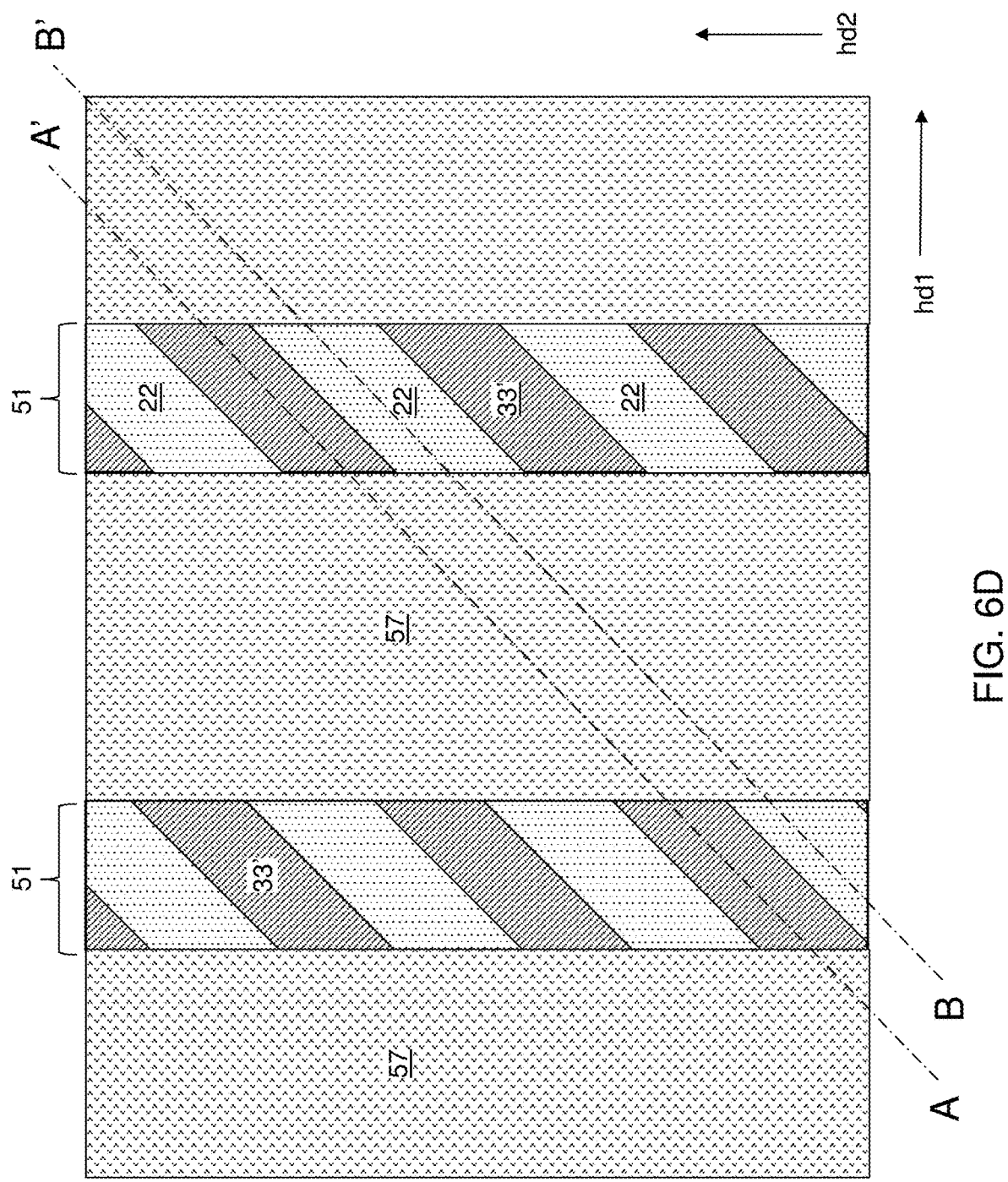
FIG. 6D is a top-down view of a second configuration of the first exemplary structure at the processing steps of FIGS. 6A and 6B. The plane A-A' corresponds to the plane of the vertical cross-section for FIG. 6A. The plane B-B' corresponds to the plane of the vertical cross-section for FIG. 6B.

Referring to FIGS. 6A-6D, a photoresist layer 57 can be applied over the drain material portions 36' and the select gate cap dielectric rails 60, and can be lithographically patterned to form line-shaped strips that overlie a respective one of the select gate cap dielectric rails 60. FIG. 6C illustrates the first configuration of the first exemplary structure, and FIG. 6D illustrates the second configuration of the first exemplary structure.

In one embodiment, each opening in the photoresist layer 57 can have a uniform width, and can laterally extend along the second horizontal direction hd2. Thus, each opening in the photoresist layer 57 can have a pair of straight edges that are parallel to the sidewalls of the first line trenches 41 that include a respective combination of a select gate dielectric 40, a select gate electrode line 46, and a select gate cap dielectric rail 60. In one embodiment, the straight edges of each opening in the photoresist layer 57 may be approximately equidistant from proximal sidewalls of a pair of first line trenches that are covered by a neighboring pair of photoresist strips of the patterned photoresist layer 57. In one embodiment, the width of each opening in the photoresist layer 57 may have a lithographic critical dimension.

An anisotropic etch process can be performed employing the patterned photoresist layer 57 as an etch mask. Unmasked portions of the drain material portions 36', the second semiconductor channel material portions 34', and the discrete dielectric isolation structures 22' can be etched to form second line trenches 51. Each second line trench 51 can have a uniform width throughout. A top surface of a first semiconductor channel material portion 33' can be physically exposed at the bottom of each second line trench 51 after the anisotropic etch process. The first semiconductor channel material portions 33' can function as an etch stop structure during the anisotropic etch process. In one embodiment, the anisotropic etch process can etch the materials of the drain material portions 36', the second semiconductor channel material portions 34', and the discrete dielectric isolation structures 22'. In another embodiment, the anisotropic etch process can include multiple etch steps, which include an anisotropic etch step that etches the materials of the drain material portions 36' and the second semiconductor channel material portions 34', and another anisotropic etch step that etches the material of the discrete dielectric isolation structures 22'.

The second line trenches 51 pattern the semiconductor pillars (33', 34', 36') into stepped semiconductor material structures (33', 34, 36) having a respective U-shaped vertical cross-sectional profile, and pattern the discrete dielectric isolation structures 22' into U-shaped dielectric isolation structures 22. Alternatively, the discrete dielectric isolation structures 22' may be etched all the way through to the source region 6 to form two separate pillar shaped dielectric isolation structures 22. Each second semiconductor channel material portion 34' is divided into two semiconductor channel material portions, which are herein referred to as second semiconductor channel portions 34. Each drain material portion 36' is divided into two drain regions 36. Each U-shaped stepped semiconductor material structure (33', 34, 36) can include a first semiconductor channel material portion 33', a pair of second semiconductor channel portions 34, and a pair of drain regions 36. Each stepped semiconductor material structure (33', 34, 36) can comprise two fin portions 30F having a first height h1 and a base portion 30B having a second height hd2 and located over a first region of a top surface of the source region 6. Each fin portion 30F can include a drain region 36, a second semiconductor channel portion 34, and a region of a first semiconductor channel material portion 33' that underlies second semiconductor channel portion 34. Each base portion 30B can include a region of a first semiconductor channel material portion 33' that does not underlie any second semiconductor channel portion 34.

Each stepped semiconductor material structure (33', 34, 36) can comprise a pair of outer sidewalls having the first height hd1 and a pair of inner sidewalls having a height that is less than the first height hd1 located between the pair of outer sidewalls. A second line trench 51 is formed between, and is laterally bounded by, the pair of inner sidewalls. The second line trenches 51 form a groove within each of the discrete dielectric isolation structures 22', thereby converting the discrete dielectric isolation structures 22' into the U-shaped or pillar shaped dielectric isolation structures 22. Generally, the stepped semiconductor material structures (33', 34, 36) can be formed by patterning semiconductor material portions with line trenches (41, 51) having substantially vertical sidewalls (e.g., within 0 to 10 degrees of vertical due to etching variations). The line trenches can comprise first line trenches 41 having a first depth that is the same as the first height h1 and second line trenches 51 having a second depth that is less than the first height h1.

Figure 7B:
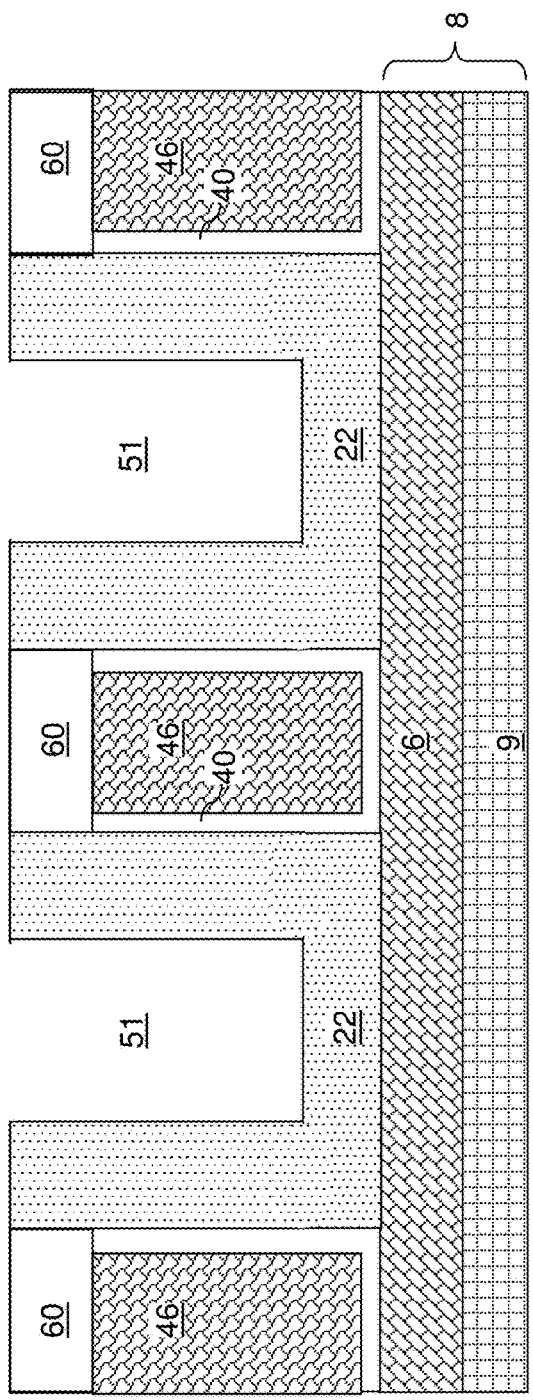
FIG. 7B is a second vertical cross-sectional view of the first exemplary structure at the processing steps of FIG. 7A.
Figure 7A:
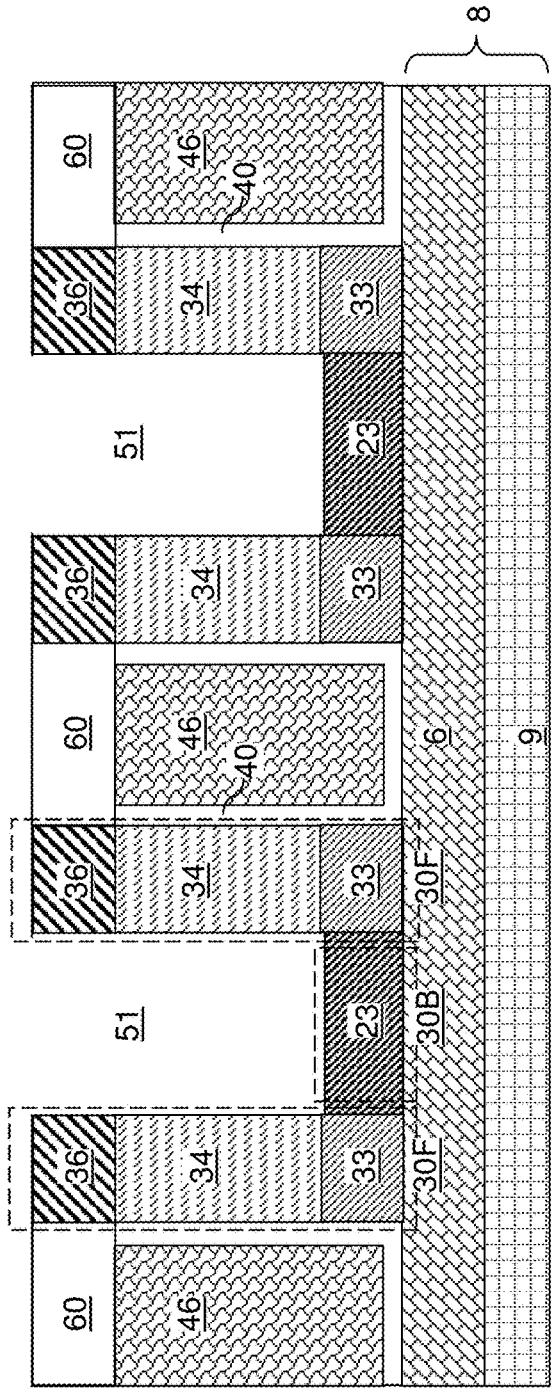
FIG. 7A is a first vertical cross-sectional view of the first exemplary structure after conversion of horizontal portions of the U-shaped stepped semiconductor material structures into spacer material portions by implantation of first conductivity type dopants, oxygen atoms, or nitrogen atoms according to an embodiment of the present disclosure.
Figure 7C:
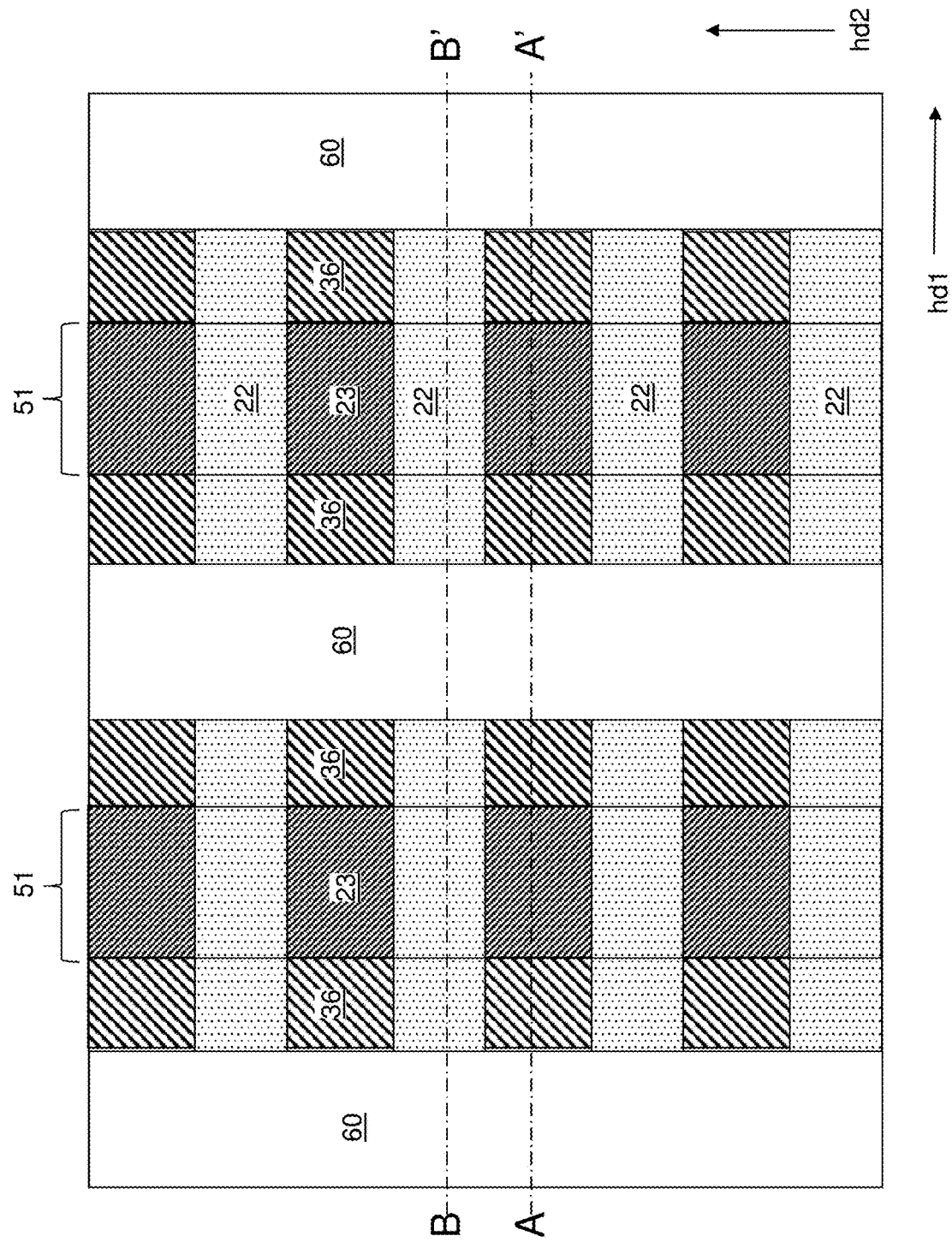
FIG. 7C is a top-down view of a first configuration of the first exemplary structure at the processing steps of FIGS. 7A and 7B. The plane A-A' corresponds to the plane of the vertical cross-section for FIG. 7A. The plane B-B' corresponds to the plane of the vertical cross-section for FIG. 7B.
Figure 7D:
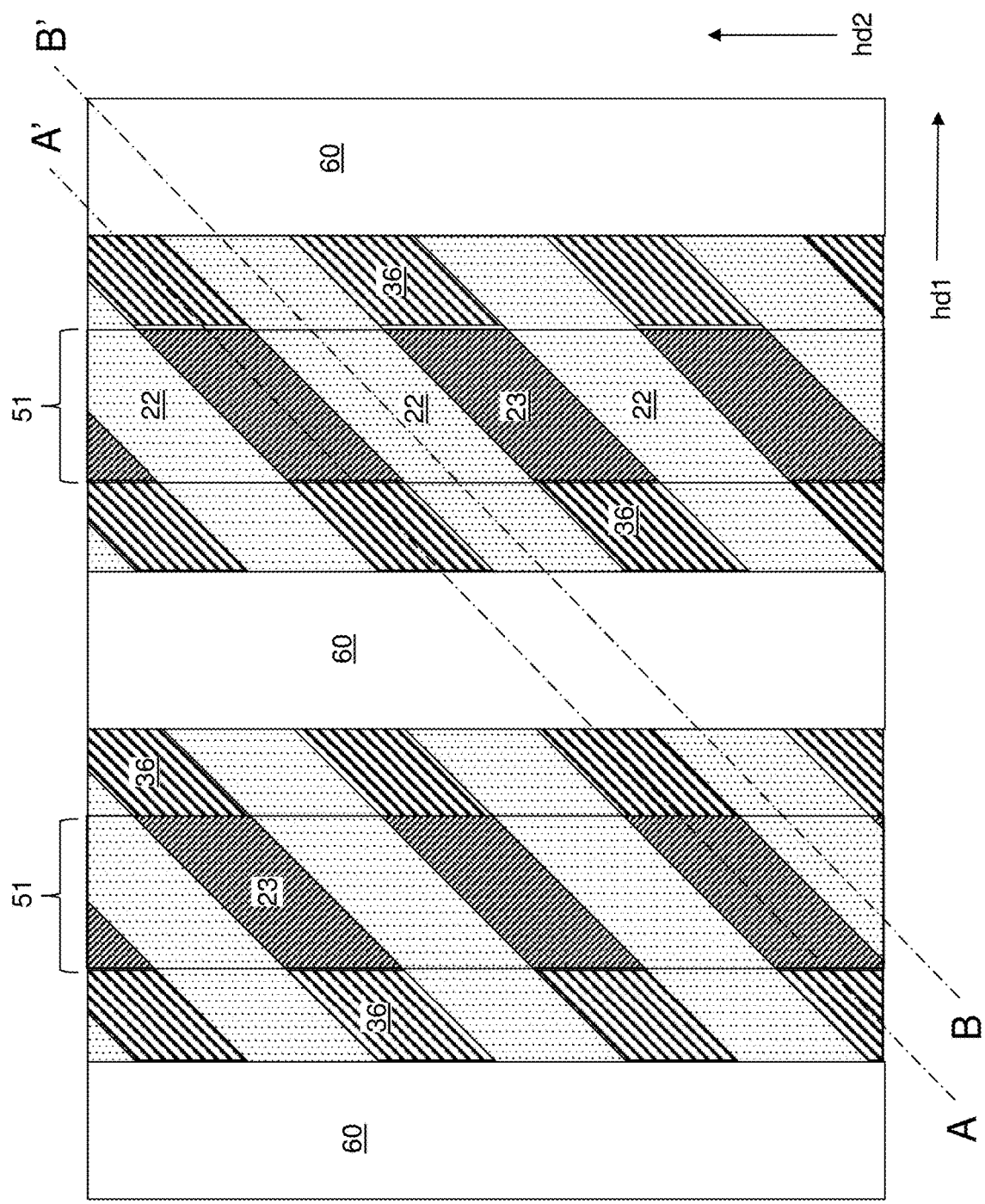
FIG. 7D is a top-down view of a second configuration of the first exemplary structure at the processing steps of FIGS. 7A and 7B. The plane A-A' corresponds to the plane of the vertical cross-section for FIG. 7A. The plane B-B' corresponds to the plane of the vertical cross-section for FIG. 7B.

Referring to FIGS. 7A-7D, the base portions 30B of the stepped semiconductor material structures (33', 34, 36) (i.e., the horizontal portions 30B of the U-shaped stepped semiconductor material structures) are converted into spacer material portions 23 which decrease electrical conductivity between the source region 6 and the second semiconductor channel portion 34. The spacer material portions 23 may be formed by implantation of first conductivity type dopants, oxygen atoms, and/or nitrogen atoms into the semiconductor base portions 30B (i.e., into segments of the first semiconductor channel material portions 33' that do not underlie any of the second semiconductor channel portions 34). FIG. 7C illustrates the first configuration of the first exemplary structure, and FIG. 7D illustrates the second configuration of the first exemplary structure.

Electrical conduction through the base portions 30B of the stepped semiconductor material structures (33', 34, 36) between the source region 6 and the second semiconductor channel portions 34 can be reduced by implanting dopants of the first conductivity type into the base portions 30B, or by implanting electrically inactive atoms, such as oxygen atoms and/or nitrogen atoms, that convert the semiconductor material of the base portions 30B into an insulating material, such as silicon oxide, silicon nitride or silicon oxynitride. The photoresist layer 57 is used as a mask during the ion implantation and can be removed by ashing after the implantation.

Each unimplanted region of the first semiconductor channel material portions 33' constitutes a first semiconductor channel portion 33. Each vertical stack of a first semiconductor channel portion 33 and a second semiconductor channel portion 34 constitutes a vertical semiconductor channel (33, 34). Each vertical semiconductor channel (33, 34) (i.e., a vertical stack of a first semiconductor channel portion 33 and a second semiconductor channel portion 34 that overlies the first semiconductor channel portion 33) is located in a respective fin portion 30F of each stepped semiconductor material structure (23, 33, 34, 36).

In one embodiment, the source region 6 comprises a first single crystalline semiconductor material portion, and each first semiconductor channel portion 33 comprises a second single crystalline semiconductor material portion in epitaxial alignment with the first single crystalline semiconductor material portion. Each second semiconductor channel portion 34 can comprise a third single crystalline semiconductor material portion in epitaxial alignment with the second single crystalline semiconductor material portion of an underlying first semiconductor channel portion 33. Each first semiconductor channel portion 33 can comprise electrical dopants of a first conductivity type at a first atomic concentration, and each second semiconductor channel portion 34 comprises electrical dopants of the first conductivity type at a second atomic concentration that is less than the first atomic concentration.

A drain region 36 is provided on a top end of each vertical semiconductor channel (33, 34). The drain regions 36 can form a two-dimensional array of discrete drain regions. The drain region 36 comprises electrical dopants of the second conductivity type at an atomic concentration greater than the second atomic concentration (i.e., the atomic concentration of dopants of the second conductivity type in the first semiconductor channel portions 34).

Generally, leakage current through the base portions 30B of the stepped semiconductor material structures (23, 33, 34, 36) can be reduced by implanting dopants into the base portions 30B. Generally, dopants of the first conductivity type, oxygen atoms, or nitrogen atoms in the spacer material portions 23 can have an atomic concentration in a range from $1.0 \times 10^{16}/cm^3$ to $1.0 \times 10^{19}/cm^3$, although lesser and greater atomic concentrations can also be employed.

In case additional dopants of the first conductivity type are implanted into the spacer material portions 23, the spacer material portions 23 can include dopants of the first conductivity type at a third atomic concentration that is greater than the first atomic concentration. In this case, the spacer material portion 23 of each stepped semiconductor material structures (23, 33, 34, 36) can comprise an additional single crystalline semiconductor material portion in epitaxial alignment with the first single crystalline semiconductor material portion of the source region 6 and with the second single crystalline semiconductor material portion of the first semiconductor channel portion 33 of the stepped semiconductor material structures (23, 33, 34, 36). Alternatively, the spacer material portions 23 can comprise a semiconductor oxide, nitride or oxynitride material portion including oxygen atoms and/or nitrogen atoms at an atomic concentration greater than the first atomic concentration.

Figure 8C:
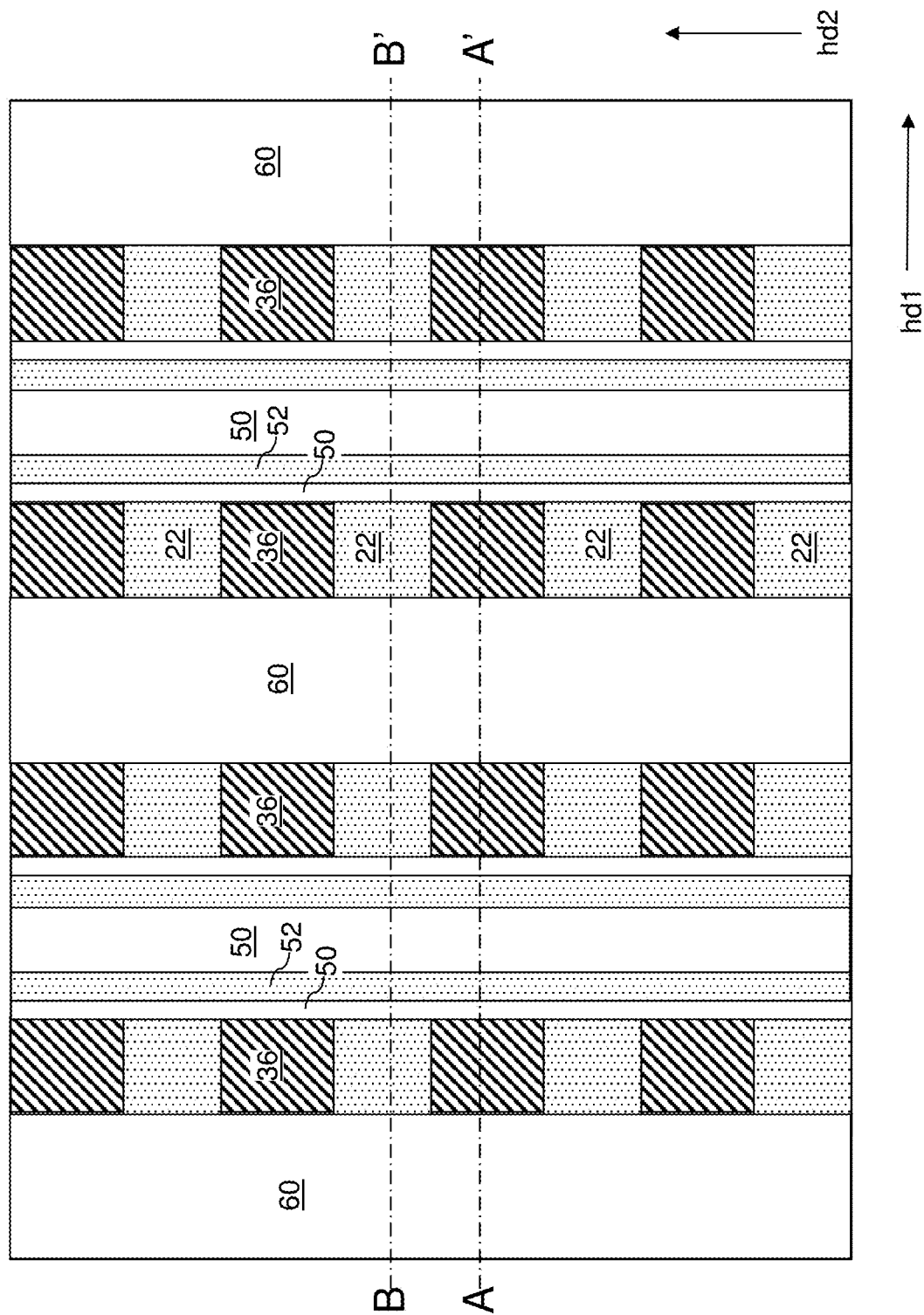
FIG. 8C is a top-down view of a first configuration of the first exemplary structure at the processing steps of FIGS. 8A and 8B. The plane A-A' corresponds to the plane of the vertical cross-section for FIG. 8A. The plane B-B' corresponds to the plane of the vertical cross-section for FIG. 8B.
Figure 8D:
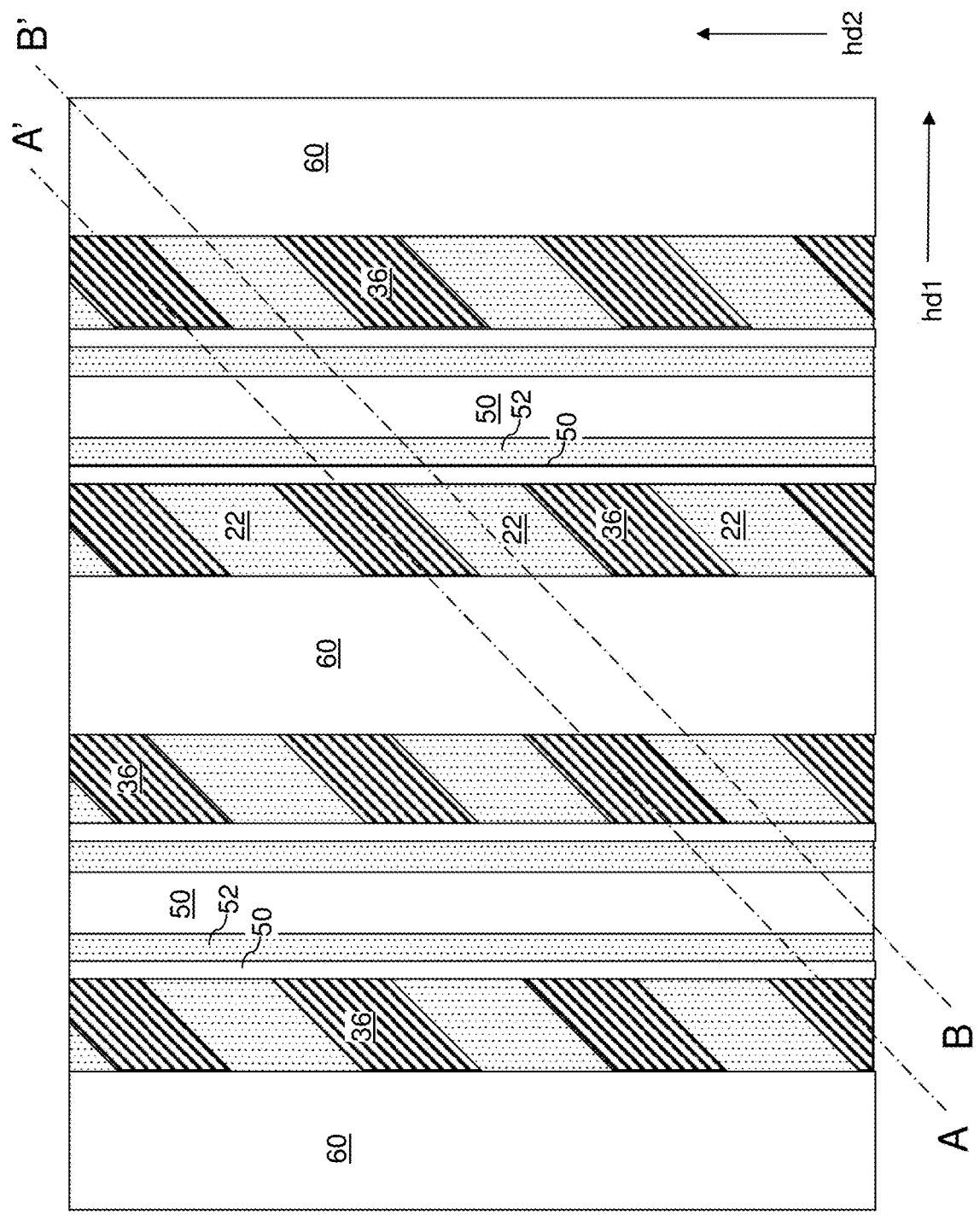
FIG. 8D is a top-down view of a second configuration of the first exemplary structure at the processing steps of FIGS. 8A and 8B. The plane A-A' corresponds to the plane of the vertical cross-section for FIG. 8A. The plane B-B' corresponds to the plane of the vertical cross-section for FIG. 8B.

Referring to FIGS. 8A-8D, a second gate dielectric is formed on each sidewall of the second line trenches 51. The second gate dielectrics are employed to store memory bits, and are herein referred to as control gate dielectrics (52, 50). FIG. 8C illustrates the first configuration of the first exemplary structure, and FIG. 8D illustrates the second configuration of the first exemplary structure.

In one embodiment, at least one second gate dielectric material layer can be formed by a respective conformal deposition process. The at least one second gate dielectric material layer can include a non-ferroelectric gate dielectric material layer and a continuous ferroelectric material layer. The non-ferroelectric gate dielectric material layer, if present, can include any non-ferroelectric gate dielectric material such as silicon oxide and/or a dielectric metal oxide. The thickness of the non-ferroelectric gate dielectric material layer can be in a range from 3 nm to 60 nm, such as from 6 nm to 30 nm, although lesser and greater thicknesses can also be employed.

The continuous ferroelectric material layer includes a ferroelectric material. As used herein, a "ferroelectric material" refers to a crystalline material that exhibits spontaneous electrical polarization in the absence of an external electric field. The ferroelectric material in the continuous ferroelectric material layer may be an insulating ferroelectric material. In one embodiment, the continuous ferroelectric material layer comprises an orthorhombic phase hafnium oxide layer including at least one dopant selected from Al, Zr, and/or Si. Other suitable ferroelectric materials may also be used, as such as titanate ferroelectric materials (e.g., barium titanate, lead titanate, lead zirconate titanate, lead lanthanum zirconate titanate ("PLZT"), etc.). The continuous ferroelectric material layer can have a thickness in a range from 3 nm to 60 nm, such as from 6 nm to 30 nm, although lesser and greater thicknesses can also be employed. In one embodiment, the continuous ferroelectric material layer can be deposited by a conformal deposition process such as chemical vapor deposition (CVD) or atomic layer deposition (ALD).

An anisotropic etch process, such as a sidewall spacer etch process, can be performed to remove horizontal portions of the continuous ferroelectric material layer. Each remaining portion of the gate dielectric layer 50 and the continuous ferroelectric material layer 52 constitutes a control gate dielectric (52, 50). A pair of ferroelectric material layers 52 can be formed within each second line trench 51. Each control gate dielectric (52, 50) comprises the pair of ferroelectric material layers 52 and a U-shaped gate dielectric layer 50, which is a remaining portion of the non-ferroelectric gate dielectric material layer.

The control gate dielectric (52, 50) can be formed on sidewalls of a pair of vertical semiconductor channels (33, 34) and on a top surface of a base portion 30B of a respective stepped semiconductor material structure (23, 33, 34, 36). Sidewalls of the U-shaped gate dielectric layers 50 that contact the second semiconductor channel portions 34 are herein referred to as proximal sidewalls, and sidewalls of the U-shaped gate dielectric layers 50 that do not contact the second semiconductor channel portions 34 are herein referred to as distal sidewalls. Each ferroelectric material layer 52 contacts a distal sidewall of the vertical portion of each U-shaped gate dielectric layer 50.

In on embodiment, each control gate dielectric (52, 50) can have a second U-shaped vertical cross-sectional profile, and can include a horizontal control gate dielectric portion, which is a horizontal portion of a U-shaped gate dielectric layer 50. The horizontal control gate dielectric portion can contact a portion of the top surface of the spacer material portion 23. A first vertical control gate dielectric portion of each control gate dielectric (52, 50) can contact the second semiconductor channel portions 34, and can be adjoined to a first edge of the horizontal control gate dielectric portion. A second vertical control gate dielectric portion of each control gate dielectric (52, 50) can be adjoined to a second edge of the horizontal control gate dielectric portion.

Figure 9C:
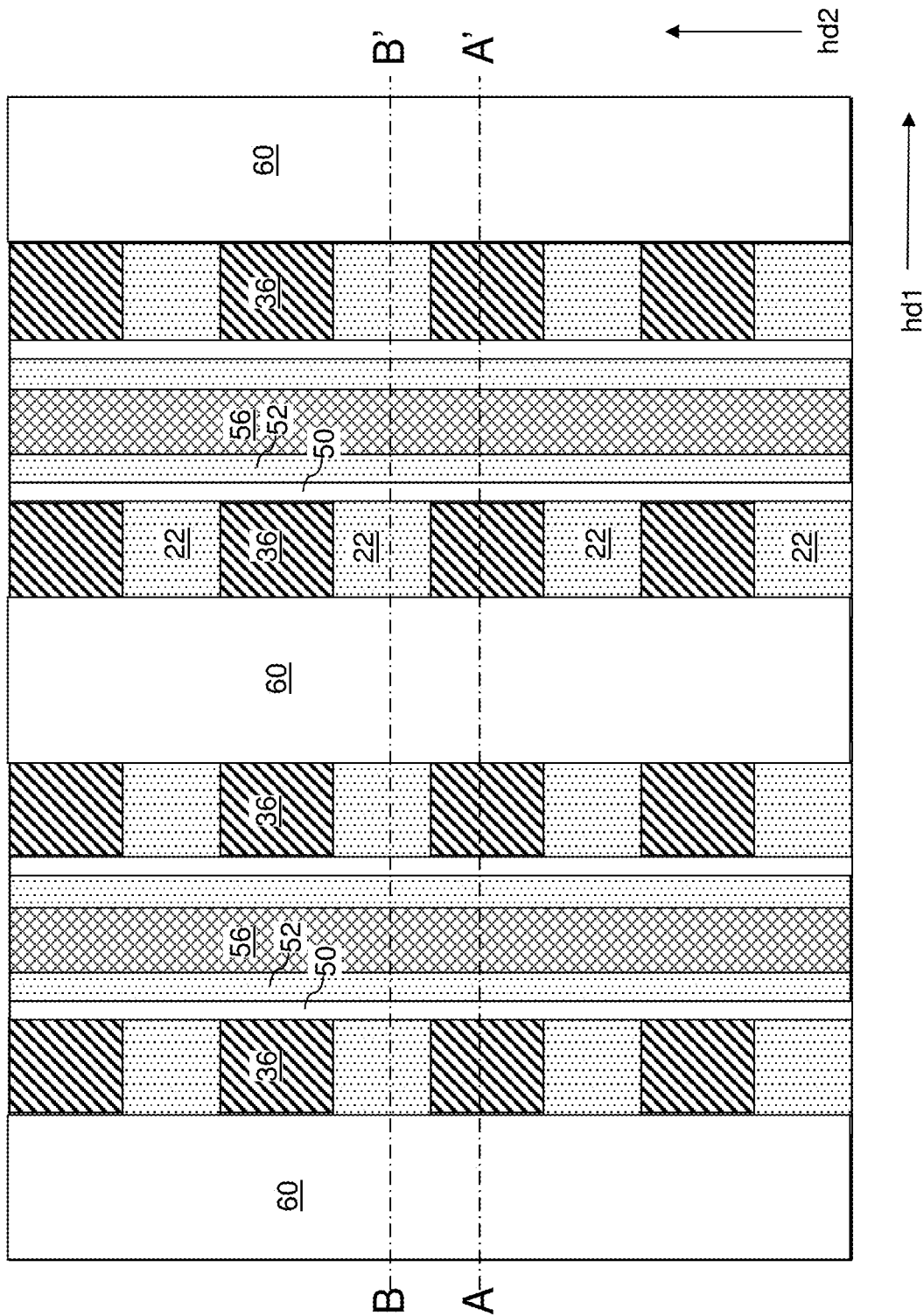
FIG. 9C is a top-down view of a first configuration of the first exemplary structure at the processing steps of FIGS. 9A and 9B. The plane A-A' corresponds to the plane of the vertical cross-section for FIG. 9A. The plane B-B' corresponds to the plane of the vertical cross-section for FIG. 9B.
Figure 9D:
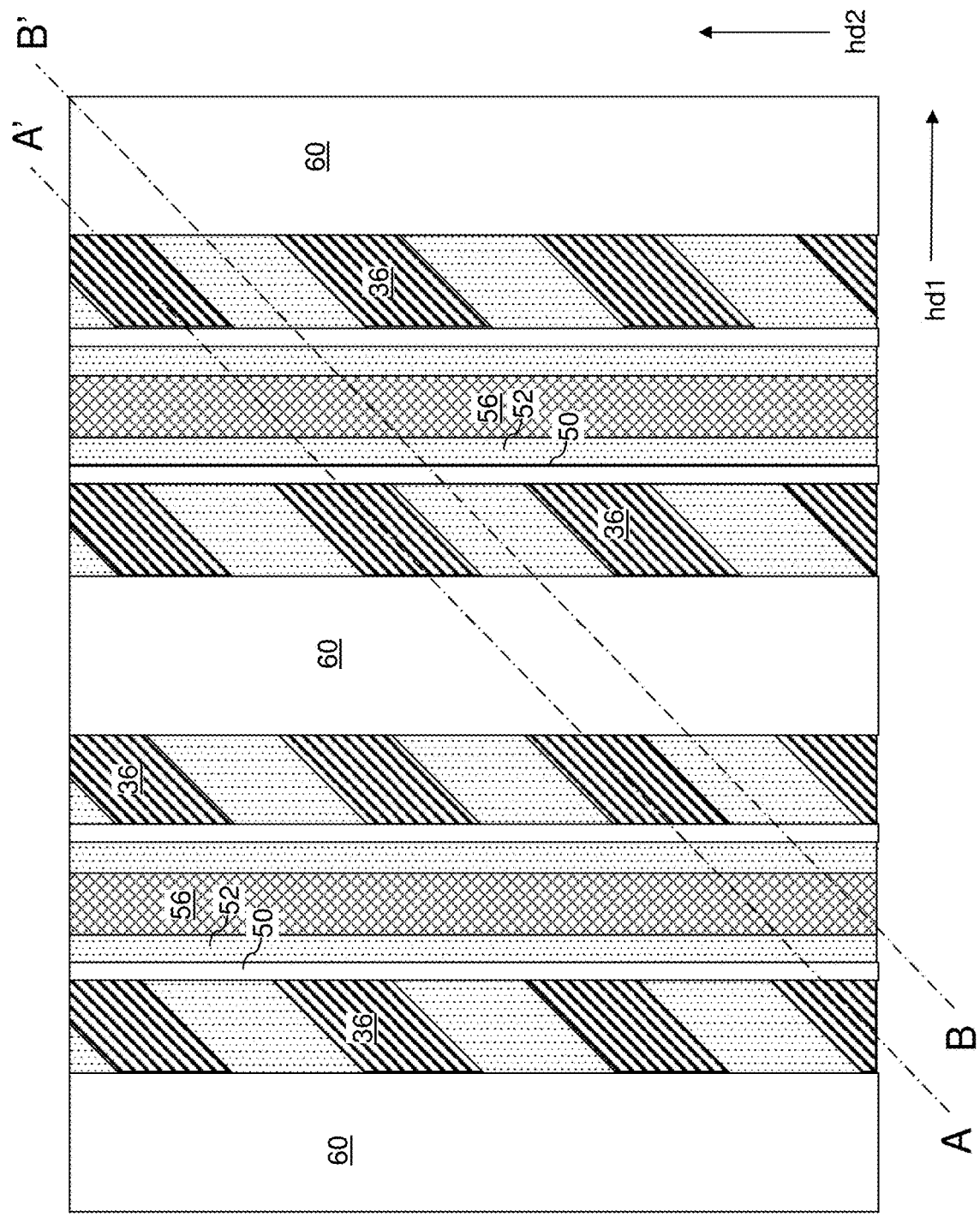
FIG. 9D is a top-down view of a second configuration of the first exemplary structure at the processing steps of FIGS. 9A and 9B. The plane A-A' corresponds to the plane of the vertical cross-section for FIG. 9A. The plane B-B' corresponds to the plane of the vertical cross-section for FIG. 9B.

Referring to FIGS. 9A-9D, a conductive gate electrode line can be formed within each second line trench 51 on a respective one of the control gate dielectrics (52, 50). The conductive gate electrode lines are herein referred to as word lines 56. In one embodiment, a portion of the word line in each ferroelectric memory transistor (as will be described below with respect to FIG. 11A) comprises a control gate electrode of the ferroelectric memory transistor. Alternatively separate control gate electrodes may be formed for the ferroelectric memory transistors and electrically connected to the respective word lines 56. FIG. 9C illustrates the first configuration of the first exemplary structure, and FIG. 9D illustrates the second configuration of the first exemplary structure.

A control gate electrode material can be deposited on the control gate dielectrics (52, 50). The control gate electrode material can include a heavily doped semiconductor material, an elemental metal, an intermetallic alloy, a metal silicide, and/or a conductive metallic compound including at least one metal and at least one non-metallic element (such as a metal nitride, e.g., TiN). Portions of the control gate electrode material that overlie the top surfaces of the drain regions 36 and the select gate cap dielectric rails 60 can be removed by a planarization process. The planarization process can employ a recess etch process and/or a chemical mechanical polishing process. Further, top surfaces of remaining portions of the control gate electrode material can be vertically recessed below the horizontal plane including the top surfaces of the drain regions 36 and the select gate cap dielectric rails 60 by a recess etch.

Each remaining portion of the control gate electrode material constitutes a word line 56. Each word line 56 can have a top surface located at, or above, the horizontal plane including the interfaces between the vertical semiconductor channels (33, 34) and the drain regions 36. Each word line 56 can contact a respective subset of the control gate dielectrics (52, 50) of a two-dimensional array of ferroelectric memory elements that is located within a second line trench 51.

Figure 10A:
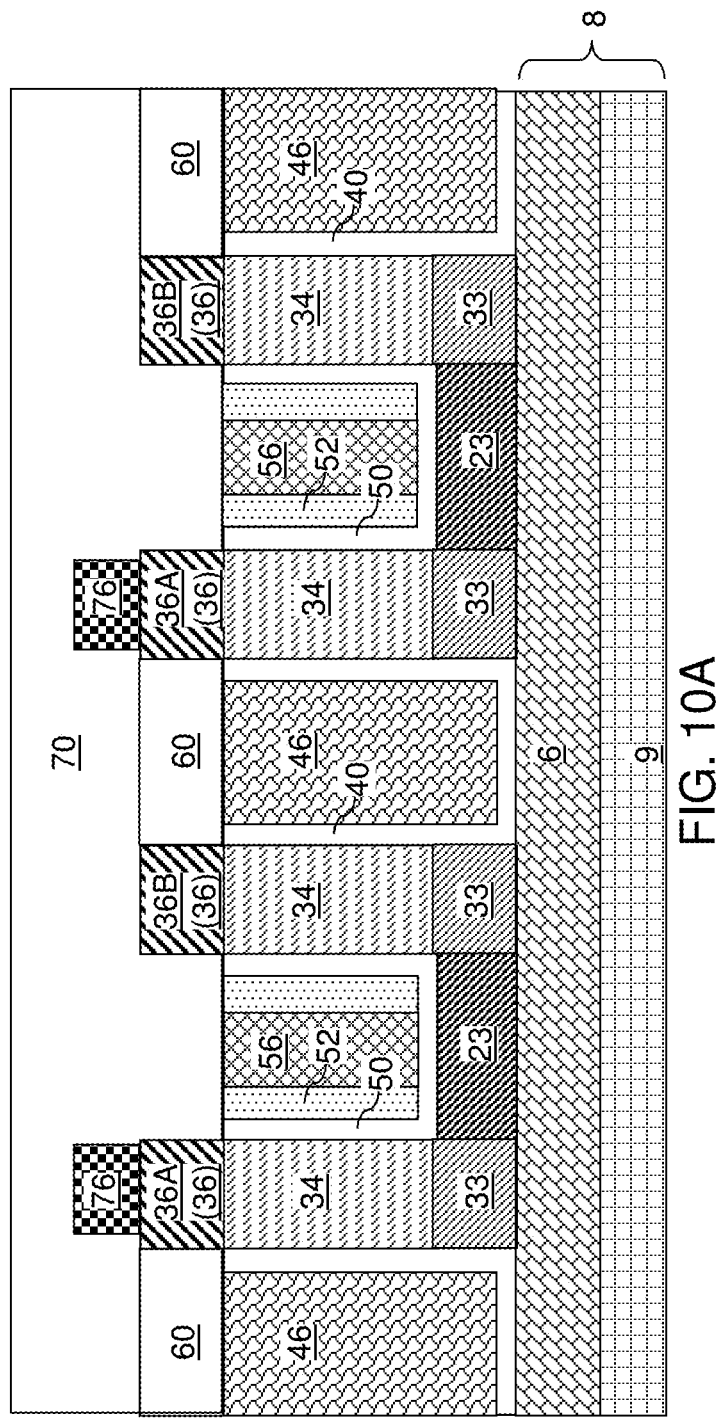
FIG. 10A is a first vertical cross-sectional view of the first exemplary structure after formation of first contact via structures and first bit lines according to an embodiment of the present disclosure.
Figure 10B:
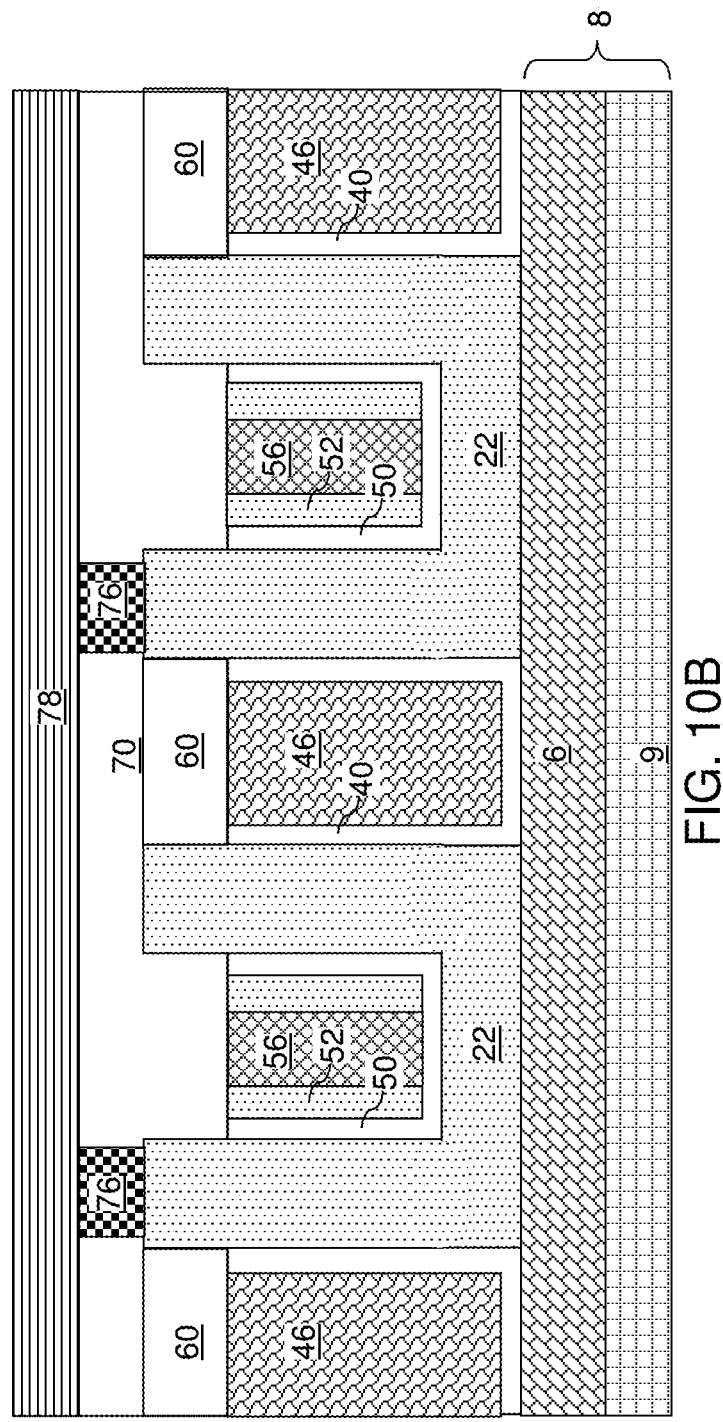
FIG. 10B is a second vertical cross-sectional view of the first exemplary structure at the processing steps of FIG. 10A.
Figure 10C:
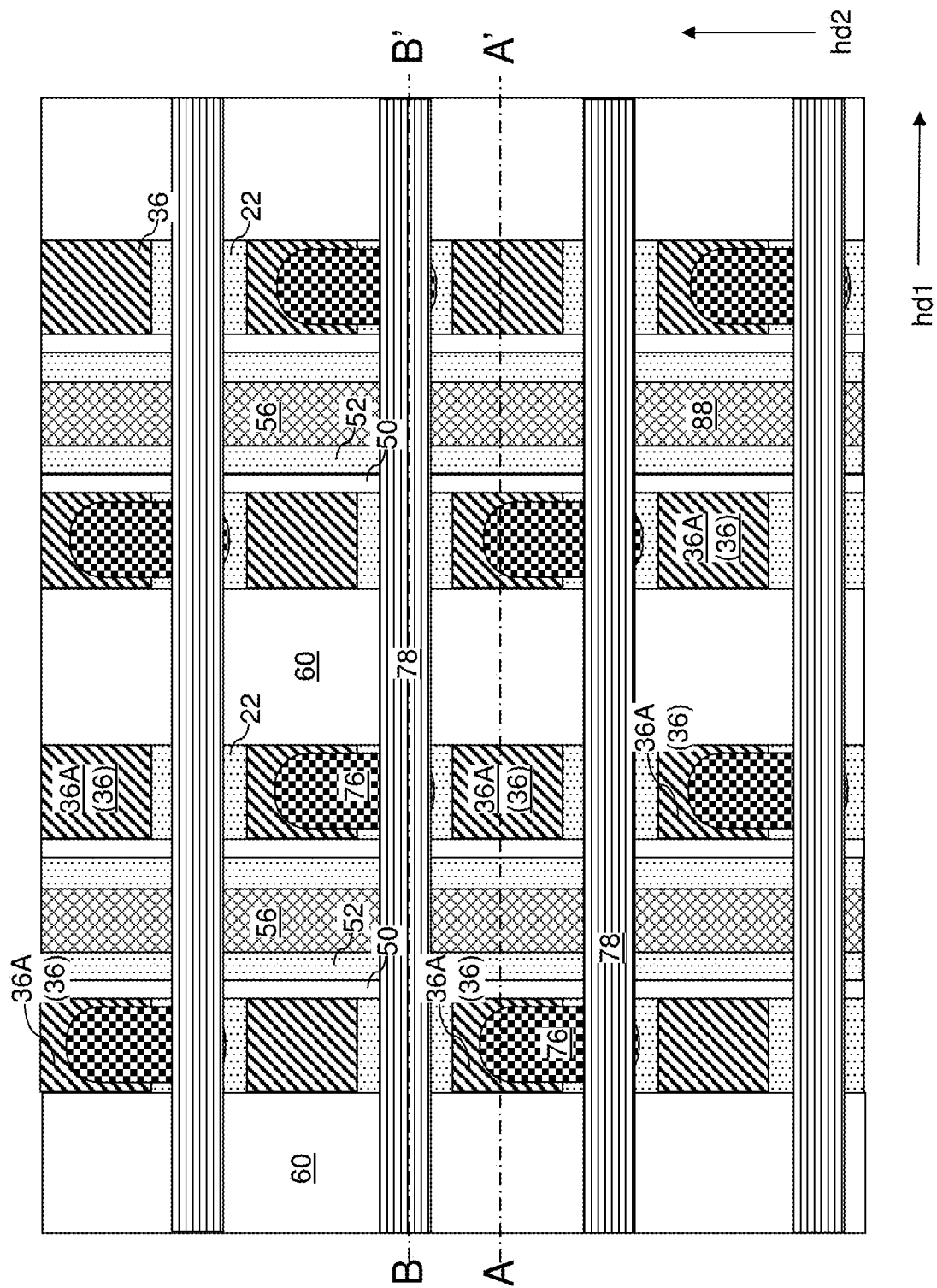
FIG. 10C is a top-down view of a first configuration of the first exemplary structure at the processing steps of FIGS. 10A and 10B. The plane A-A' corresponds to the plane of the vertical cross-section for FIG. 10A. The plane B-B' corresponds to the plane of the vertical cross-section for FIG. 10B.
Figure 10D:
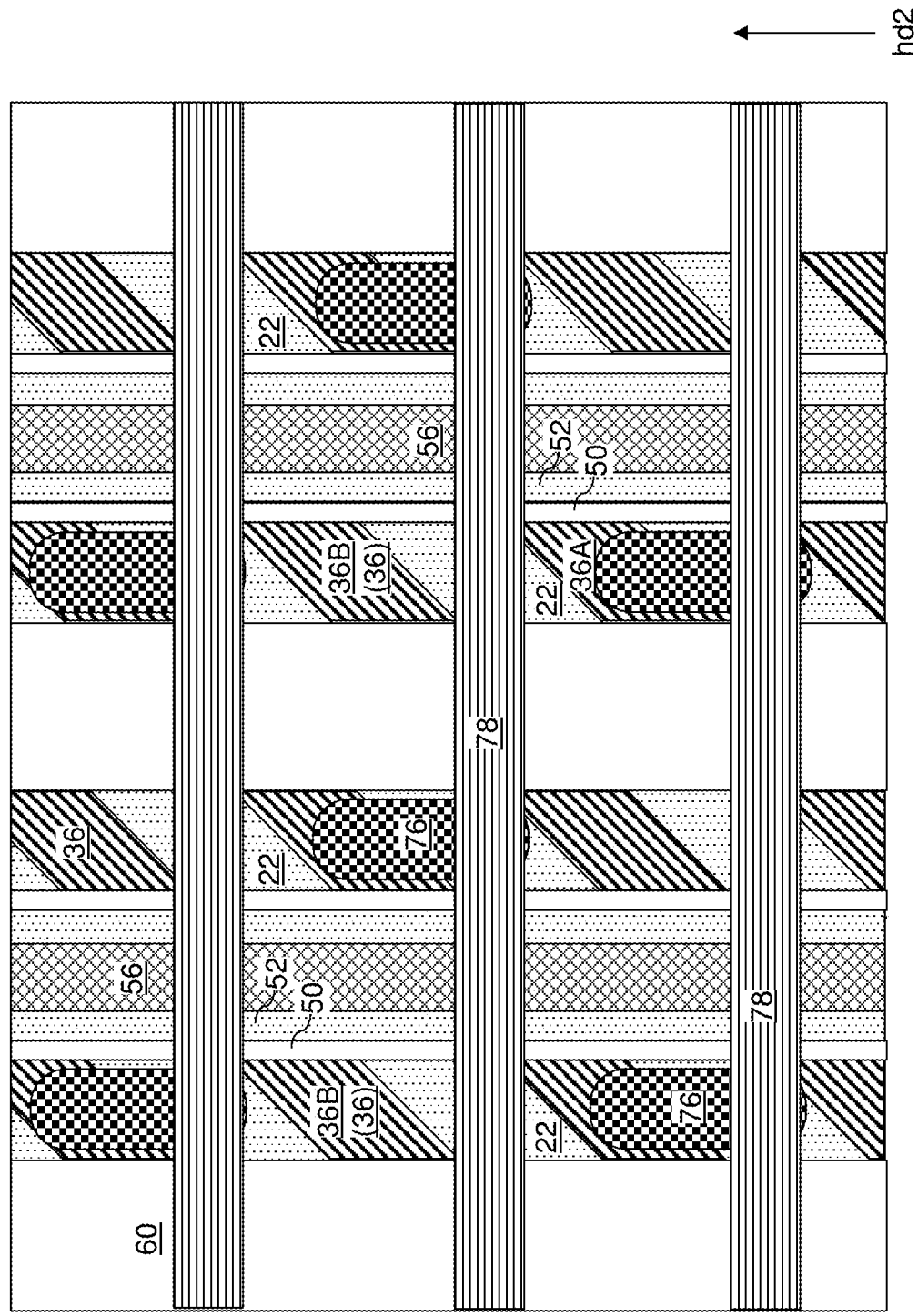
FIG. 10D is a top-down view of a second configuration of the first exemplary structure at the processing steps of FIGS. 10A and 10B.

Referring to FIGS. 10A-10D, a first contact-level dielectric layer 70 can be deposited over the drain regions 36, the select gate cap dielectric rails 60, and the dielectric isolation structures 22. FIG. 10C illustrates the first configuration of the first exemplary structure, and FIG. 10D illustrates the second configuration of the first exemplary structure. The first contact-level dielectric layer 70 is omitted in FIGS. 10C and 10D to illustrate underlying elements.

The first contact-level dielectric layer 70 includes an interlayer dielectric material such as undoped silicate glass, a doped silicate glass, or organosilicate glass. The first contact-level dielectric layer 70 may include a single dielectric material layer, or may include a plurality of dielectric material layers that are sequentially formed. The first contact-level dielectric layer 70 may be planarized to provide a planar top surface.

First contact via structures (e.g., first drain electrodes) 76 can be formed on a first subset of the drain regions 36, which is herein referred to as first drain regions 36A. In one embodiment, each stepped semiconductor material structures (23, 33, 34, 36) can include a first drain region 36A that is contacted by a first contact via structure 76 and a second drain region 36B that is not contacted by any first contact via structure 76.

First bit lines 78 laterally extending the along first horizontal direction hd1 can be formed by forming line trenches in an upper portion of the first contact-level dielectric layer 70, and by filling the line trenches with at least one conductive material such as a metallic material. The first bit lines 78 can be electrically connected to a respective subset of the drain regions 36 (each of which is a first drain region 36A) of the two-dimensional array of ferroelectric memory elements. The lengthwise directions of the select gate electrode lines 46 and the word lines 56 can be parallel to each other, and can be at a non-zero angle with respect to the first horizontal direction hd1. The non-zero angle may be 90 degrees as illustrated in FIG. 10C, or may be in a range from 15 degree and 75 degrees as illustrated in FIG. 10D.

Figure 11A:
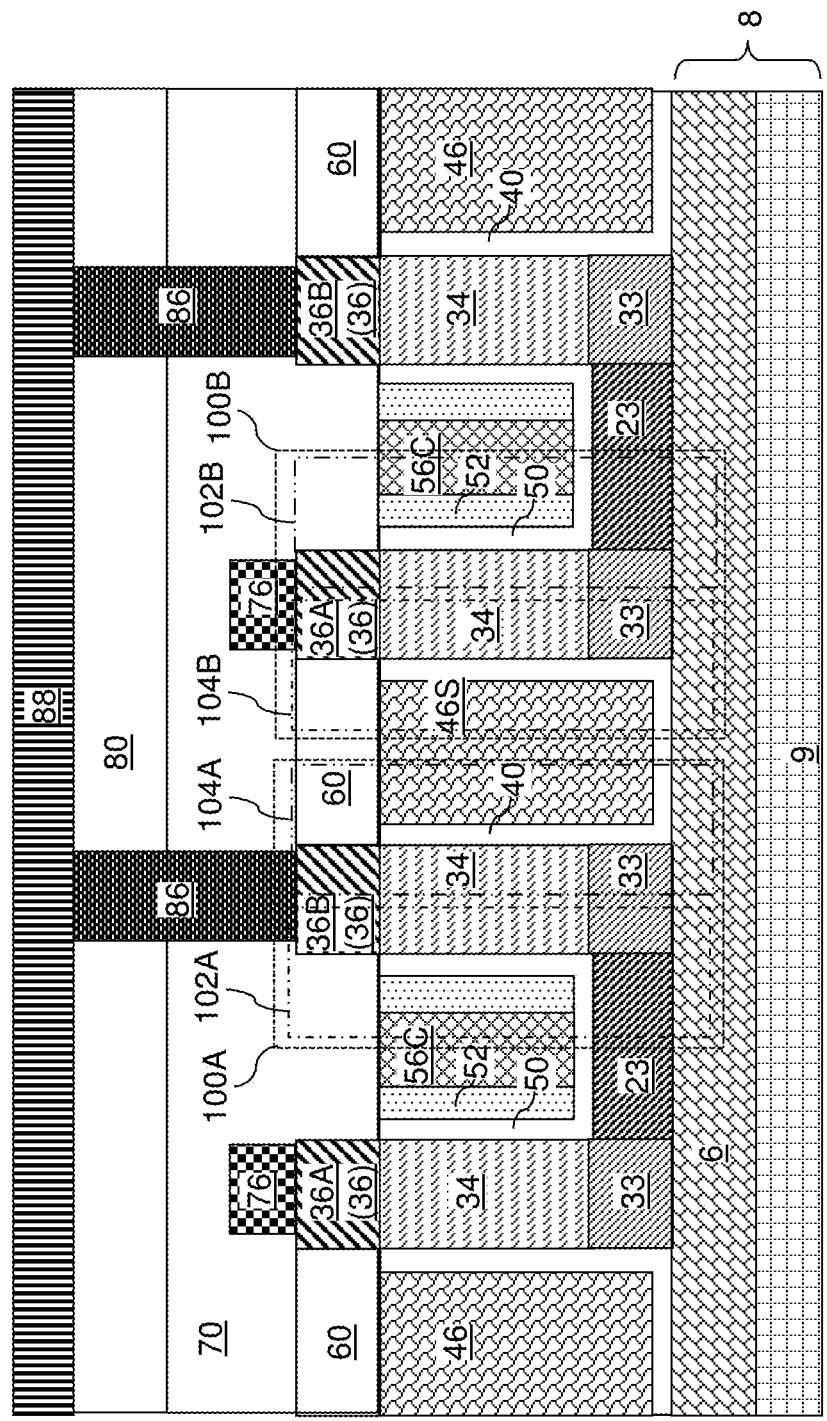
FIG. 11A is a first vertical cross-sectional view of the first exemplary structure after formation of second contact via structures and second bit lines according to a first embodiment of the present disclosure.
Figure 11C:
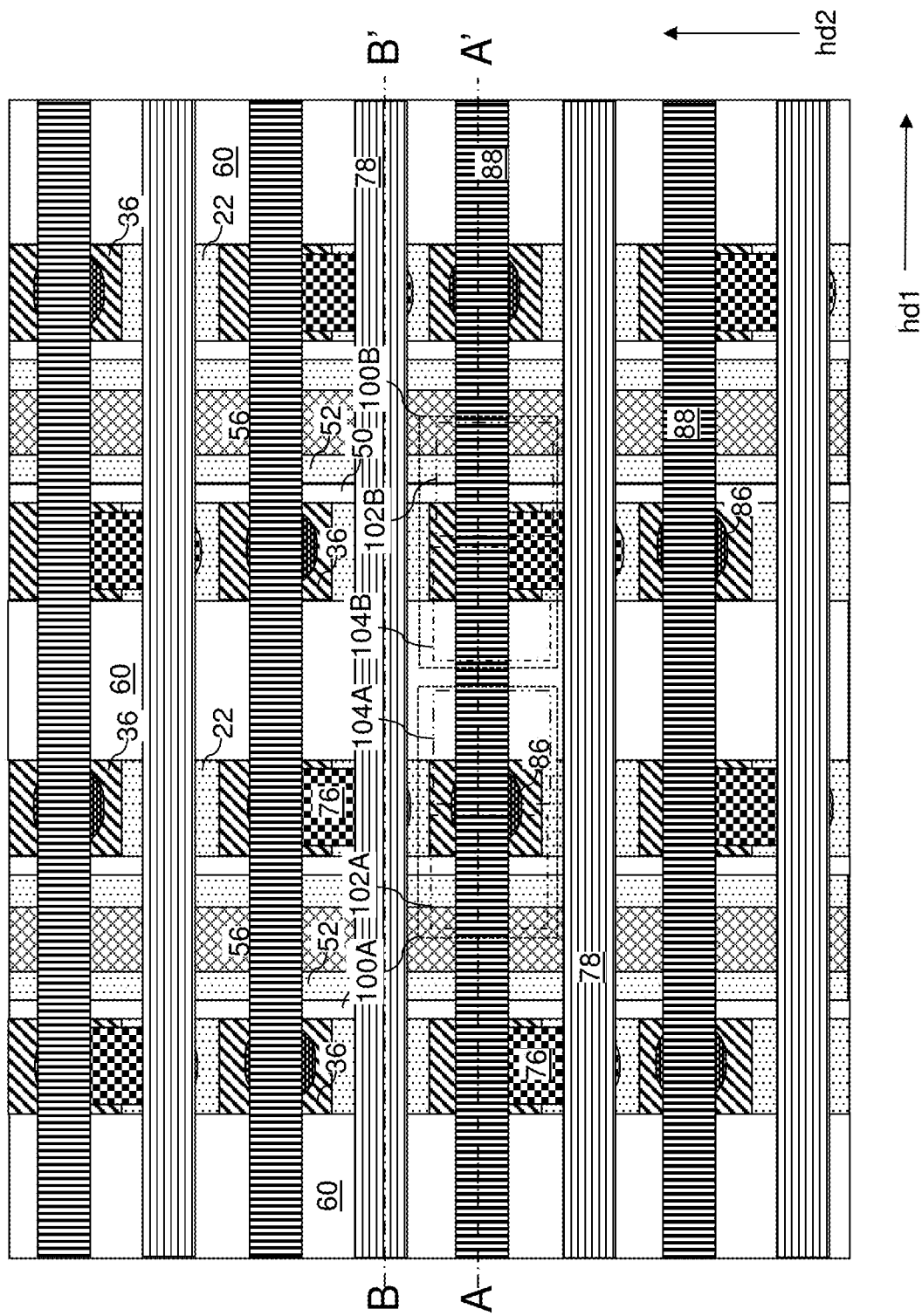
FIG. 11C is a top-down view of a first configuration of the first exemplary structure at the processing steps of FIGS. 11A and 11B. The plane A-A' corresponds to the plane of the vertical cross-section for FIG. 11A. The plane B-B' corresponds to the plane of the vertical cross-section for FIG. 11B.
Figure 11D:
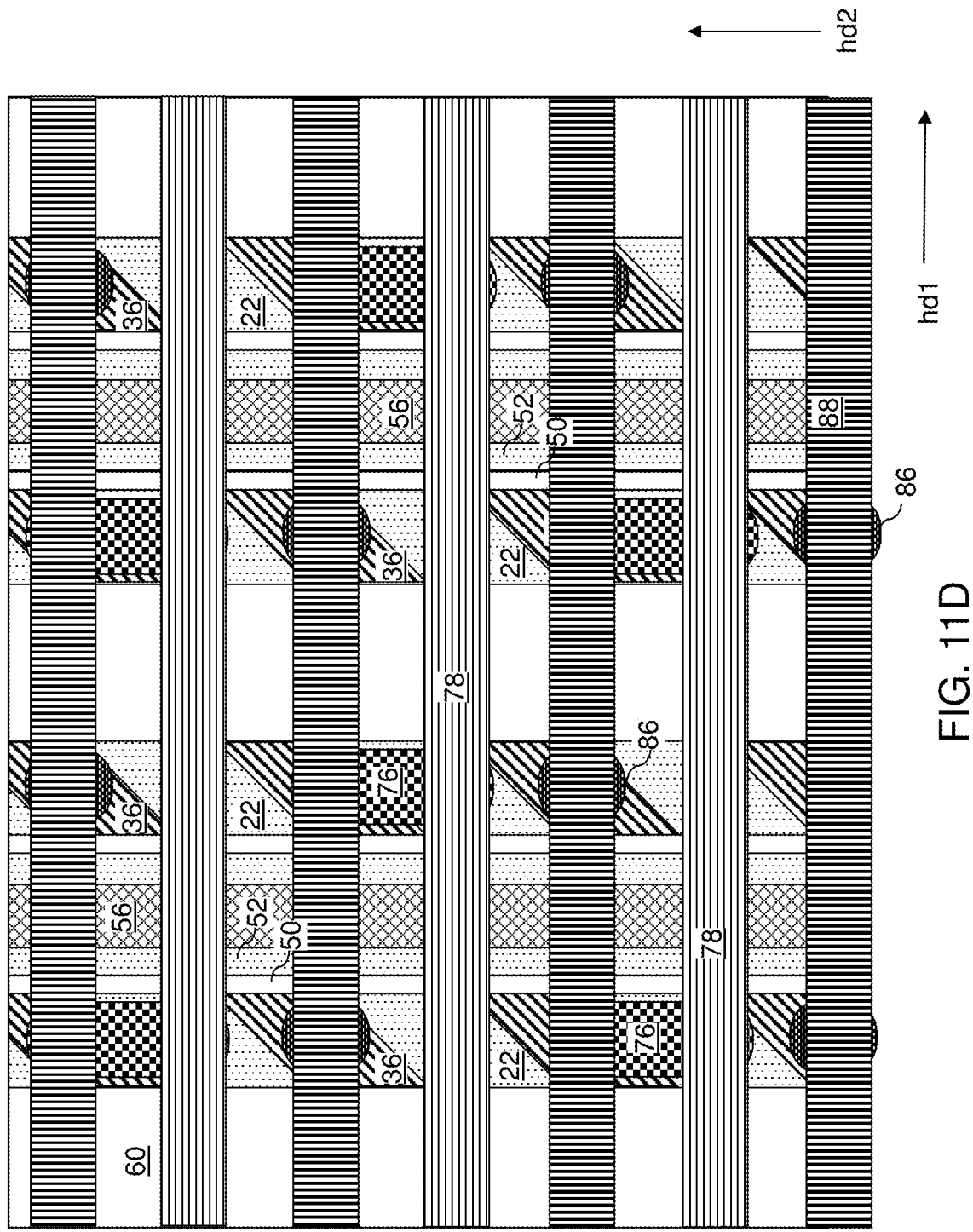
FIG. 11D is a top-down view of a second configuration of the first exemplary structure at the processing steps of FIGS. 11A and 11B.

Referring to FIGS. 11A-11D, a second contact-level dielectric layer 80 can be deposited over the first contact-level dielectric layer 70 and the first bit lines 78. FIG. 11C illustrates the first configuration of the first exemplary structure, and FIG. 11D illustrates the second configuration of the first exemplary structure. The second contact-level dielectric layer 80 is omitted in FIGS. 11C and 11D to illustrate underlying elements.

The second contact-level dielectric layer 80 includes an interlayer dielectric material such as undoped silicate glass, a doped silicate glass, or organosilicate glass. The second contact-level dielectric layer 80 may include a single dielectric material layer, or may include a plurality of dielectric material layers that are sequentially formed. The second contact-level dielectric layer 80 may be planarized to provide a planar top surface.

Second contact via structures (e.g., second drain electrodes) 86 can be formed on a second subset of the drain regions 36, which is herein referred to as second drain regions 36B. In one embodiment, each stepped semiconductor material structures (23, 33, 34, 36) can include a first drain region 36A that is contacted by a first contact via structure 76 and a second drain region 36B that is contacted by a second contact via structure 86.

Second bit lines 88 laterally extending the along first horizontal direction hd1 can be formed by forming line trenches in an upper portion of the second contact-level dielectric layer 80, and by filling the line trenches with at least one conductive material such as a metallic material. The second bit lines 88 can be electrically connected to a respective subset of the drain regions 36 (each of which is a second drain region 36B) of the two-dimensional array of ferroelectric memory elements.

While the above described method illustrated formation of the first line trenches 41 and the select gate electrode line 46 before formation of the second line trenches 51 and the word lines 56, the process steps may be performed in a different order. For example, the second line trenches 51 and the word lines 56 may be formed first, followed by forming the first line trenches 41 and the select gate electrode line 46.

As shown in FIGS. 11A and 11C, each memory cell 100 (e.g., 100A or 100B) includes a ferroelectric memory transistor 102 (e.g., 102A or 102B) and a select gate transistor 104 (e.g., 104A or 104B). The select gate transistor 104 may also be referred to as a pass gate transistor or access transistor.

In one embodiment, a portion of the select gate electrode line 46 located in the select gate transistor 104 functions as a select gate electrode 46S (i.e., a pass gate electrode or an access gate electrode) of the select gate transistor 104. A portion of the word line 56 located in the ferroelectric memory transistor 102 functions as a control gate electrode 56C of the ferroelectric memory transistor 102.

The ferroelectric memory transistor 102 and the select gate transistor 104 in the same memory cell 100 share the same vertical semiconductor channel (33, 34) and the same source region 6 and the same drain region 36. The ferroelectric memory transistor 102 includes the ferroelectric material layer 52 in addition to the gate dielectric layer 50 made of a non-ferroelectric material between the shared vertical semiconductor channel (33, 34) and the control gate electrode 56C. The select gate transistor 104 contains the gate dielectric layer 50 made of a non-ferroelectric material and excludes the ferroelectric material layer 52 between the shared vertical semiconductor channel (33, 34) and the select gate electrode 46S.

The select gate electrode 46S has a longer gate length (i.e., size in the vertical direction in FIG. 11A) than the control gate electrode 56C in the same memory cell 100. Thus, the select gate electrode 46S is located adjacent to the first semiconductor channel portion 33, while the control gate electrode 56C is not located adjacent to the first semiconductor channel portion 33. Therefore, the select gate electrode 46S controls access between the source region 6 and the common vertical semiconductor channel (33, 34) by activating and deactivating the first semiconductor channel portion 33, such as during a read operation. In contrast, the control gate electrode 56C cannot independently activate or deactivate the first semiconductor channel portion 33 to permit current to flow between the source region 6 and the vertical semiconductor channel (33, 34).

Each memory cell 100 (e.g., 100A or 100B) of the first exemplary structure illustrated in FIGS. 11A and 11C has a size $4F^2$, where F is a lithographic critical dimension, i.e., a minimum dimension that can be printed employing a single lithographic exposure process and a single lithographic development process.

Referring to FIGS. 12A-12D, a second exemplary structure according to an embodiment of the present disclosure can be derived from the first exemplary structure of FIGS. 11A-11D by omitting formation of the first contact via structures 76 and the first bit lines 78. In this case, the first drain regions 36A (which are a first subset of the drain regions 36) are not contacted by any contact via structure, and the second drain regions 36B (which are a second subset of the drain regions 36) are contacted by a respective one of the second contact via structures 86, which are also referred to as drain contact via structures 86 in this embodiment.

Figure 12A:
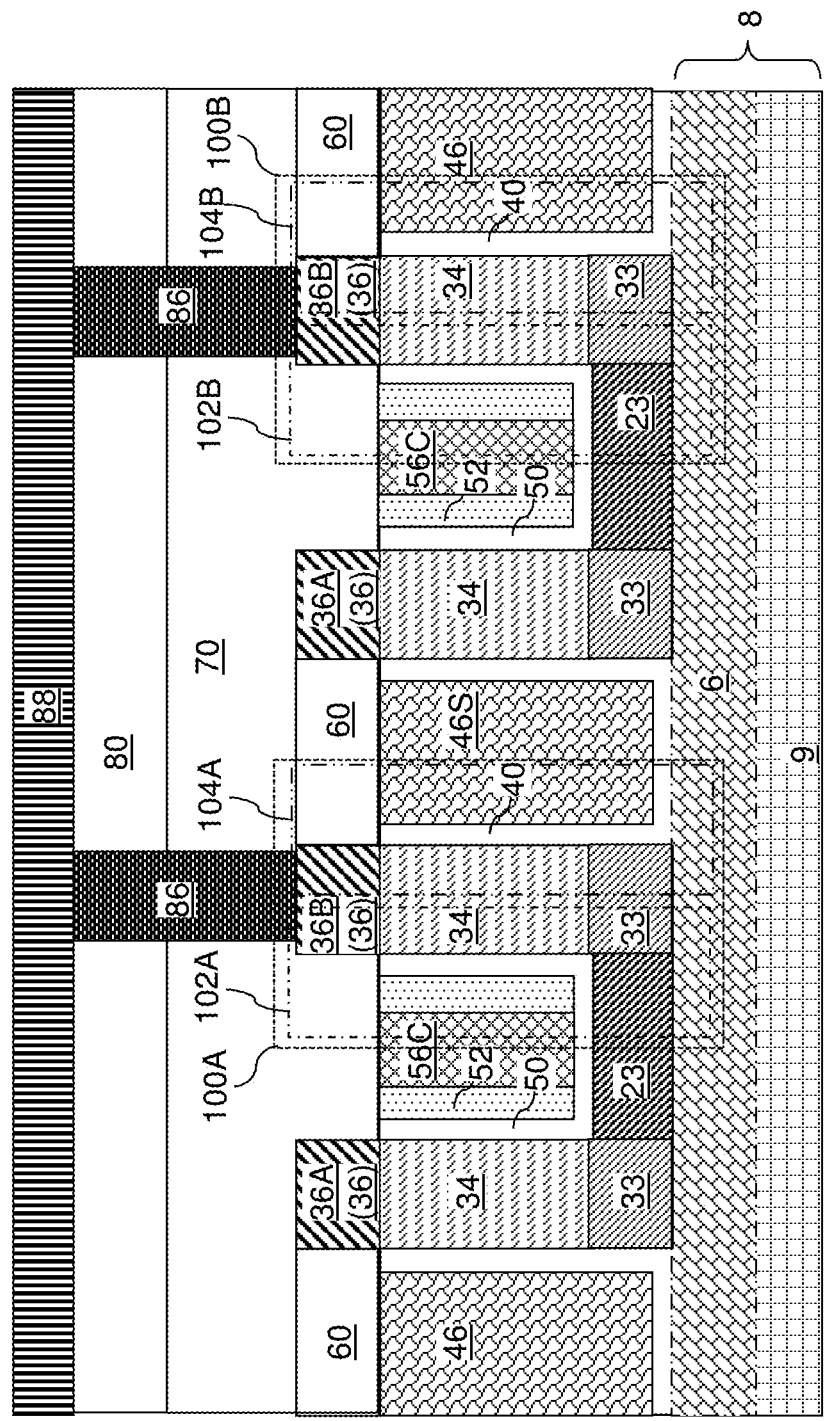
FIG. 12A is a first vertical cross-sectional view of a second exemplary structure after formation of second contact via structures and second bit lines according to a second embodiment of the present disclosure.
Figure 12B:
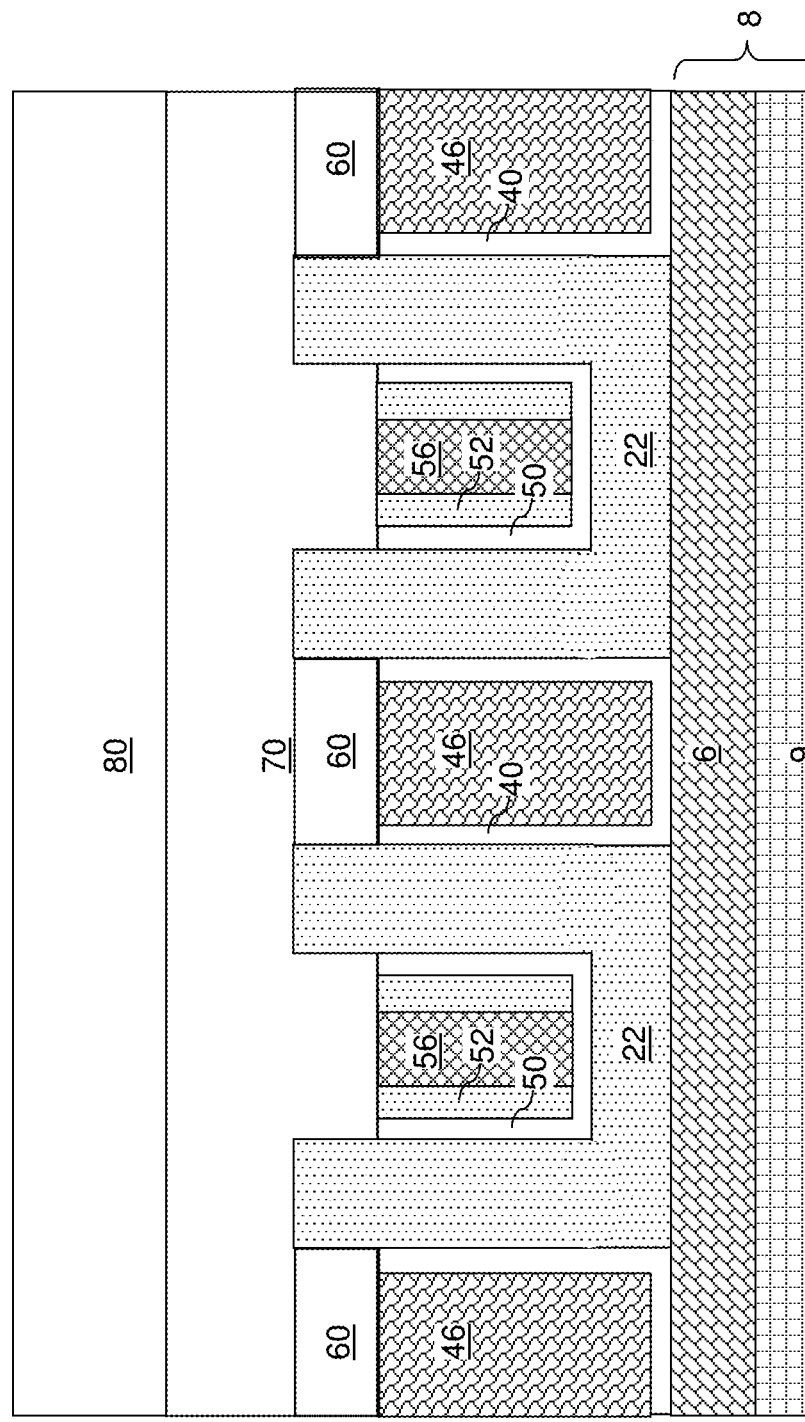
FIG. 12B is a second vertical cross-sectional view of the second exemplary structure at the processing steps of FIG. 12A.
Figure 12C:
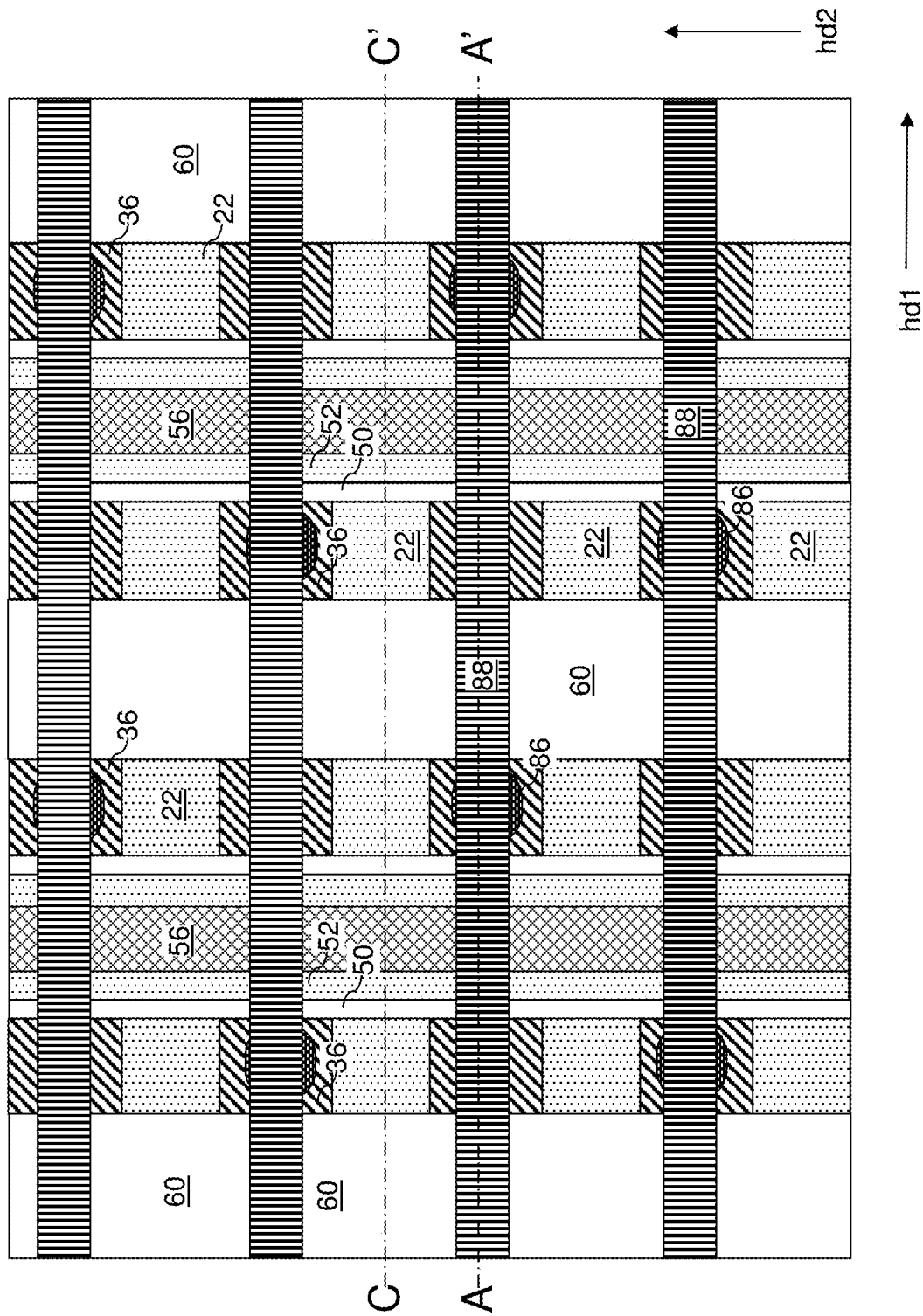
FIG. 12C is a top-down view of a first configuration of the second exemplary structure at the processing steps of FIGS. 12A and 12B. The plane A-A' corresponds to the plane of the vertical cross-section for FIG. 12A. The plane B-B' corresponds to the plane of the vertical cross-section for FIG. 12B.
Figure 12D:
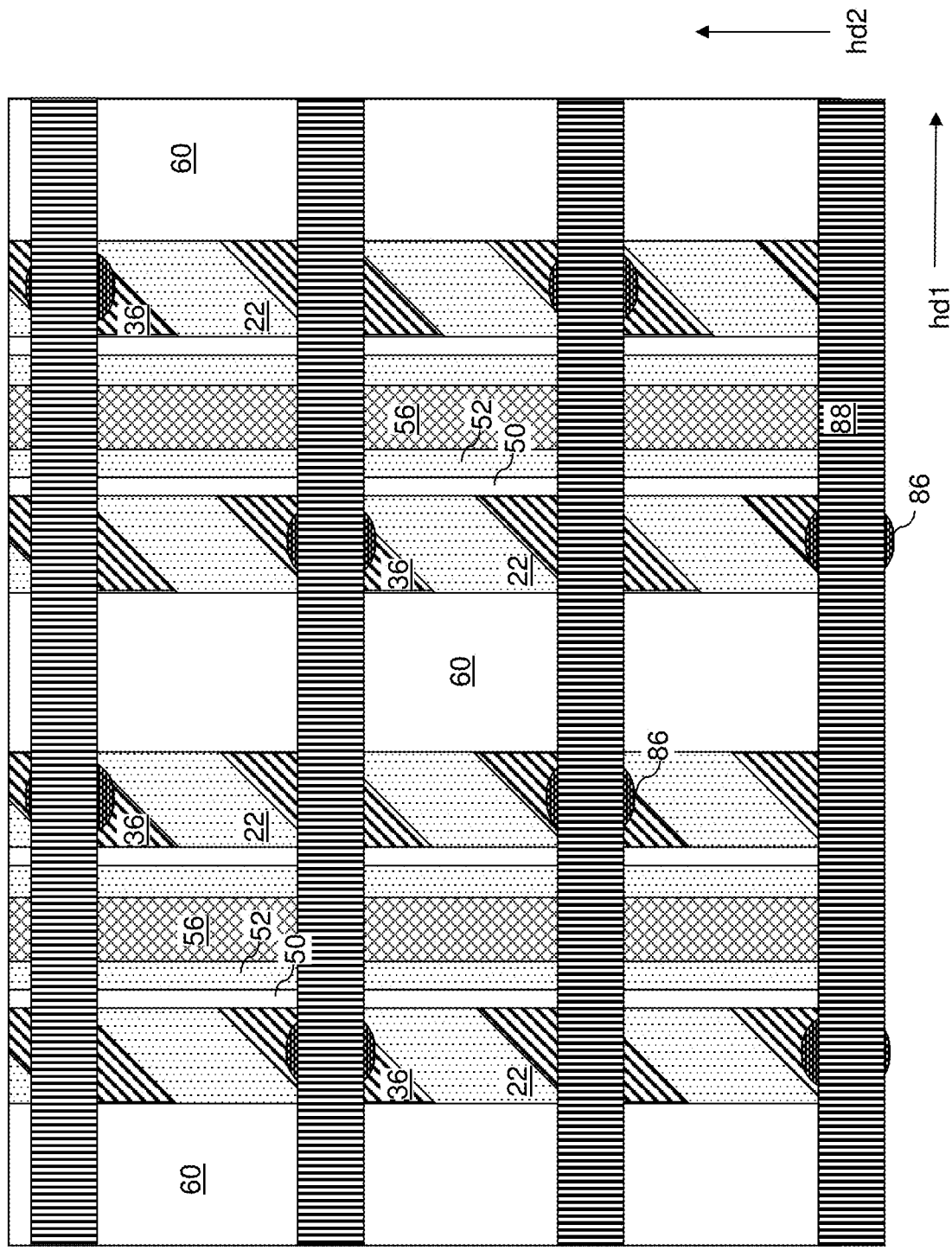
FIG. 12D is a top-down view of a second configuration of the second exemplary structure at the processing steps of FIGS. 12A and 12B.

Each memory cell 100 (e.g., 100A or 100B) of the second exemplary structure of FIG. 12A has a size $8F^2$, where F is a lithographic critical dimension, i.e., a minimum dimension that can be printed employing a single lithographic exposure process and a single lithographic development process.

Figure 13A:
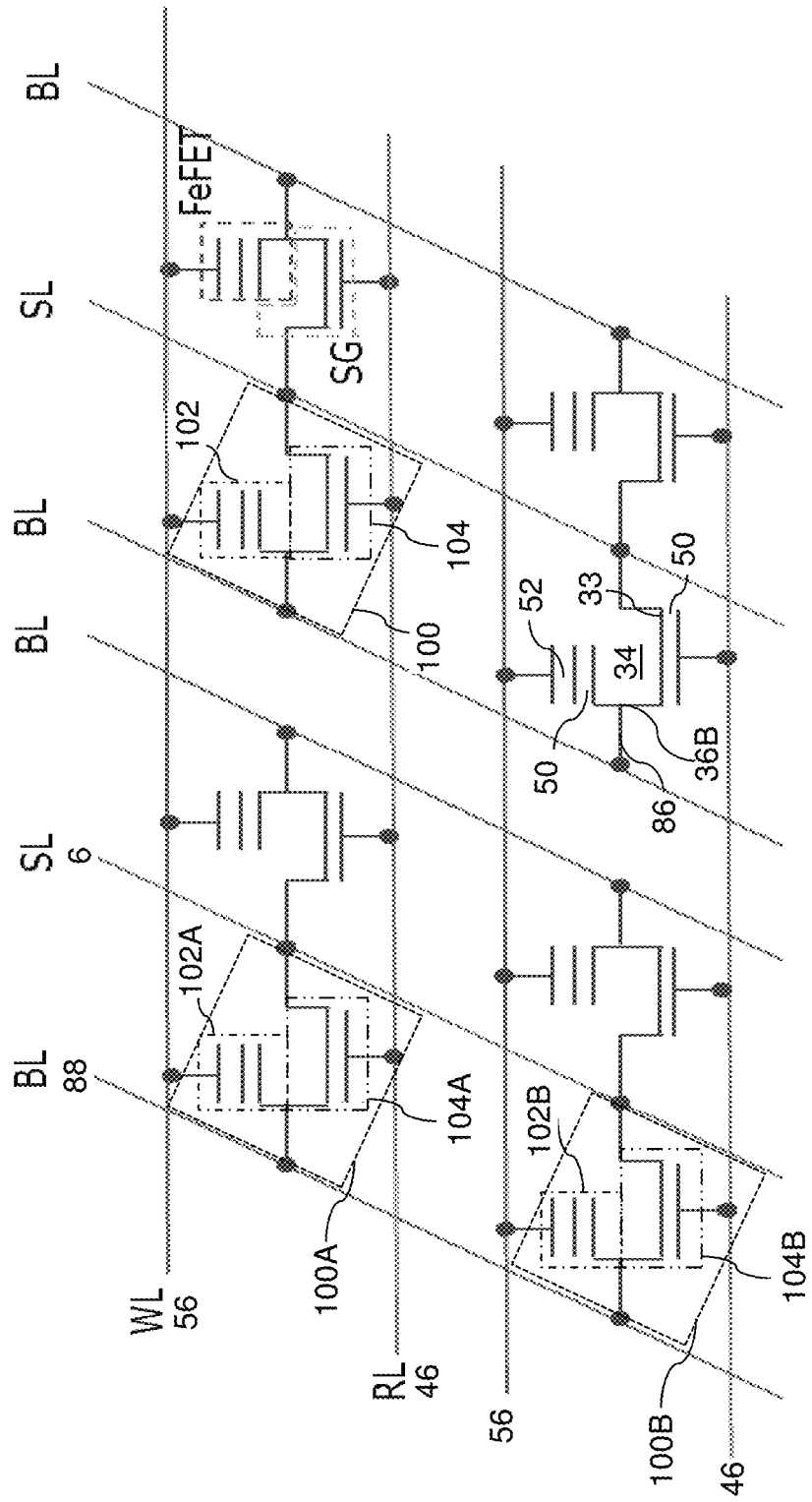
FIGS. 13A and 13B are circuit diagrams of the respective second and first exemplary structures of the second and first embodiments of the present disclosure.
Figure 13B:
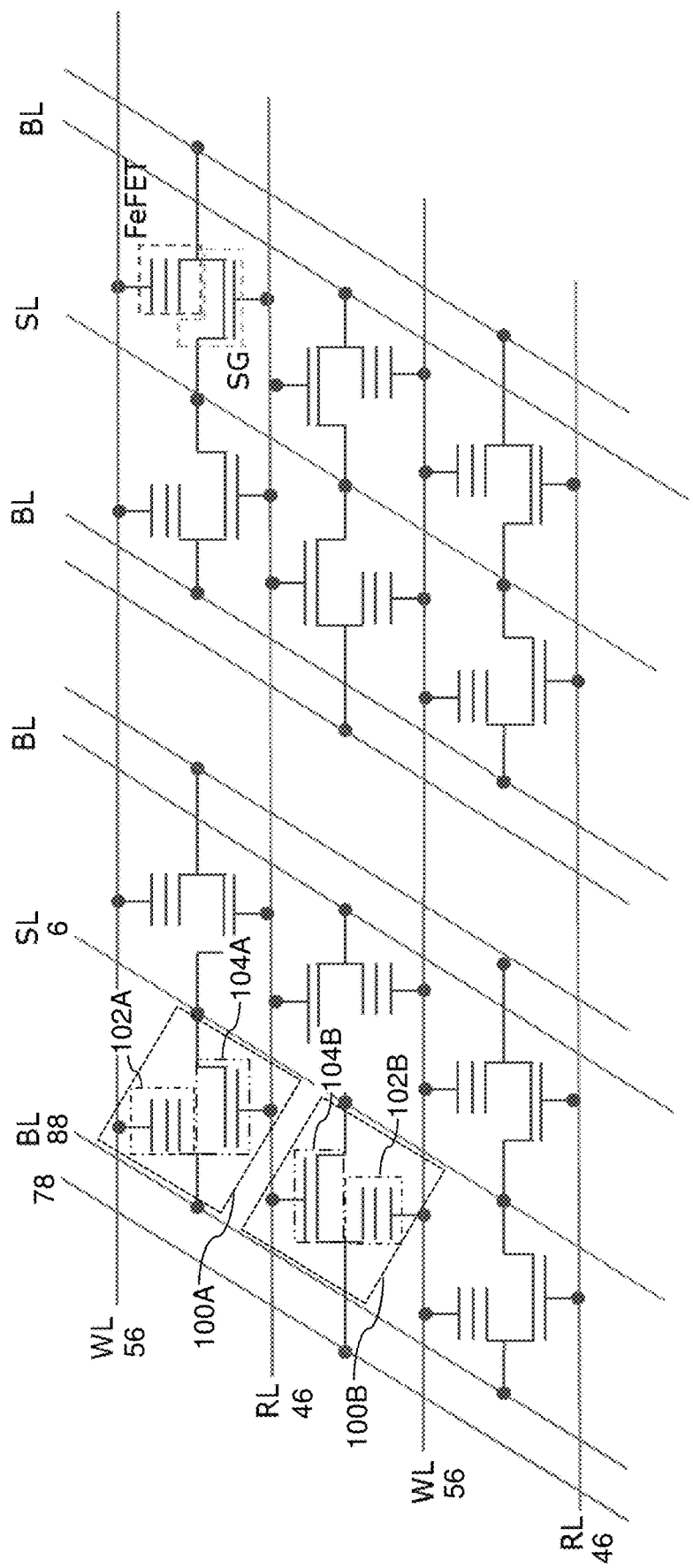

FIG. 13A illustrates a circuit schematic for a two-dimensional array of ferroelectric memory elements containing the second exemplary structure shown in FIGS. 12A-12D. FIG. 13B illustrates a circuit schematic for a two-dimensional array of ferroelectric memory elements containing the first exemplary structure shown in FIGS. 11A-11D. Each ferroelectric memory element (e.g., memory cell 100) includes a parallel connection of two field effect transistors. The source region 6 of the two-dimensional array of ferroelectric memory elements may comprise a continuous doped semiconductor material layer having a doping of the second conductivity type, and functions as the source lines SL in the circuit schematic. The bit lines 88 function as the bit lines BL of the circuit schematic. Each vertical stack of a first semiconductor channel portion 33 and a second semiconductor channel portion 34 functions as a channel (33, 34) of the select gate transistor 104 (e.g., 104A or 104B), which is labeled as "SG" in the circuit diagram. Each select gate electrode line 46 of the two-dimensional array of ferroelectric memory elements corresponds to the read line RL of the circuit schematic. Each second semiconductor channel portion 34 functions as a channel of a ferroelectric memory transistor (i.e., ferroelectric memory field effect transistor) 102 (e.g., 102A or 102B) which is labeled as "FeFET" in the circuit diagram. Each word line 56 of the two-dimensional array of ferroelectric memory elements corresponds to the word line WL of the circuit schematic, and its portions in each ferroelectric memory transistor 102 (e.g., 102A or 102B) correspond to the control gate electrode 56C of the ferroelectric memory transistor.

In each memory cell 100 (e.g., 100A or 100B), a pair of the select gate transistor 104 and the ferroelectric memory transistor 102 share a common vertical semiconductor channel (e.g., at least the second semiconductor channel portion 34). Deactivation of the select gate transistor 104 by application of a turn-off gate bias voltage to the select gate electrode line 46 deactivates the ferroelectric memory transistor 102 in the same memory cell because electrical current cannot pass through the first semiconductor channel portion 33 that underlies the second semiconductor channel portion 34 of the common vertical semiconductor channel (33, 34). The ferroelectric polarization of the ferroelectric material layer 52 of the ferroelectric memory transistor 102 can be read only when the turn-on gate bias voltage applied to the select gate electrode line 46 of the select gate transistor 104 electrically connects the common vertical semiconductor channel to the source region 6, and thus enables the read current to flow between the source region and the shared the second semiconductor channel portion 34 of the ferroelectric memory transistor 102. The turn-on gate bias voltage for the select gate electrode line 46 is selected such that the polarization state of the ferroelectric material layer 52 determines the amount of the electrical current that flows through the vertical semiconductor channel (33, 34) in conjunction with a word line bias voltage applied to the word line 56 of the ferroelectric memory transistor 102. A low leakage current and a reduced write, erase and/or read distrub may be obtained in a two-dimensional array of ferroelectric memory elements by turning off unselected ferroelectric memory transistors 102 by applying a turn-off gate bias voltage to all select gate electrode lines 46 that are not selected.

FIGS. 14A and 14B are tables illustrating exemplary voltages that may be used to operate the circuit of FIG. 13A. FIG. 14A illustrates the exemplary voltages that may be used to operate a single level cell 100 in a negative voltage channel potential control scheme (columns 2, 3 and 4) and in a positive voltage channel potential control scheme (columns 5, 6 and 7). FIG. 14B illustrates the exemplary voltages that are used to operate a multi-level cell 100 in a negative voltage channel potential control scheme (columns 2, 3 and 4) and in a positive voltage channel potential control scheme (columns 5, 6 and 7). The voltages shown are exemplary and other suitable voltages may be used for different device dimensions and materials.

As shown in columns 2, 3 and 4 these tables, for the negative voltage channel potential control scheme, the selected word line 56 (i.e., the word line of the selected memory cell) is set to a high negative voltage for write/inhibit, to a high positive voltage for erase/inhibit and to 0V or a low positive/negative voltage for read/inhibit. The unselected word lines 56 are set to a lower negative voltage for write/inhibit, a lower positive voltage for erase/inhibit, and to 0V for read/inhibit. The selected read lines RL (i.e., select gate electrode line 46 of the selected memory cell) is set to 0V for write and erase and to $V_{dd}$ and 0V for read/inhibit, respectively. Thus, the select gate transistor 104 bottom portion (i.e., the first semiconductor channel portion 33) is off during write, erase and read inhibit, and on during read. The bit lines BL (88) are set to 0V/low negative voltage for write/inhibit, to 0V/low positive voltage for erase/inhibit, and to $V_{dd}$ for read/inhibit. The source line SL (6) is set to 0V for write, erase and read. The operating units are per page of the device.

As shown in columns 5, 6 and 7 these tables, for the positive voltage channel potential control scheme, the selected word line 56 (i.e., the word line of the selected memory cell) is set to a high positive voltage for write/inhibit, to 0V for erase/inhibit and to 0V or a low positive/negative voltage for read/inhibit. The unselected word lines 56 are set to a lower positive voltage for write/inhibit, a lower positive voltage for erase/inhibit, and to 0V for read/inhibit. The selected read lines RL (i.e., select gate electrode line 46 of the selected memory cell) is set to 0V for write and erase and to $V_{dd}$ and 0V for read/inhibit, respectively. Thus, the select gate transistor 104 bottom portion (i.e., the first semiconductor channel portion 33) is off during write, erase and read inhibit, and on during read. The bit lines BL (88) are set to 0V/low positive voltage for write/inhibit, to a high positive voltage/0V for erase/inhibit, and to $V_{dd}$ for read/inhibit. The source line SL (6) is set to 0V/low positive voltage for write/inhibit, to high positive voltage/0V for erase/inhibit and to 0V read/inhibit. The operating units are per page of the device.

Referring to all drawings and according to various embodiments of the present disclosure, a memory cell 100 includes a ferroelectric memory transistor 102, and a select gate transistor 104 which shares a common semiconductor channel (33, 34), a common source region 6 and a common drain region 36 with the ferroelectric memory transistor 102. The select gate transistor 104 controls access between the common source region 6 and the common semiconductor channel (33, 34).

In one embodiment, the common semiconductor channel (33, 34) comprises a vertical semiconductor channel comprising a vertical stack of a first semiconductor channel portion 33 that is located on the common source region 6 and a second semiconductor channel portion 34 that overlies the first semiconductor channel portion 33. The ferroelectric memory transistor 102 comprises a control gate electrode 56C and a control gate dielectric (50, 52) comprising a ferroelectric material layer 52 located between the vertical semiconductor channel (33, 34) and the control gate electrode 56C. The select gate transistor 104 comprises a select gate electrode 46S and a select gate dielectric 40 located between the select gate electrode 46S and the vertical semiconductor channel (33, 34).

In one embodiment, the control gate dielectric (50, 52) further comprises a gate dielectric layer 50 made of a non-ferroelectric material. The select gate dielectric 40 is made of a non-ferroelectric material and preferably excludes a ferroelectric material. The select gate electrode 46S has a longer gate length than the control gate electrode 56C in a direction between the common source region 6 and the common drain region 36. The select gate electrode 46S is located adjacent to the first semiconductor channel portion 33, while the control gate electrode 56C is not located adjacent to the first semiconductor channel portion 33. The select gate electrode 46S controls access between the common source region 6 and the vertical semiconductor channel (33, 34) by activating and deactivating the first semiconductor channel portion 33.

In one embodiment, the select gate dielectric 40 is located on a first side of the vertical semiconductor channel (33, 34) and contacts a top surface of the common source region 6. The control gate dielectric (50, 52) is located on a second side of the vertical semiconductor channel (33, 34) and is spaced from the top surface of the common source region by a spacer material portion 23. The common drain region 36 is located on a top end of the vertical semiconductor channel (33, 34).

In one embodiment, the source region 6 comprises a first single crystalline semiconductor material portion. The first semiconductor channel portion 33 comprises a second single crystalline semiconductor material portion in epitaxial alignment with the first single crystalline semiconductor material portion. The second semiconductor channel portion 34 comprises a third single crystalline semiconductor material portion in epitaxial alignment with the second single crystalline semiconductor material portion.

In one embodiment, the first semiconductor channel portion 33 comprises electrical dopants of a first conductivity type at a first atomic concentration; and the second semiconductor channel portion 34 comprises electrical dopants of the first conductivity type at a second atomic concentration that is less than the first atomic concentration.

In one embodiment, the spacer material portion 23 comprises an additional single crystalline semiconductor material portion in epitaxial alignment with the first single crystalline semiconductor material portion and the second single crystalline semiconductor material portion and includes dopants of the first conductivity type at a third atomic concentration that is greater than the second d atomic concentration.

In one embodiment, the spacer material portion 23 comprises a semiconductor material doped with oxygen atoms and/or nitrogen atoms at an atomic concentration greater than the first atomic concentration. For example, spacer material portion 23 may comprise silicon oxide, silicon nitride or silicon oxynitride.

In one embodiment, the source region 6 comprises electrical dopants of a second conductivity type that is the opposite of the first conductivity type at an atomic concentration greater than the first atomic concentration. The drain region 36 comprises electrical dopants of the second conductivity type at an atomic concentration greater than the first atomic concentration.

In one embodiment, the control gate dielectric (52, 50) comprises a U-shaped gate dielectric layer 50 including a non-ferroelectric material, a proximal sidewall of a vertical portion of the U-shaped gate dielectric layer 50 contacts the vertical semiconductor channel (33, 34), and the ferroelectric material layer 52 contacts a distal sidewall of the vertical portion of the U-shaped gate dielectric layer 50.

In one embodiment, the select gate electrode 46S comprises a portion of a select gate electrode line 46, and the control gate electrode 56C comprises a portion of word line 56. A bit line 88 is electrically connected to the common drain region 36 by the source electrode 86.

In one embodiment, a method of reading the memory cell 100 comprises applying a read voltage (e.g., $V_{dd}$) to the bit line 88 and to the select gate electrode line (i.e., read line) 46 while applying zero volts to the word line 56 and the common source region 6. Current flows between the common source region 6 and the vertical semiconductor channel (33, 34) while the read voltage is applied to the bit line 88 and to the select gate electrode line 46 to read a polarization state (e.g., orientation of the dipole moment) of the ferroelectric material layer 52.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory cell comprising:
a ferroelectric memory transistor; and
a select gate transistor which shares a common semiconductor channel, a common source region and a common drain region with the ferroelectric memory transistor, wherein the select gate transistor controls access between the common source region and the common semiconductor channel;
wherein:
the common semiconductor channel comprises a vertical semiconductor channel comprising a vertical stack of a first semiconductor channel portion that is located on the common source region and a second semiconductor channel portion that overlies the first semiconductor channel portion;
the ferroelectric memory transistor comprises a control gate electrode and a control gate dielectric comprising a ferroelectric material layer located between the vertical semiconductor channel and the control gate electrode; and
the select gate transistor comprises a select gate electrode and a select gate dielectric located between the select gate electrode and the vertical semiconductor channel.

2. The memory cell of claim 1, wherein:
the control gate dielectric further comprises a gate dielectric layer made of a non-ferroelectric material;
the select gate dielectric is made of a non-ferroelectric material and excludes a ferroelectric material;
the select gate electrode has a longer gate length than the control gate electrode in a direction between the common source region and the common drain region;
the select gate electrode is located adjacent to the first semiconductor channel portion, while the control gate electrode is not located adjacent to the first semiconductor channel portion; and
the select gate electrode controls access between the common source region and the vertical semiconductor channel by activating and deactivating the first semiconductor channel portion.

3. The memory cell of claim 1, wherein:
the select gate dielectric is located on a first side of the vertical semiconductor channel and contacts a top surface of the common source region;
the control gate dielectric is located on a second side of the vertical semiconductor channel and is spaced from the top surface of the common source region by a spacer material portion;
the common drain region located on a top end of the vertical semiconductor channel;
the common source region comprises a first single crystalline semiconductor material portion;
the first semiconductor channel portion comprises a second single crystalline semiconductor material portion in epitaxial alignment with the first single crystalline semiconductor material portion; and
the second semiconductor channel portion comprises a third single crystalline semiconductor material portion in epitaxial alignment with the second single crystalline semiconductor material portion.

4. The memory cell of claim 3, wherein:
the first semiconductor channel portion comprises electrical dopants of a first conductivity type at a first atomic concentration; and
the second semiconductor channel portion comprises electrical dopants of the first conductivity type at a second atomic concentration that is less than the first atomic concentration.

5. The memory cell of claim 4, wherein the spacer material portion comprises an additional single crystalline semiconductor material portion in epitaxial alignment with the first single crystalline semiconductor material portion and the second single crystalline semiconductor material portion and including dopants of the first conductivity type at a third atomic concentration that is greater than the second atomic concentration.

6. The memory cell of claim 4, wherein the spacer material portion comprises silicon oxide, silicon nitride or silicon oxynitride.

7. The memory cell of claim 4, wherein:
the source region comprises electrical dopants of a second conductivity type that is the opposite of the first conductivity type at an atomic concentration greater than the first atomic concentration; and
the drain region comprises electrical dopants of the second conductivity type at an atomic concentration greater than the first atomic concentration.

8. The memory cell of claim 1, wherein:
the control gate dielectric comprises a U-shaped gate dielectric layer including a non-ferroelectric material;
a proximal sidewall of a vertical portion of the U-shaped gate dielectric layer contacts the vertical semiconductor channel; and
the ferroelectric material layer contacts a distal sidewall of the vertical portion of the U-shaped gate dielectric layer.

9. The memory cell of claim 1, wherein:
the select gate electrode comprises a portion of a select gate electrode line; and
the control gate electrode comprises a portion of word line.

10. The memory cell of claim 9, further comprising a bit line electrically connected to the common drain region.

11. A method of reading the memory cell of claim 10, comprising applying a read voltage to the bit line and to the select gate electrode line while applying zero volts to the word line and the common source region.

12. The method of claim 11, wherein current flows between the common source region and the vertical semiconductor channel while the read voltage is applied to the bit line and to the select gate electrode line to read a polarization state of the ferroelectric material layer.

13. A method of forming at least one ferroelectric memory element, comprising:
forming a source region in a substrate;
forming a stepped semiconductor material structure comprising a fin portion having a first height and a base portion having a second height over a first region of a top surface of the source region;

forming a vertical semiconductor channel comprising a vertical stack of a first semiconductor channel portion and a second semiconductor channel portion that overlies the first semiconductor channel portion in the fin portion of the stepped semiconductor material structure;

forming a select gate dielectric on one side of the vertical semiconductor channel and on a second region of the top surface of the source region;

forming a control gate dielectric comprising a ferroelectric material layer on another side of the vertical semiconductor channel on a top surface of the base portion of the stepped semiconductor material structure; and forming a drain region on a top end of the vertical semiconductor channel.

14. The method of claim 13, further comprising:

conformally depositing a select gate dielectric material layer in the first line trenches;

depositing a select gate electrode material over the select gate dielectric material layer; and patterning the select gate electrode material and the select gate dielectric material layer, wherein a remaining portion of the select gate dielectric material layer in one of the first line trenches constitutes the select gate dielectric, and a remaining portion of the select gate electrode material that overlies the select gate dielectric constitutes a select gate electrode.

15. The method of claim 14, further comprising:

depositing and anisotropically etching a ferroelectric material, wherein a pair of ferroelectric material layers is formed within each of the at least one second line; and depositing a control gate electrode material on the ferroelectric material layers; the patterning the control gate electrode material, wherein a remaining portion of the control gate electrode material constitutes a control gate electrode.

16. The method of claim 13, wherein:

the stepped semiconductor material structure is formed by patterning semiconductor material portions with line trenches having vertical sidewalls;

the line trenches comprise first line trenches having a first depth that is the same as the first height and at least one second line trench having a second depth that is less than the first height; and the stepped semiconductor material structure comprises a pair of outer sidewalls having the first height and a pair of inner sidewalls having a height that is less than the first height and located between the pair of outer sidewalls, wherein one of the at least one second line trench is formed between the pair of inner sidewalls.

17. The method of claim 16, wherein:

the substrate comprises a single crystalline semiconductor material;

the first semiconductor channel portion has a doping of a first conductivity type; and the source region is formed by introducing dopants of a second conductivity type that is the opposite of the first conductivity type into a portion of the substrate.

18. The method of claim 16, wherein:

the at least one ferroelectric memory element comprises a two-dimensional array of ferroelectric memory elements;

the method comprises forming dielectric isolation rails that laterally extend along a horizontal direction and laterally spaced apart along another horizontal direction;

the first line trenches divide each of the dielectric isolation rails into a two-dimensional array of discrete dielectric isolation structures; and the second line trenches form a groove within each of the discrete dielectric isolation structures.

19. The method of claim 13, further comprising implanting dopants into the base portion, wherein the dopants are selected from electrical dopants of a first conductivity type, oxygen atoms, and nitrogen atoms.

* * * * *